United States Patent
Wakita et al.

(10) Patent No.: US 11,269,254 B2
(45) Date of Patent: Mar. 8, 2022

(54) PRODUCTION METHOD FOR ANTENNA SUBSTRATE, PRODUCTION METHOD FOR ANTENNA SUBSTRATE WITH WIRING LINE AND ELECTRODE, AND PRODUCTION METHOD FOR RFID ELEMENT

(71) Applicant: TORAY INDUSTRIES, INC., Tokyo (JP)

(72) Inventors: Junji Wakita, Otsu (JP); Hiroji Shimizu, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 634 days.

(21) Appl. No.: 15/743,199

(22) PCT Filed: Aug. 10, 2016

(86) PCT No.: PCT/JP2016/073613
§ 371 (c)(1),
(2) Date: Jan. 9, 2018

(87) PCT Pub. No.: WO2017/030070
PCT Pub. Date: Feb. 23, 2017

(65) Prior Publication Data
US 2018/0210337 A1    Jul. 26, 2018

(30) Foreign Application Priority Data

Aug. 20, 2015  (JP) .............................. JP2015-162813

(51) Int. Cl.
*G03F 7/00* (2006.01)
*G03F 7/031* (2006.01)
(Continued)

(52) U.S. Cl.
CPC ............ *G03F 7/031* (2013.01); *G03F 7/0035* (2013.01); *G03F 7/0045* (2013.01);
(Continued)

(58) Field of Classification Search
CPC .......... G03F 7/004; G03F 7/00; G03F 7/0002; G03F 7/0042; G03F 7/031; G03F 7/0035;
(Continued)

(56) References Cited

U.S. PATENT DOCUMENTS 7,116,273 B2 * 10/2006  Morikawa ................ H01Q 1/38
                                                                343/700 MS
8,343,779 B2    1/2013  Bürgi et al.
(Continued)

FOREIGN PATENT DOCUMENTS

CN         1421879 A      6/2003
CN         101718953 A    6/2010
(Continued)

OTHER PUBLICATIONS

International Search Report, issued in PCT/JP2016/073613, PCT/ISA/210, dated Nov. 1, 2016.
(Continued)

*Primary Examiner* — Peter Dungba Vo
*Assistant Examiner* — Azm A Parvez
(74) *Attorney, Agent, or Firm* — Birch, Stewart, Kolasch & Birch, LLP

(57) ABSTRACT

An object of the present invention is to provide a method for accurately forming an antenna substrate as well as an antenna substrate with wiring line and electrode by a coating method. One aspect of the present invention provides a method for producing an antenna substrate with wiring line and electrode including the steps of: (1) forming a coating film using a photosensitive paste containing a conductive material and a photosensitive organic component on an
(Continued)

insulating substrate; (2-A) processing the coating film into a pattern corresponding to an antenna by photolithography; (2-B) processing the coating film into a pattern corresponding to a wiring line; (2-C) processing the coating film into a pattern corresponding to an electrode; (3-A) curing the pattern corresponding to an antenna into an antenna; (3-B) curing the pattern corresponding to a wiring line into a wiring line; and (3-C) curing the pattern corresponding to an electrode into an electrode.

14 Claims, 32 Drawing Sheets

(51) Int. Cl.
| | |
|---|---|
| H01L 29/786 | (2006.01) |
| H01L 51/05 | (2006.01) |
| H05K 1/09 | (2006.01) |
| H01P 11/00 | (2006.01) |
| H05K 1/16 | (2006.01) |
| G06K 19/077 | (2006.01) |
| G03F 7/004 | (2006.01) |
| G03F 7/038 | (2006.01) |
| G03F 7/09 | (2006.01) |
| G03F 7/095 | (2006.01) |
| G03F 7/16 | (2006.01) |
| G03F 7/20 | (2006.01) |
| G03F 7/32 | (2006.01) |
| H01L 21/48 | (2006.01) |
| H01L 23/66 | (2006.01) |
| H01Q 1/38 | (2006.01) |
| G03F 7/027 | (2006.01) |
| B82Y 30/00 | (2011.01) |
| B82Y 40/00 | (2011.01) |
| H01L 51/00 | (2006.01) |
| H01Q 1/22 | (2006.01) |
| H01Q 7/00 | (2006.01) |

(52) U.S. Cl.
CPC .......... *G03F 7/0047* (2013.01); *G03F 7/0388* (2013.01); *G03F 7/094* (2013.01); *G03F 7/095* (2013.01); *G03F 7/16* (2013.01); *G03F 7/168* (2013.01); *G03F 7/2002* (2013.01); *G03F 7/2022* (2013.01); *G03F 7/322* (2013.01); *G06K 19/077* (2013.01); *G06K 19/07722* (2013.01); *H01L 21/4853* (2013.01); *H01L 21/4867* (2013.01); *H01L 23/66* (2013.01); *H01L 29/786* (2013.01); *H01L 51/05* (2013.01); *H01P 11/00* (2013.01); *H01Q 1/38* (2013.01); *H05K 1/09* (2013.01); *H05K 1/16* (2013.01); *B82Y 30/00* (2013.01); *B82Y 40/00* (2013.01); *G03F 7/027* (2013.01); *H01L 51/0036* (2013.01); *H01L 51/0043* (2013.01); *H01L 51/0048* (2013.01); *H01L 2223/6677* (2013.01); *H01Q 1/2208* (2013.01); *H01Q 7/00* (2013.01); *Y10S 977/742* (2013.01); *Y10S 977/842* (2013.01); *Y10S 977/954* (2013.01)

(58) Field of Classification Search
CPC .... G03F 7/0045; G03F 7/0047; G03F 7/0388; G03F 7/094; G03F 7/095; G03F 7/16; G03F 7/168; H01L 21/4867; H01L 21/4853; H05K 1/09; H05K 1/16; Y10T 29/49016; Y10T 29/49002; Y10T 29/49155; Y10T 29/49124; Y10T 29/49117
USPC ................ 29/600, 592.1, 846, 829, 825
See application file for complete search history.

(56) References Cited

U.S. PATENT DOCUMENTS

| | | | |
|---|---|---|---|
| 2001/0037895 A1* | 11/2001 | Gotoh ............... | H01G 4/228 174/250 |
| 2002/0048630 A1* | 4/2002 | Nakata ............ | H01L 21/4867 174/253 |
| 2003/0036020 A1 | 2/2003 | Kubota | |
| 2003/0098496 A1* | 5/2003 | Sugiyama .......... | H01F 17/0006 257/531 |
| 2005/0173532 A1 | 8/2005 | Hasebe et al. | |
| 2005/0179594 A1 | 8/2005 | Morikawa et al. | |
| 2006/0046476 A1 | 3/2006 | Nakamura et al. | |
| 2006/0046512 A1* | 3/2006 | Nakamura ........ | H01L 29/66757 438/770 |
| 2008/0093462 A1* | 4/2008 | Abe .................. | G11C 17/16 235/492 |

FOREIGN PATENT DOCUMENTS

| | | | |
|---|---|---|---|
| EP | 1120796 A2 | | 8/2001 |
| JP | 8-316080 A | | 11/1996 |
| JP | 08316080 A | * | 11/1996 |
| JP | 2005-228785 A | | 8/2005 |
| JP | 2005-229534 A | | 8/2005 |
| JP | 2008-41766 A | | 2/2008 |
| JP | 2010-8578 A | | 1/2010 |
| JP | 2014-170051 A | | 9/2014 |
| WO | WO 2015/062892 A1 | | 5/2015 |

OTHER PUBLICATIONS

Written Opinion of the International Searching Authority, issued in PCT/JP2016/073613, PCT/ISA/237, dated Nov. 1, 2016.
Extended European Search Report for European Application No. 16837060.9, dated Mar. 6, 2019.
Indian Office Action issued in Application No. 201847008915 dated Apr. 25, 2021.
Korean Office Action for Korean Application No. 10-2018-7006408, dated Aug. 30, 2021, with English translation.
Chinese Office Action, dated Apr. 26, 2020, for Chinese Application No. 201660048331.X.

* cited by examiner 32A  41

41    32A

PRODUCTION METHOD FOR ANTENNA SUBSTRATE, PRODUCTION METHOD FOR ANTENNA SUBSTRATE WITH WIRING LINE AND ELECTRODE, AND PRODUCTION METHOD FOR RFID ELEMENT

TECHNICAL FIELD

The present invention relates to a method for producing an antenna substrate. More specifically, the present invention relates to a method for producing an antenna substrate in an IC tag such as an RFID tag, a method for producing an antenna substrate with wiring line and electrode, and a method for producing an RFID element.

BACKGROUND ART

An RFID tag is a tag based on RFID (Radio Frequency IDentification), that is, an automatic recognition technique by wireless communication. In other words, the RFID tag is a tag including an RFID element which is a thin, lightweight, and compact electronic device having a semiconductor chip for storing data such as identification numbers, and an antenna for transmitting and receiving radio waves. Such RFID tags are expected to be used in various fields such as logistics management, commodity management, shoplifting prevention, and quality control, and have started to be partially introduced in IC cards such as traffic cards and product tags in the apparel industry.

As a method for forming an antenna for an RFID element, there, is a method of processing metal foil such as copper foil or aluminum foil into an antenna using a punching blade, and transferring the resultant antenna to a base (see, for example, Patent Document 1). There is also a method of etching metal foil bonded to a base such as a plastic film using a resist layer formed on the metal foil as a mask (see, for example, Patent Document 2). Further, there are methods of printing a conductive paste into a pattern corresponding to an antenna on a base such as a plastic film, and curing the pattern with heat or light (see, for example, Patent Documents 3 and 4). Hereinafter, a base having an antenna thereon is referred, to as an antenna substrate.

In recent years, there have been disclosed methods for producing an RFID element including, as at least one step of steps of forming an antenna or an IC, a coating step such as printing (see, for example, Patent Document 5 and Non-Patent Document 1). It is expected that forming the antenna, electrode, wiring line, semiconductor layer, insulating layer and the like of an RFID element by coating drastically reduces the production cost of the RFID element as well as the RFID tag. Hereinafter, a base having an antenna, a wiring line, and an electrode thereon is referred to as an antenna substrate with wiring line and electrode.

PRIOR ART DOCUMENTS

Patent Documents

Patent Document 1: Japanese Patent Laid-open Publication No. 2004-94590
Patent Document 2: Japanese Patent Laid-open Publication No. 2012-8857
Patent Document 3: Japanese Patent Laid-open Publication No. 2015-5794
Patent Document 4: Japanese Patent Laid-open Publication No. 2008-189758
Patent Document 5: Japanese Patent Laid-open Publication (Translation of PCT Application) No. 2012-510115

Non-Patent Document

Non-Patent Document 1: IEEE TRANSACTIONS ON ELECTRON DEVICES, VOL. 57, NO. 3, p. 571

SUMMARY OF THE INVENTION

Problems to be Solved by the Invention

The technique of using a punching blade described in Patent Document 1 has a problem that an antenna having a complicated shape or a fine antenna cannot be formed, although the technique can reduce the production cost. The technique of etching metal foil described in Patent Document 2 has a problem that the production cost is high, although a pattern of about several hundred micrometers can be formed.

In order to solve these problems, Patent Documents 3 and 4 disclose a method for forming a pattern corresponding to an antenna by a printing technique. These methods, however, have a problem that an antenna having a complicated shape or a fine antenna required for a compact RFID element cannot be formed.

Further, in the case of forming an antenna, a wiring line, and an electrode by a printing method as described in Patent Document 5 or Non-Patent Document 1, fine patterning is difficult. Thus, these methods have problems that the line width of the wiring line and the electrode size are increased, and it is difficult to achieve high integration of circuits. For example, Non-Patent Document 1 has problems that the line width of the wiring line is about the same as that of the antenna (1 mm in Non-Patent Document 1), and the distance between the source electrode and the drain electrode (hereinafter referred to as a channel length) cannot be shortened.

As described above, there has been no proposal for a method for accurately forming an antenna substrate as well as an antenna substrate with wiring line and electrode.

In view of the above-mentioned problems, an object of the present invention is to provide a method for accurately forming an antenna substrate as well as an antenna substrate with wiring line and electrode by a coating method.

Solutions to the Problems

That is, the present invention provides a method for producing an antenna substrate, including the steps of:
(1) forming a coating film using a photosensitive paste containing a conductive material and a photosensitive organic component on an insulating substrate; (2) processing the coating film into a pattern corresponding to an antenna by photolithography; and (3) curing the pattern corresponding to an antenna into an antenna.

Further, the present invention provides a method for producing an antenna substrate with wiring line and electrode, including the steps of:
(1) forming a coating film using a photosensitive paste containing a conductive material and a photosensitive organic component on an insulating substrate; (2-A) processing the coating film into a pattern corresponding to an antenna by photolithography; (2-B) processing the coating film into a pattern corresponding to a wiring line by photolithography; (2-C) processing the coating film into a pattern corresponding to an electrode by photolithography; (3-A) curing the pattern corresponding to an antenna into an antenna; (3-B) curing the pattern corresponding to a wiring line into a wiring line; and (3-C) curing the pattern corresponding to an electrode into an electrode.

Another aspect of the present invention provides a method for producing an antenna substrate with wiring line and electrode, including the steps of:

(1-P) forming a coating film using a photosensitive paste containing a conductive material and a photosensitive organic component on an insulating substrate having an antenna thereon; (2-P-B) processing the coating film into a pattern corresponding to a wiring line by photolithography; (2-P-C) processing the coating film into a pattern corresponding to an electrode by photolithography; (3-P-B) curing the pattern corresponding to a wiring line into a wiring line; and (3-P-C) curing the pattern corresponding to an electrode into an electrode.

Further, the present invention provides a method for producing an RFID element, including the steps of:

(1) forming a coating film using a photosensitive paste containing a conductive material and a photosensitive organic component on an insulating substrate; (2-A) processing the coating film into a pattern corresponding to an antenna by photolithography; (2-B) processing the coating film into a pattern corresponding to a wiring line by photolithography; (2-C) processing the coating film into a pattern corresponding to an electrode by photolithography; (3-A) curing the pattern corresponding to an antenna into an antenna; (3-B) curing the pattern corresponding to a wiring line into a wiring line; (3-C) curing the pattern corresponding to an electrode into one or more electrodes to give an antenna substrate with wiring line and electrode; and (4-S) forming a semiconductor layer on one or more of the electrodes or between the electrodes of the antenna substrate with wiring line and electrode.

Another aspect of the present invention provides a method for producing an RFID element, including the steps of:

(1-P) forming a coating film using a photosensitive paste containing a conductive material and a photosensitive organic component on an insulating substrate having an antenna thereon; (2-P-B) processing the coating film into a pattern corresponding to a wiring line by photolithography; (2-P-C) processing the coating film into a pattern corresponding to an electrode by photolithography; (3-P-B) curing the pattern corresponding to a wiring line into a wiring line; (3-P-C) curing the pattern corresponding to an electrode into one or more electrodes to give an antenna substrate with wiring line and electrode; and (4-S) forming a semiconductor layer on one or more of the electrodes or between the electrodes of the antenna substrate with wiring line and electrode.

Effects of the Invention

According to the present invention, it is possible to accurately form an antenna substrate as well as an antenna substrate with wiring line and electrode by a coating method. This makes it possible to form a fine antenna required for compact RFID tags, and further reduce defects in the production process, so that the yield can be improved.

EMBODIMENTS OF THE INVENTION

Hereinafter, embodiments of the present invention will be described in detail. It should be noted that the present invention is not limited by the following embodiments.

In the present invention, an "antenna" is intended for transmitting and receiving radio waves. An "antenna substrate" is an insulating substrate having an antenna thereon. An "antenna substrate with wiring line and electrode" is an insulating substrate having an antenna, a wiring line, and an electrode thereon. An "RFID element" is an insulating substrate having at least an antenna and an IC thereon, and is generally called an inlay. Incidentally, the IC includes at least a rectifier circuit and a logic circuit. The IC may be formed by a method of mounting an IC chip or a method of forming an IC by a coating step such as printing. An "RFID tag" means an RFID element having a label bonded thereto. The label includes product information or the like printed thereon, and is used as a product tag or the like.

(Method for Producing Antenna Substrate)

A method for producing an antenna substrate of the present invention includes the steps of:

(1) forming a coating film using a photosensitive paste containing a conductive material and a photosensitive organic component on an insulating substrate; (2) processing the coating film into a pattern corresponding to an antenna by photolithography; and (3) curing the pattern corresponding to an antenna into an antenna.

A first advantage of forming a pattern corresponding to an antenna by photolithography is that the line width and line spacing of the antenna can be narrowed. For example, even a pattern having a line width and a line spacing each 100 μm or less can be accurately formed. In contrast, it is difficult to form a pattern having a similar line width and a similar line spacing by screen printing. Even if it is possible, an expensive screen printing plate has to be used, and it is difficult to reduce the production cost.

A second advantage of forming a pattern corresponding to an antenna by photolithography is that defects such as pattern dripping and rubbing are less likely to occur as compared with the case of a printing technique such as screen printing. Therefore, it is possible to form an antenna substrate with high yield.

A "pattern corresponding to an antenna" refers to a pattern that can be finally formed into an antenna. For example, a pattern corresponding to an antenna can be cured with light, heat, or the like to give an antenna.

Figure 1A:
FIG. 1A is a drawing for illustrating a shape of a coating film in the production of an antenna substrate of the present invention.
Figure 1B:
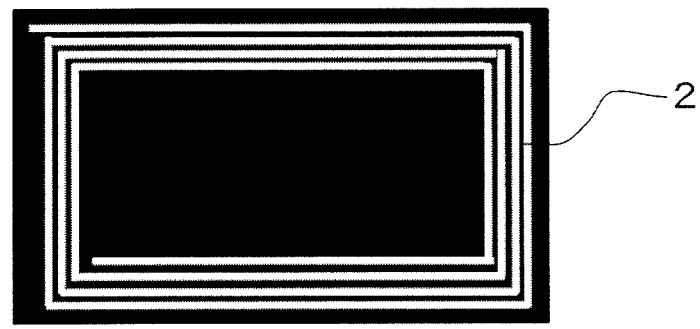
FIG. 1B is a drawing for illustrating an example of a photomask used in the production of the antenna substrate of the present invention.
Figure 1C:
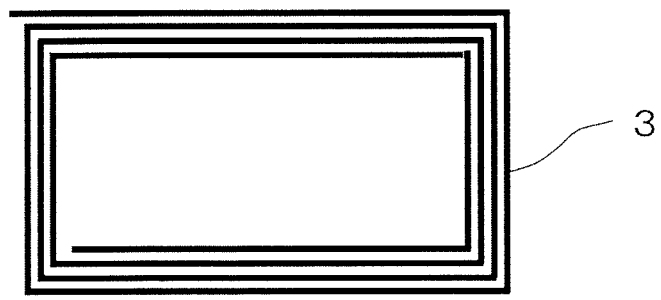
FIG. 1C is a drawing for illustrating an example of an antenna of the present invention.

As for the region of the insulating substrate on which the coating film is formed, the coating film may be formed over the entire surface of the substrate, or may be formed only in a region on which the antenna is formed as shown in FIG. 1A. From the viewpoint of reducing the production cost, the latter is preferable. A coating film 1 shown in FIG. 1A can be subjected to photolithography through a photomask having a mask pattern 2 corresponding to an antenna shown in FIG. 1B to be processed into a pattern 3 corresponding to an antenna shown in FIG. 1C.

<Thickness of Antenna>

The thickness of the antenna is not particularly limited, but is preferably 1 μm to 10 μm, more preferably 1 μm to 4 μm, still more preferably 1 μm to 2 μm. When the thickness of the antenna pattern is 1 μm or more, the skin effect that increases the electric resistance can be suppressed, so that it is possible to prevent a decrease in the communication distance. On the other hand, when the thickness of the antenna is 10 μm or less, disconnection at the time of bending the antenna substrate can be prevented. Further, when the thickness is 4 μm or less, the coating film is sufficiently solidified up to the bottom thereof by exposure, so that the effect of preventing pattern defects during development can be further enhanced. When the thickness is 2 μm or less, the adhesion between the substrate and the pattern is enhanced, and the bending resistance of the antenna substrate can be further enhanced.

As will be described later, as the conductive material of the photosensitive paste used in the present invention, silver (Ag) is suitably used. Since Ag is expensive, the antenna is preferably thin in order to reduce the price of the RFID tag.

<Type of Antenna>

Figure 2:
FIG. 2 is a drawing for illustrating an example of the antenna of the present invention.

The type of the antenna is not particularly limited, and examples of the antenna include a loop antenna (see FIG. 1C) used in the communication in the HF (High Frequency) band, a spiral antenna, a dipole antenna (see FIG. 2) used in the communication in the UHF (Ultra High Frequency) band, and a patch antenna. In the present description, a loop antenna is mainly illustrated as an example of the antenna pattern, but the present invention is not limited thereto.

(Method for Producing Antenna Substrate with Wiring Line and Electrode)

The method for producing an antenna substrate with wiring line and electrode of the present invention includes the steps of:

(1) forming a coating film using a photosensitive paste containing a conductive material and a photosensitive organic component on an insulating substrate; (2-A) processing the coating film into a pattern corresponding to an antenna by photolithography; (2-B) processing the coating film into a pattern corresponding to a wiring line by photolithography; (2-C) processing the coating film into a pattern corresponding to an electrode by photolithography; (3-A) curing the pattern corresponding to an antenna into an antenna; (3-B) curing the pattern corresponding to a wiring line into a wiring line; and (3-C) curing the pattern corresponding to an electrode into an electrode.

Generally, processing a pattern corresponding to a wiring line and a pattern corresponding to an electrode requires a processing accuracy of 100 μm or less. For example, the channel length which is the distance between a source electrode and a drain electrode of a thin film transistor (TFT) is preferably 100 μm or less, more preferably 50 μm or less, particularly preferably 20 μm or less from the viewpoint of TFT performance. It is difficult to accurately form a source electrode and a drain electrode having a channel length of 100 μm or less by screen printing, but it is easy to form such electrodes by processing through photolithography.

From the viewpoint of high integration of the ICs, the line width of the wiring line is preferably smaller than that of the antenna, and thus the line width of the pattern corresponding to a wiring line is preferably narrower than that of the pattern corresponding to an antenna. A typical line width of the antenna is 500 μm or more from the viewpoint of reducing the electric resistance, whereas the line width of the wiring line is preferably 100 μm or less, more preferably 50 μm or less.

In the case of screen printing, liquids tend to accumulate in a site where the line width narrows, and bonding between the printed matter and the screen printing plate, disconnection of the printed matter, and the like occur. Therefore, patterning is difficult at a site where the line width varies, such as the connected part between the pattern corresponding to an antenna and the pattern corresponding to a wiring line. In contrast, in the processing by photolithography, it is possible to accurately form a pattern regardless of the variation in the pattern shape and line width.

The "pattern corresponding to a wiring line" and "pattern corresponding to an electrode" respectively refer to a pattern which can be finally made into a wiring line and a pattern which can be finally made into an electrode. For example, a pattern corresponding to a wiring line and an electrode can be cured with light, heat, or the like to give a wiring line and an electrode, respectively.

The pattern corresponding to an antenna, the pattern corresponding to a wiring line, and the pattern corresponding to an electrode may be processed and formed separately, at least two of them may be processed and formed in a batch manner, or three of them may be processed and formed in a batch manner. From the viewpoint of reduction of processing steps and connection of patterns, it is preferable to process three patterns of the pattern corresponding to an antenna, the pattern corresponding to a wiring line, and the pattern corresponding to an electrode in a batch manner. That is, it is preferable to employ a method for producing an antenna substrate with wiring line and electrode in which steps (2-A), (2-B), and (2-C) are performed in a batch manner.

Processing the pattern corresponding to an antenna, the pattern corresponding to a wiring line, and the pattern corresponding to an electrode in a batch manner by photolithography means to form these patterns in a single development step at the same time. The coating film may be exposed once or a plurality of times.

A plurality of times of exposure of the coating film means to expose the coating film three times in total using three kinds of masks each having a mask pattern corresponding to each pattern, or to expose the coating film twice in total using two kinds of masks, that is, a mask having a mask pattern corresponding to an antenna and a mask having a mask pattern corresponding to a wiring line and a mask pattern corresponding to an electrode pattern, for example.

The pattern corresponding to an antenna, the pattern corresponding to a wiring line, and the pattern corresponding to an electrode may be cured separately, at least two of them may be cured in a batch manner, or three of them may be cured in a batch manner.

<Batch Processing of Pattern Corresponding to Antenna, Pattern Corresponding to Wiring Line, and Pattern Corresponding to Electrode>

Figure 3:
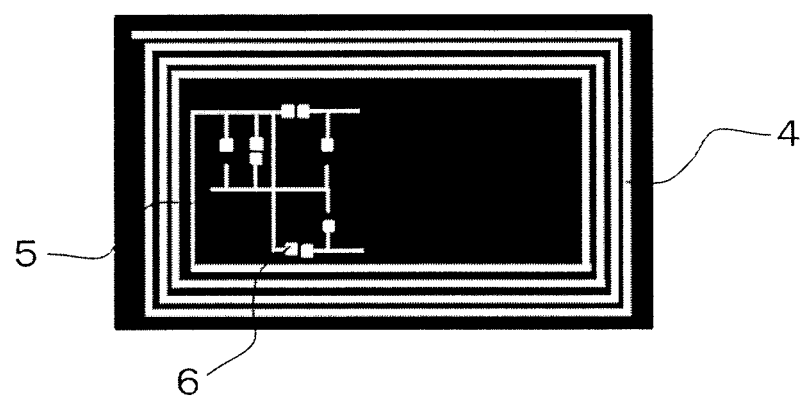
FIG. 3 is a drawing for illustrating an example of a photomask used in the production of an antenna substrate with wiring line and electrode of the present invention.
Figure 4:
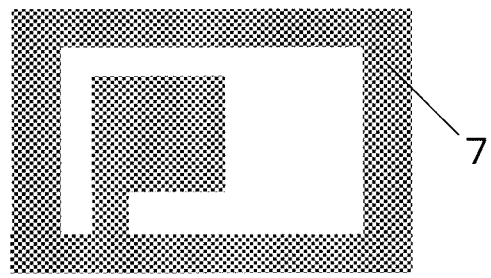
FIG. 4 is a drawing for illustrating a shape of a coating film in the production of the antenna substrate with wiring line and electrode of the present invention.

An example of processing a pattern corresponding to an antenna, a pattern corresponding to a wiring line, and a pattern corresponding to an electrode in a batch manner is a method of exposing and developing a coating film using a photomask having a mask pattern 4 corresponding to an antenna, a mask pattern 5 corresponding to a wiring line, and a mask pattern 6 corresponding to an electrode as shown in FIG. 3. In this case, a pattern corresponding to an antenna, a pattern corresponding to a wiring line, and a pattern corresponding to an electrode can be formed by a single coating step, a single exposure step, and a single development step. As for the region of the insulating substrate on which the coating film is formed, a coating film 7 may be formed over the entire surface of the substrate, or may be formed only in regions on which the antenna, wiring line, and electrode are respectively formed as shown in FIG. 4. From the viewpoint of reducing the production cost, the latter is preferable.

The connected part between the pattern corresponding to an antenna and the pattern corresponding to a wiring line may or may not form a continuous phase. However, from the viewpoint of bending resistance of the finally obtained antenna substrate, it is preferable to form the connected part between the pattern corresponding to an antenna and the pattern corresponding to a wiring line so that it may form a continuous phase in step (2).

In addition, an alternating current of a high frequency of 100 kHz to several gigahertz flows through the antenna and the wiring line of an RFID element. Accordingly, if there is a connection resistance at the connected part between the antenna and the wiring line, current reflection or loss occurs, and the voltage of the alternating current flowing through the wiring line is lowered as compared to the voltage of the alternating current flowing through the antenna. In the case where the antenna and the wiring line form a continuous phase, there is no connection resistance at the connected part between the antenna and the wiring line, so that the voltage of the alternating current flowing through the antenna is the same as that of the alternating current flowing through the wiring line. The voltages of the alternating currents flowing through the antenna and the wiring line can be measured with an oscilloscope.

Figure 5:
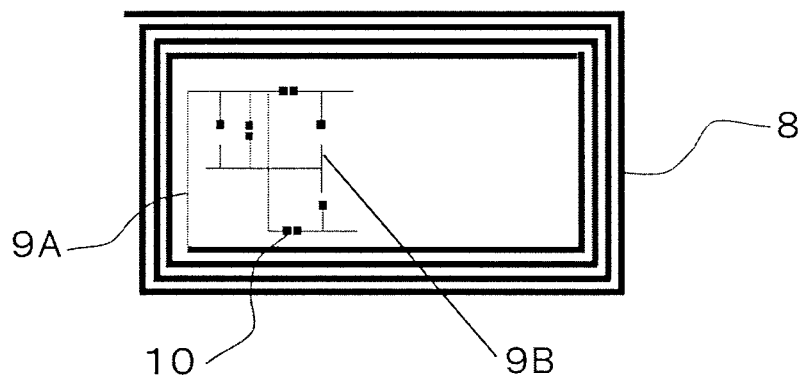
FIG. 5 is a drawing showing an example of a pattern corresponding to an antenna and patterns each corresponding to a wiring line or an electrode in the production of the antenna substrate with wiring line and electrode of the present invention.

The wording that two patterns form a continuous phase means that the patterns are integrated and have no connection interface at the connected part. An example of a case where two patterns form a continuous phase is shown in FIG. 5. The pattern corresponding to a wiring line includes a pattern 9A connected to a pattern 8 corresponding to an antenna and a pattern 9B connected to a pattern 10 corresponding to an electrode. The pattern 8 corresponding to an antenna and the pattern 9A corresponding to a wiring line are integrated, and have no connection interface at the connected part between them.

Figure 6:
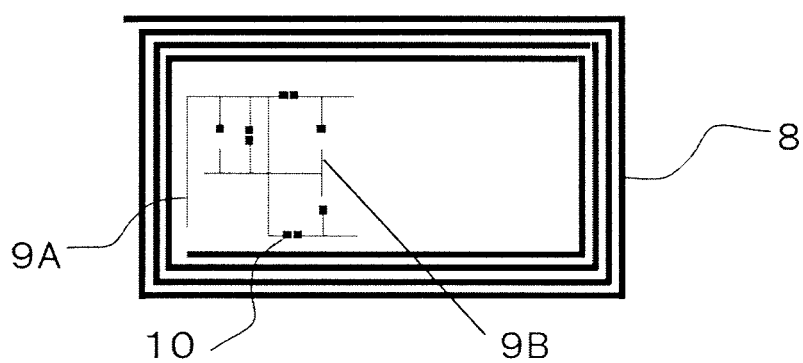
FIG. 6 is a drawing showing an example of a pattern corresponding to an antenna and patterns each corresponding to a wiring line or an electrode in the production of the antenna substrate with wiring line and electrode of the present invention.

Note that a first example of the case where the connected part between the antenna and the wiring line does not form a continuous phase is a case where the pattern 8 corresponding to an antenna and the pattern 9A corresponding to a wiring line are formed with a gap therebetween, as shown in FIG. 6. In this case, after the patterns are respectively cured into an antenna and a wiring line, a conductive paste such as a carbon paste or an indium paste is used to connect the antenna to the wiring line. However, the connection resistance between the antenna and the wiring line increases, and the voltage drop caused by the input of the alternating current to the wiring line increases.

A second example of the case where the connected part between the antenna and the wiring line does not form a continuous phase is a case where the antenna and the wiring line overlap each other. For example, as will be described later, such connected part can be obtained by forming a pattern corresponding to a wiring line, curing the pattern into a wiring line, and then forming a coating film for forming a pattern corresponding to an antenna so that it may overlap a part of the wiring line. In this case, the connection resistance between the antenna and the wiring line is smaller, and the voltage drop caused by the input of the alternating current to the wiring line is also smaller than in the case where the antenna is connected to the wiring line with the conductive paste.

A third example of the case where the connected part between the antenna and the wiring line does not form a continuous phase is a case where the connected part between the antenna and the wiring line is disconnected. In this case, it is not possible to input an alternating current from the antenna to the wiring line.

An example of a method for forming the connected part between the pattern corresponding to an antenna and the pattern corresponding to a wiring line so that it may form a continuous phase is a method of exposing and developing a coating film using the photomask as shown in FIG. 3 having the mask pattern 4 corresponding to an antenna and the mask pattern 5 corresponding to a wiring line that are connected to each other. As described above, in the processing by photolithography, it is possible to accurately form a pattern regardless of the pattern shape. Thus, it is easy to form a pattern corresponding to an antenna and a part of a pattern corresponding to a wiring line so that they may form a continuous phase. On the other hand, as described above, in the case of screen printing, liquids tend to accumulate in the connected part between the pattern corresponding to an antenna and the pattern corresponding to a wiring line, which may cause disconnection at the connected part between the pattern corresponding to an antenna and the pattern corresponding to a wiring line. Thus, it is difficult to form a continuous phase by screen printing.

When the pattern corresponding to an antenna and a part of the pattern corresponding to a wiring line are formed so that they may form a continuous phase, the connected part between the antenna and the wiring line forms a continuous phase in the finally obtained antenna substrate. In the case where the connected part between the antenna and the wiring line forms a continuous phase, the antenna and the wiring line are integrated, and thus the disconnection at the connected part between the antenna and the wiring line is unlikely to occur when the antenna substrate is bent.

The state where the connected part between the antenna and the wiring line forms a continuous phase can be confirmed by observing the cross section of the connected part with a scanning electron microscope (SEM), a transmission electron microscope (TEM), or the like.

Figure 7:
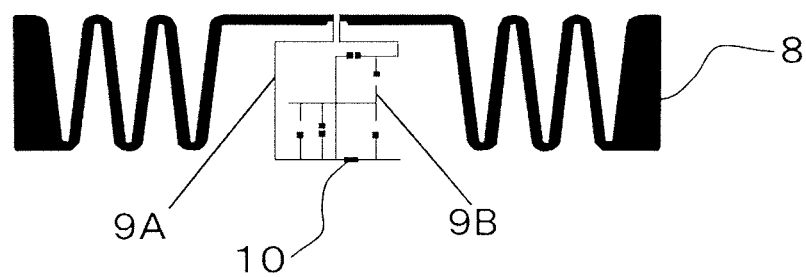
FIG. 7 is a drawing showing an example of a pattern corresponding to an antenna and patterns each corresponding to a wiring or an electrode in the production of the antenna substrate with wiring line and electrode of the present invention.

In FIG. 6, an antenna substrate with wiring line and electrode in a loop antenna is illustrated. However, the present invention can also be applied to an antenna substrate with wiring line and electrode in a dipole antenna as shown in FIG. 7.

<When Different Coating Films are Formed on Region on which Antenna is Formed and on Region on which Wiring Line and Electrode are Formed>

The coating film on the region on which an antenna is formed and the coating film on the region on which a wiring line and an electrode are formed may be separately formed, and then subjected to patterning by photolithography.

More specifically, it is a method for producing an antenna substrate, in which step (1) includes the following steps (1-A) and (1-B): (1-A) forming a first coating film using a first photosensitive paste containing a conductive material and a photosensitive organic component on an insulating substrate; and (1-B) forming a second coating film using a second photosensitive paste containing a conductive material and a photosensitive organic component on the insulating substrate; step (2-A) is a step of processing the first coating film into a pattern corresponding to an antenna by photolithography; step (2-B) includes a step of processing the second coating film into a pattern corresponding to a wiring line by photolithography; and step (2-C) includes a step of processing the second coating film into a pattern corresponding to an electrode by photolithography.

[Batch Processing of Pattern Corresponding to Antenna, Pattern Corresponding to Wiring Line, and Pattern Corresponding to Electrode]

Figure 8:
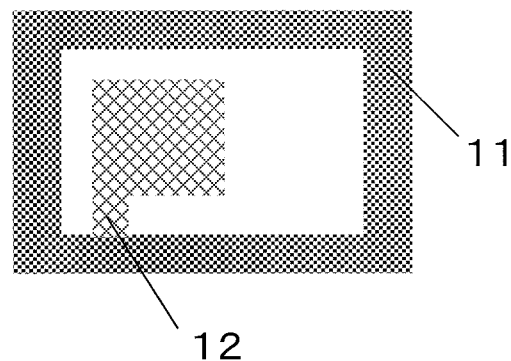
FIG. 8 is a drawing for illustrating a shape of a coating film in the production of the antenna substrate with wiring line and electrode of the present invention.

FIG. 8 shows a state after the first and second coating film s are formed. In FIG. 8, there are two types of coating film s including a coating film 11 for forming a pattern corresponding to an antenna, and a coating film 12 for forming a pattern corresponding to a wiring line and a pattern corresponding to an electrode. The coating film s are exposed and developed to be processed into a pattern corresponding to an antenna, a pattern corresponding to a wiring line, and a pattern corresponding to an electrode in a batch manner. The coating film s may be exposed once or a plurality of times. That is, the method is a method for producing an antenna substrate in which steps (2-A), (2-B), and (2-C) are performed in a batch manner. The pattern corresponding to an antenna, the pattern corresponding to an electrode, and the pattern corresponding to a wiring line are cured into the antenna, the electrode, and the wiring line, respectively.

The first photosensitive paste and the second photosensitive paste may be pastes of the same composition or different compositions. The thickness of the antenna is not particularly limited, but is preferably 1 μm to 10 μm, more preferably 1 μm to 4 μm, still more preferably 1 μm to 2 μm. The thicknesses of the wiring line and the electrode are also not particularly limited, and may be the same as or different from the thickness of the antenna.

[Batch Processing of Pattern Corresponding to Wiring Line and Pattern Corresponding to Electrode]

It is also possible to process a pattern corresponding to a wiring line and a pattern corresponding to an electrode in a batch manner and separately process a pattern corresponding to an antenna. In this method, the pattern corresponding to an antenna is processed in a development step different from the development step in which the pattern corresponding to a wiring line and the pattern corresponding to an electrode are processed. Accordingly, it is possible to set processing conditions suited for the different dissolution rates and pattern dimensions of the coating film s, and to process the patterns more accurately.

More specifically, it is a method for producing an antenna substrate, in which step (1) includes the following steps (1-A) and (1-B): (1-A) forming a first coating film using a first photosensitive paste containing a conductive material and a photosensitive organic component on an insulating substrate; and (1-B) forming a second coating film using a second photosensitive paste containing a conductive material and a photosensitive organic component on the insulating substrate; step (2-A) is a step of processing the first coating film into a pattern corresponding to an antenna by photolithography; step (2-B) includes a step of processing the second coating film into a pattern corresponding to a wiring line by photolithography; step (2-C) includes a step of processing the second coating film into a pattern corresponding to an electrode by photolithography; and steps (2-B) and (2-C) are performed in a batch manner.

The pattern corresponding to an antenna, the pattern corresponding to an electrode, and the pattern corresponding to a wiring line are cured into the antenna, the electrode, and the wiring line, respectively.

Specific examples include the following two methods.

(A) A method of forming an antenna and then forming a wiring line and an electrode, including the steps of:

(i) forming a first coating film using a first photosensitive paste containing a conductive material and a photosensitive organic component on an insulating substrate;

(ii) processing the first coating film into a pattern corresponding to an antenna by photolithography;

(iii) curing the pattern corresponding to an antenna into an antenna;

(iv) forming a second coating film using a second photosensitive paste containing a conductive material and a photosensitive organic component on the insulating substrate having the antenna thereon;

(v) processing the second coating film into a pattern corresponding to a wiring line and a pattern corresponding to an electrode by photolithography; and (vi) curing the pattern corresponding to a wiring line and the pattern corresponding to an electrode into a wiring line and an electrode, respectively.

Figure 9A:
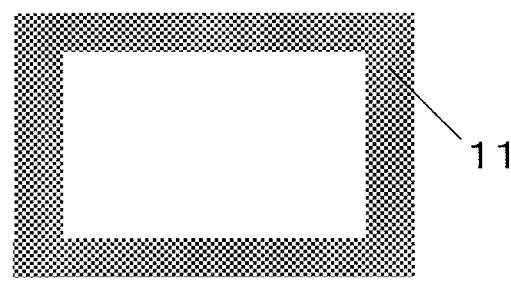
FIG. 9A is a drawing for illustrating a shape of the coating film in the production of the antenna substrate with wiring line and electrode of the present invention.
Figure 9B:
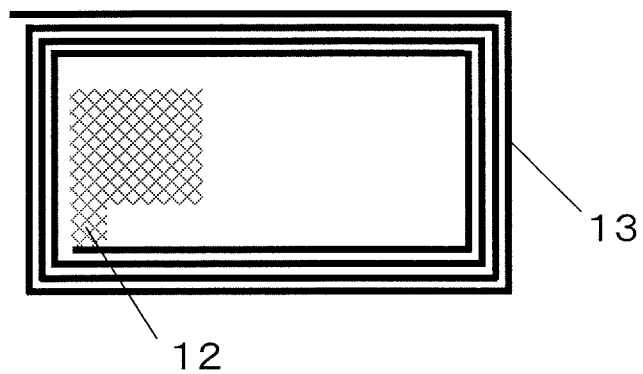
FIG. 9B is a drawing for illustrating shapes of an antenna and a coating film in the production of the antenna substrate with wiring line and electrode of the present invention.

FIG. 9A shows a state after the coating film 11 for forming a pattern corresponding to an antenna, which is the first coating film, is formed. FIG. 9B shows a state after an antenna 13 is formed, and the coating film 12 for forming a pattern corresponding to a wiring line and a pattern corresponding to an electrode, which is the second coating film, is formed.

(B) A method of forming a wiring line and an electrode and then forming an antenna, including the steps of:

(i) forming a second coating film using a second photosensitive paste containing a conductive material and a photosensitive organic component on an insulating substrate;

(ii) processing the second coating film into a pattern corresponding to a wiring line and a pattern corresponding to an electrode in a batch manner by photolithography;

(iii) curing the pattern corresponding to a wiring line and the pattern corresponding to an electrode into a wiring line and an electrode, respectively;

(iv) forming a first coating film using a first photosensitive paste containing a conductive material and a photosensitive organic component on the insulating substrate having the wiring line and the electrode thereon;

(v) processing the first coating film into a pattern corresponding to an antenna by photolithography; and (vi) curing the pattern corresponding to an antenna into an antenna.

Figure 10A:
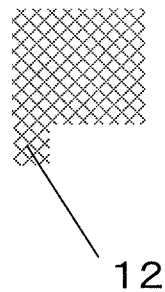
FIG. 10A is a drawing for illustrating a shape of the coating film in the production of the antenna substrate with wiring line and electrode of the present invention.
Figure 10B:
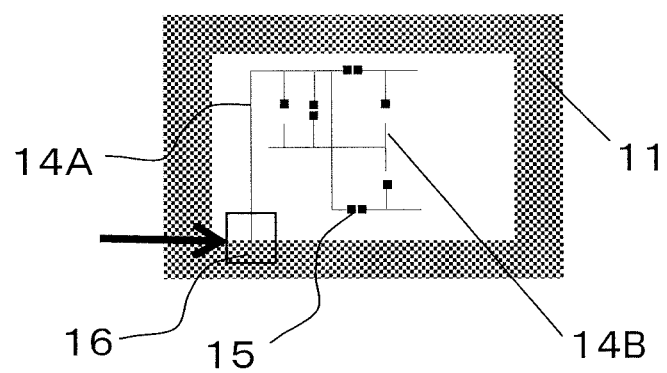
FIG. 10B is a drawing for illustrating shapes of wiring lines and electrodes as well as a coating film in the production of the antenna substrate with wiring line and electrode of the present invention.

FIG. 10A shows a state after the coating film 12 for forming a pattern corresponding to a wiring line and a pattern corresponding to an electrode, which is the second coating film, is formed. FIG. 10B shows a state after wiring lines 14A and 14B and electrodes 15 are formed, and the coating film 11 for forming a pattern corresponding to an antenna, which is the first coating film, is formed.

The photosensitive paste for forming a pattern corresponding to an antenna and the photosensitive paste for forming a pattern corresponding to a wiring line and a pattern corresponding to an electrode may be pastes of the same composition or different compositions.

As described above, the thickness of the antenna is not particularly limited, but is preferably 1 µm to 10 µm, more preferably 1 µm to 4 µm, still more preferably 1 µm to 2 µm. The thicknesses of the wiring line and the electrode are also not particularly limited, and may be the same as or different from the thickness of the antenna.

From the viewpoint of reducing the amount of the conductive material used, and because of ease of forming a uniform insulating layer and a uniform semiconductor layer on the electrode, it is preferable that the thicknesses of the wiring line and the electrode be small. More specifically, the thicknesses are each preferably 2 µm or less, more preferably 1.0 µm or less, particularly preferably 0.5 µm or less. From the viewpoint of conductivity, the thicknesses are each preferably 0.05 µm or more.

As a method for producing an antenna substrate with wiring line and electrode in which the thickness of the antenna is different from the thicknesses of the wiring line and the electrode, first, a method of varying the kind of the photosensitive paste can be mentioned. For example, the thicknesses of the wiring line and the electrode can be made smaller than the thickness of the antenna by setting the particle diameter of the conductive material contained in the photosensitive paste for forming a pattern corresponding to a wiring line and a pattern corresponding to an electrode smaller than the particle diameter of the conductive material contained in the photosensitive paste for forming a pattern corresponding to an antenna. Further, the area of the coating film for forming a pattern corresponding to a wiring line and a pattern corresponding to an electrode is smaller than the area of the coating film for forming a pattern corresponding to an antenna. The coating method is preferably inkjet coating or dispenser coating.

Second, when the compositions of the photosensitive pastes are the same between the photosensitive paste for forming a pattern corresponding to an antenna and the photosensitive paste for forming a pattern corresponding to a wiring line and a pattern corresponding to an electrode, the thickness of the antenna can be made different from the thicknesses of the wiring line and the electrode by adjusting the film forming conditions of the coating film s to vary the thickness of the pattern corresponding to an antenna from the thicknesses of the pattern corresponding to a wiring line and the pattern corresponding to an electrode. For example, when screen printing is used for the application of the photosensitive paste, the thicknesses of the coating film s can be varied by varying the thickness and the opening ratio of the mesh of the screen printing plate.

In the case where the pattern corresponding to an antenna, and the pattern corresponding to a wiring line and the pattern corresponding to an electrode are separately processed, it is preferable that the antenna and a part of the wiring line overlap each other in the finally obtained antenna substrate with wiring line and electrode. Therefore, for example, in the production method (A), when the second coating film is formed on the insulating substrate having an antenna thereon, the second photosensitive paste should be applied so that it overlaps a part of the antenna. That is, it is preferable to employ a method for producing an antenna substrate with wiring line and electrode in which, in step (1-B), the second coating film is formed so as to overlap a part of the antenna.

In addition, in the production method (B), when the first coating film is formed on the insulating substrate having a wiringline and an electrode thereon, the first photosensitive paste should be applied so that it overlaps a part of the wiring line. In this case, the bond between the antenna and the wiring line is strengthened in the finally obtained antenna substrate with wiring line and electrode, and disconnection at the time of bending the antenna substrate hardly occurs. Further, the connection resistance between the antenna and the wiring line can be reduced, and the voltage drop caused by the input from the antenna to the wiring line can be reduced.

Figure 10C:
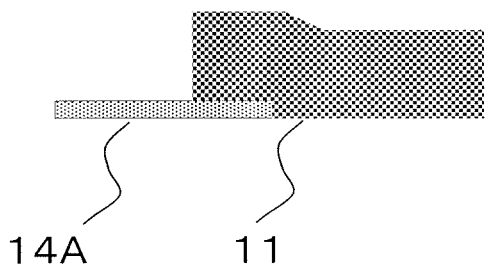
FIG. 10C is a drawing for illustrating a cross-sectional shape of a connected part between the wiring line and the coating film in the production of the antenna substrate with wiring line and electrode of the present invention.

In the production method (B), as shown in FIG. 10B, a photosensitive paste is applied by screen printing or the like to a part of a substrate having the wiring lines 14A and 14B and the electrodes 15 thereon, and formed into the coating film 11. FIG. 10C is a cross-sectional view of a connected part 16 between the wiring line 14A and the coating film 11 observed from the direction of the arrow in FIG. 10B. An antenna substrate with wiring line and electrode in which the antenna overlaps a part of the wiring line can be formed by forming the coating film 11 so that it overlaps the wiring line 14A as shown in FIG. 10C, processing the coating film into a pattern corresponding to an antenna, and curing the pattern.

[Batch Processing of Pattern Corresponding to Antenna and Pattern Corresponding to Wiring Line]

It is also possible to process a pattern corresponding to an antenna and a pattern corresponding to a wiring line in a batch manner and separately process a pattern corresponding to an electrode.

More specifically, it is a method for producing an antenna substrate with wiring line and electrode, in which step (1) includes the following steps (1-A) and (1-B): (1-A) forming a first coating film using a first photosensitive paste containing a conductive material and a photosensitive organic component on an insulating substrate; and (1-B) forming a second coating film using a second photosensitive paste containing a conductive material and a photosensitive organic component on the insulating substrate; steps (2-A) and (2-B) are a step of processing the first coating film into a pattern corresponding to an antenna and a pattern corresponding to a wiring line in a batch manner by photolithography; and step (2-C) includes a step of processing the second coating film into a pattern corresponding to an electrode by photolithography.

The pattern corresponding to an antenna, the pattern corresponding to a wiring line, and the pattern corresponding to an electrode are cured into the antenna, the wiring line, and the electrode, respectively.

Specific examples include the following two methods.

(A) A method of forming an antenna and a wiring line and then forming an electrode pattern, including the steps of:

(i) forming a first coating film using a first photosensitive paste containing a conductive material and a photosensitive organic component on an insulating substrate;

(ii) processing the first coating film into a pattern corresponding to an antenna and a pattern corresponding to a wiring line by photolithography;

(iii) curing the pattern corresponding to an antenna and the pattern corresponding to a wiring line into an antenna and a wiring line, respectively;

(iv) forming a second coating film using a second photosensitive paste containing a conductive material and a photosensitive organic component on the insulating substrate having the antenna and the wiring line thereon;

(v) processing the second coating film into a pattern corresponding to an electrode by photolithography; and (vi) curing the pattern corresponding to electrode into an electrode.

Figure 11A:
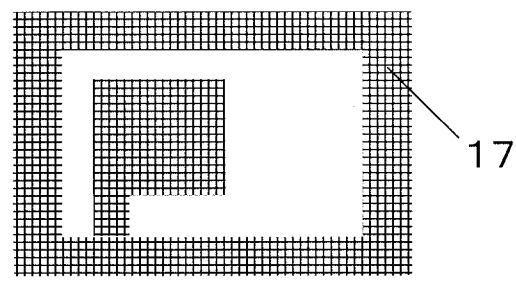
FIG. 11A is a drawing for illustrating a shape of the coating film in the production of the antenna substrate with wiring line and electrode of the present invention.
Figure 11B:
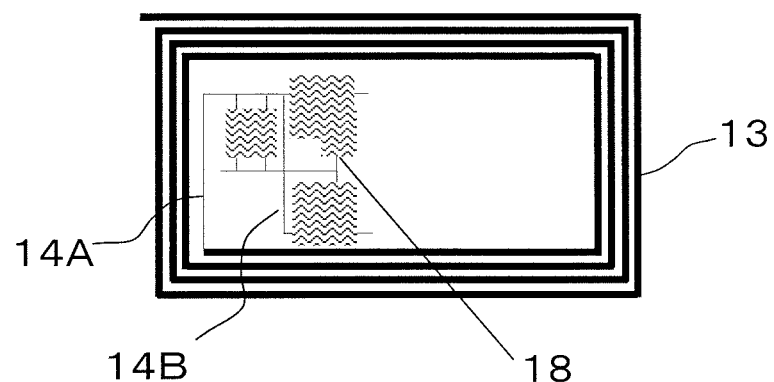
FIG. 11B is a drawing for illustrating shapes of an antenna and wiring lines as well as a coating film in the production of the antenna substrate with wiring line and electrode of the present invention.

FIG. 11A shows a state after a coating film 17 for forming a pattern corresponding to an antenna and a pattern corresponding to a wiring line, which is the first coating film, is formed. FIG. 11B shows a state after the antenna 13 and the wiring lines 14A and 14B are formed, and a coating film 18 for forming a pattern corresponding to an electrode, which is the second coating film, is formed.

(B) A method of forming an electrode and then forming an antenna and a wiring line, including the steps of:

(i) forming a second coating film using a second photosensitive paste containing a conductive material and a photosensitive organic component on an insulating substrate;

(ii) processing the second coating film into a pattern corresponding to an electrode by photolithography;

(iii) curing the pattern corresponding to an electrode into an electrode;

(iv) forming a first coating film using a first photosensitive paste containing a conductive material and a photosensitive organic component on the insulating substrate having the electrode thereon;

(v) processing the first coating film into a pattern corresponding to an antenna and a pattern corresponding to a wiring line by photolithography; and (vi) curing the pattern corresponding to an antenna and the pattern corresponding to a wiring line into an antenna and a wiring line, respectively.

Figure 12A:
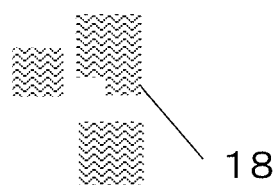
FIG. 12A is a drawing for illustrating a shape of the coating film in the production of the antenna substrate with wiring line and electrode of the present invention.
Figure 12B:
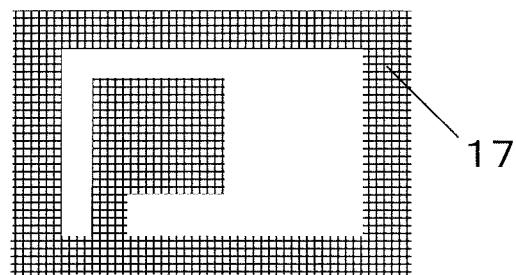
FIG. 12B is a drawing for illustrating shapes of electrodes and a coating film in the production of the antenna substrate with wiring line and electrode of the present invention.

FIG. 12A shows a state after the coating film 18 for forming a pattern corresponding to an electrode, which is the first coating film, is formed. FIG. 12B shows a state after the electrodes 15 are formed, and the coating film 17 for forming a pattern corresponding to an antenna and a pattern corresponding to a wiring line, which is the second coating film, is formed. In FIG. 12B, the electrodes 15 are not shown because they are covered with the coating film 17.

The photosensitive paste for forming a pattern corresponding to an antenna and a pattern corresponding to a wiring line and the photosensitive paste for forming a pattern corresponding to an electrode may be pastes of the same composition or different compositions.

The thicknesses of the antenna and the wiring line are not particularly limited, but are each preferably 1 µm to 10 µm, more preferably 1 µm to 4 µm, still more preferably 1 µm to 2 µm. The thickness of the electrode is also not particularly limited, and may be the same as or different from the thicknesses of the antenna and the wiring line.

From the viewpoint of reducing the amount of the conductive material used, and because of ease of forming a uniform insulating layer and a uniform semiconductor layer on the electrode, it is preferable that the thickness of the electrode be small. The thickness is preferably 2.0 µm or less, more preferably 1.0 µm or less, particularly preferably 0.5 µm or less.

As a method for producing an antenna substrate with wiring line and electrode in which the thicknesses of the antenna and the wiring line are different from the thickness of the electrode, first, a method of varying the kind of the photosensitive paste can be mentioned. For example, the thickness of the electrode can be made smaller than the thicknesses of the antenna and the wiring line by setting the particle diameter of the conductive material contained in the photosensitive paste for forming a pattern corresponding to an electrode smaller than the particle diameter of the conductive material contained in the photosensitive paste for forming a pattern corresponding to an antenna and a pattern corresponding to a wiring line. The area of the coating film for forming a pattern corresponding to an electrode is smaller than the area of the coating film for forming a pattern corresponding to an antenna and a pattern corresponding to a wiring line. The coating method is preferably inkjet coating or dispenser coating.

Second, when the compositions of the photosensitive pastes are the same between the photosensitive paste for forming a pattern corresponding to an antenna and a pattern corresponding to a wiring line and the photosensitive paste for forming a pattern corresponding to an electrode, the thicknesses of the antenna and the wiring line can be made different from the thickness of the electrode by adjusting the film forming conditions of the coating film s to vary the thicknesses of the pattern corresponding to an antenna and the pattern corresponding to a wiring line from the thickness of the pattern corresponding to an electrode. For example, when screen printing is used for the application of the photosensitive paste, the thicknesses of the coating film s can be varied by varying the thickness and the opening ratio of the mesh of the screen printing plate.

In the case where the pattern corresponding to an antenna and the pattern corresponding to a wiring line, and the pattern corresponding to an electrode are separately processed, it is preferable that the wiring line pattern and a part of the electrode pattern overlap each other in the finally obtained antenna substrate with wiring line and electrode. Therefore, for example, in the production method (A), when the second coating film is formed on the insulating substrate having an antenna and a wiring line thereon, the second photosensitive paste should be applied so that it overlaps a part of the wiring line. In addition, in the production method (B), when the first coating film is formed on the insulating substrate having an electrode thereon, the first photosensitive paste should be applied so that it covers the electrode and the pattern corresponding to a wiring line overlaps a part of the electrode.

Figure 12C:
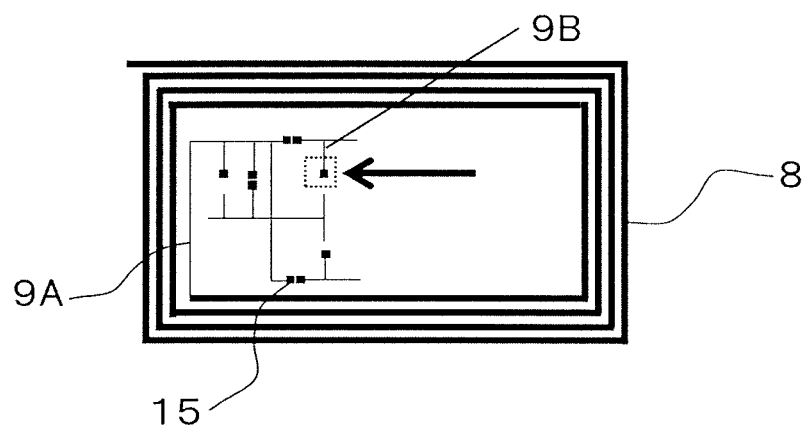
FIG. 12C is a drawing for illustrating shapes of electrodes, a pattern corresponding to an antenna, and patterns each corresponding to a wiring line in the production of the antenna substrate with wiring line and electrode of the present invention.
Figure 12D:
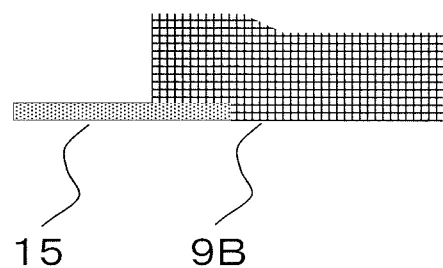
FIG. 12D is a drawing for illustrating a cross-sectional shape of a connected part between the electrode and the pattern corresponding to a wiring line in the production of the antenna substrate with wiring line and electrode of the present invention.

More specifically, in the production method (B), as shown in FIG. 12B, a photosensitive paste is applied by screen printing or the like to a part of the substrate having the electrodes 15 thereon, and formed into the coating film 17. Then, the coating film is exposed and developed to give the substrate having the electrodes 15, the pattern 8 corresponding to an antenna, and the patterns 9A and 9B each corresponding to a wiring line as shown in FIG. 12C. FIG. 12D is a cross-sectional view of a connected part between the electrode 15 and the pattern 9B corresponding to a wiring line that is enclosed by the dashed square in FIG. 12C and observed from the direction of the arrow in FIG. 12C. An antenna substrate with wiring line and electrode in which the wiring line overlaps a part of the electrode can be formed by forming the pattern 9B corresponding to a wiring line so that it overlaps the electrode 15 as shown in FIG. 12D, and curing the pattern. In the case of a fine electrode pattern and a fine wiring line pattern, it is difficult to accurately bond them together with a conductive paste such as a carbon paste or an indium paste. Therefore, it is preferable to connect the electrode pattern to the wiring line pattern by making the wiring line and a part of the electrode overlap each other.

[Other Forms of Production Method]

As other forms, there are methods for producing an antenna substrate with wiring line and electrode, in which a pattern corresponding to an antenna and a pattern corresponding to an electrode, and a pattern corresponding to a wiring line are separately processed, and a method for producing an antenna substrate with wiring line and electrode, in which a pattern corresponding to an antenna, a pattern corresponding to a wiring line, and a pattern corresponding to an electrode are separately processed, for example.

<Second Embodiment of Method for Producing Antenna Substrate with Wiring Line and Electrode>

A method for producing an antenna substrate according to the second embodiment of the present invention includes the steps of:

(1-P) forming a coating film using a photosensitive paste containing a conductive material and a photosensitive organic component on an insulating substrate having an antenna thereon; (2-P-B) processing the coating film into a pattern corresponding to a wiring line by photolithography; (2-P-C) processing the coating film into a pattern corresponding to an electrode by photolithography; (3-P-B) curing the pattern corresponding to a wiring line into a wiring line; and (3-P-C) curing the pattern corresponding to an electrode into an electrode.

The insulating substrate having an antenna thereon should have at least the antenna, and may have a part of the wiring line or the electrode thereon. For example, when an insulating substrate having an antenna thereon is used, a pattern corresponding to a wiring line and a pattern corresponding to an electrode are formed in steps (2-P-B) and (2-P-C), respectively. On the other hand, when an insulating substrate having an antenna and a part of a wiring line thereon is used, a pattern corresponding to a part of a wiring line is formed in step (2-P-B), and a pattern corresponding to an electrode is formed in step (2-P-C), respectively.

As described above, known methods for forming an antenna for an RFID element include a method of processing metal foil such as copper foil or aluminum foil into an antenna using a punching blade and transferring the resultant antenna to a base (hereinafter referred to as a "punching blade" method), a method of etching metal foil bonded to a base such as a plastic film using a resist layer formed on the metal foil as a mask (hereinafter referred to as an "etching" method), and a method of printing a conductive paste into a pattern corresponding to an antenna on a base such as a plastic film and curing the pattern with heat or light (hereinafter referred to as a "printing" method). An antenna substrate with wiring line and electrode can be formed by forming a coating film using a photosensitive paste on an antenna substrate produced as described above, and then forming a pattern corresponding to an electrode and a pattern corresponding to a wiring line by photolithography. The method for forming the antenna is not particularly limited, but a punching blade method and an etching method in which metal foil is used are preferable from the viewpoint of reducing the resistance of the antenna. Reducing the resistance of the antenna increases the communication distance.

The pattern corresponding to a wiring line and the pattern corresponding to an electrode may be processed and formed separately, or they may be processed and formed in a batch manner. However, from the viewpoint of reduction of processing steps and connection of patterns, it is preferable to process the pattern corresponding to a wiring line and the pattern corresponding to an electrode in a batch manner. That is, it is preferable to employ a method for producing an antenna substrate with wiring line and electrode in which steps (2-P-B) and (2-P-C) are performed in a batch manner.

The pattern corresponding to a wiring line and the pattern corresponding to an electrode may be cured separately, or they may be cured in a batch manner.

It is preferable that the antenna and a part of the wiring line overlap each other in the finally obtained antenna substrate with wiring line and electrode. Therefore, when the coating film is formed on the insulating substrate having an antenna thereon, the photosensitive paste should be applied so that it overlaps a part of the antenna. In this case, the bond between the antenna and the wiring line is strengthened in the finally obtained antenna substrate with wiring line and electrode, and disconnection at the time of bending the antenna substrate hardly occurs.

The thicknesses of the wiring line and the electrode are also not particularly limited, and may be the same as or different from the thickness of the antenna. From the viewpoint of reducing the amount of the conductive material used, and because of ease of forming a uniform insulating layer and a uniform semiconductor layer on the electrode, it is preferable that the thicknesses of the wiring line and the electrode be small. More specifically, the thicknesses are each preferably 2 μm or less, more preferably 1 μm or less, particularly preferably 0.5 μm or less.

Figure 13A:
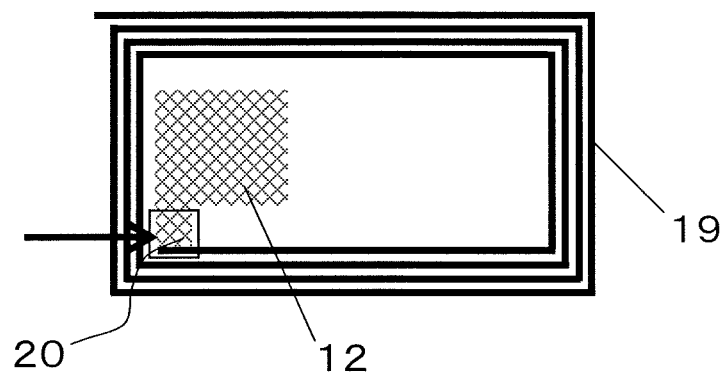
FIG. 13A is a drawing for illustrating shapes of an antenna and a coating film in the production of the antenna substrate with wiring line and electrode of the present invention.
Figure 13B:
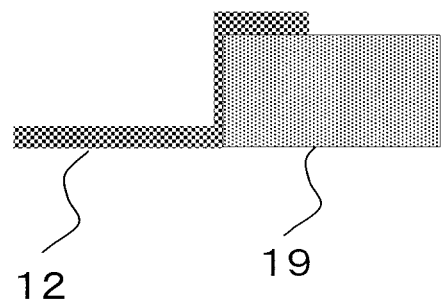
FIG. 13B is a drawing for illustrating a cross-sectional shape of a connected part between the antenna and the coating film in the production of the antenna substrate with wiring line and electrode of the present invention.

FIG. 13A shows a state after the coating film 12 for forming a pattern corresponding to a wiring line and a pattern corresponding to an electrode is formed on an insulating substrate having an antenna 19 thereon. FIG. 13B is a cross-sectional view of a connected part 20 between the antenna 19 and the coating film 12 observed from the direction of the arrow in FIG. 13A. An antenna substrate in which the antenna overlaps a part of the wiring line can be formed by forming the coating film 12 so that it overlaps the antenna 19 as shown in FIG. 13B, processing the coating film into a pattern corresponding to a wiring line and a pattern corresponding to an electrode, and curing the patterns. In this case, the bond between the antenna and the wiring line is strengthened in the finally obtained antenna substrate with wiring line and electrode, and disconnection at the time of bending the antenna substrate hardly occurs. Further, the connection resistance between the antenna and the wiring line can be reduced, and the voltage drop caused by the input from the antenna to the wiring line can be reduced. That is, it is preferable to employ a method for producing an antenna substrate with wiring line and electrode in which, in step (1-P), the coating film is formed so as to overlap a part of the antenna.

Hereinafter, the insulating substrate and the photosensitive paste used in the production of the antenna substrate, the antenna substrate with wiring line and electrode, and the RFID element of the present invention will be described.

(Insulating Substrate)

The insulating substrate used in the present invention preferably contains, for example, a polyimide (PI) resin, a polyester resin, a polyamide resin, an epoxy resin, a polyamideimide resin, a polyetherimide resin, a polyetherketone resin, a polysulfone resin, a polyphenylene sulfide (PPS) resin, and a cycloolefin resin, but the insulating substrate is not limited thereto. Among them, the insulating substrate preferably contains at least one resin selected from polyethylene terephthalate (PET), polyethylene naphthalate, PPS, polyphenylene sulfone, a cycloolefin polymer, a polyamide, and PI. From the viewpoint of cost reduction, PET is preferable.

From the viewpoint of the adhesion of the antenna, the wiring line, and the electrode to the base, a polysulfone resin or a PPS resin is preferable. This is presumably because the metal atoms in the antenna, the wiring line, and the electrode strongly interact with the sulfur atoms contained in these resins. Improved adhesion between the conductive pattern and the base suppresses the pattern peeling at the time of bending the antenna substrate or the antenna substrate with wiring line and electrode.

(Photosensitive Paste)

In the present invention, the photosensitive paste for forming the antenna, the wiring line, and the electrode is mainly formed of a conductive material and a photosensitive organic component.

(Conductive Material)

The conductive material is preferably a conductive powder containing at least one of Ag, Au, Cu, Pt, Pb, Sn, Ni, Al, W, Mo, ruthenium oxide, Cr, Ti, carbon, and indium. These conductive powders can be used alone, as an alloy, or as a mixed powder. Among them, Ag, Cu, and Au are preferable from the viewpoint of conductivity, and Ag is more preferable from the viewpoint of cost and stability. In addition, from the viewpoint of reducing the resistivity at the time of low-temperature curing of the coating film, it is more preferable to use Ag and carbon black in combination.

The volume average particle diameter of the conductive powder is preferably 0.02 µm to 10 µm, more preferably 0.02 µm to 5 µm, still more preferably 0.02 µm to 2 µm. When the volume average particle diameter is 0.1 µm or more, the probability of contact between the particles of the conductive powder increases, and the specific resistance value of the produced conductive pattern and the disconnection probability can be reduced. Further, since the active rays can smoothly penetrate through the film at the time of exposure, fine patterning is facilitated. When the volume average particle diameter is 10 µm or less, the surface smoothness, pattern accuracy, and dimensional accuracy of the printed circuit pattern are improved. In addition, reducing the thickness of the pattern requires reducing the particle diameter. For example, when an antenna having a thickness of 2 µm is to be formed, the particle diameter should also be 2 µm or less. The volume average particle diameter can be determined by a Coulter counter method, photon correlation spectroscopy, laser diffractometry, or the like.

The amount of the conductive powder is preferably in the range of 70% by mass to 95% by mass, more preferably 80% by mass to 90% by mass based on the total solid content in the photosensitive paste. When the amount is 70% by mass or more, the probability of contact between the particles of the conductive powder particularly in the cure shrinkage increases, and the specific resistance value of the produced conductive pattern and the disconnection probability can be reduced. In addition, when the amount is 95% by mass or less, the active rays can smoothly penetrate through the film particularly at the time of exposure, and fine patterning is facilitated. The solid content is obtained by excluding the solvent from the photosensitive paste.

(Photosensitive Organic Component)

The photosensitive organic component contains a monomer, oligomer, or polymer having a polymerizable unsaturated group in the molecule.

As the monomer having a polymerizable unsaturated group in the molecule, a compound having an active carbon-carbon unsaturated double bond can be used. Monofunctional and polyfunctional compounds having a vinyl group, an allyl group, an acrylate group, a methacrylate group, or an acrylamide group as a functional group are applicable.

Specific examples thereof include allylated cyclohexyl diacrylate, polyethylene glycol diacrylate, dipentaerythritol hexaacrylate, dipentaerythritol monohydroxy pentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, diacrylate of a bisphenol A-ethylene oxide adduct, diacrylate of a bisphenol A-propylene oxide adduct, 1,6-hexanediol diacrylate, tripropylene glycol diacrylate, 2-(2-ethoxyethoxy)ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, triethylene glycol diacrylate, and compounds in which some or all of acrylic groups of the above-mentioned compounds are substituted with methacrylic groups.

In the present invention, one of these or two or more of these can be used. The monomer is added in an amount in the range of 1% by mass to 15% by mass, more preferably 2% by mass to 10% by mass based on the total solid content in the photosensitive paste. If the amount of the monomer is less than 1% by mass, the sensitivity lowers and it becomes difficult to forma satisfactory pattern. On the other hand, if the amount of the monomer exceeds 15% by mass, the dried film has tackiness. Thus, the photomask contacts the coating film at the time of exposure, causing a problem of contamination of the photomask and coarse surface of the coating film.

The oligomer or polymer having a polymerizable unsaturated group in the molecule is obtained by polymerization or copolymerization of a component selected from compounds having a carbon-carbon double bond. The oligomer or polymer having a polymerizable unsaturated group in the molecule can be obtained by adding a photoreactive group to the side chain or the molecular terminal of the obtained oligomer or polymer.

A preferable polymerizable unsaturated group is a group having an ethylenically unsaturated group. Examples of the ethylenically unsaturated group include a vinyl group, an allyl group, an acrylic group, and a methacrylic group.

Examples of the method of adding such side chain to an oligomer or a polymer include a method of adding an ethylenically unsaturated compound having a glycidyl group or an isocyanate group, acrylic acid chloride, methacrylic acid chloride, or allyl chloride to a mercapto group, an amino group, a hydroxyl group, or a carboxyl group in the oligomer or polymer.

Examples of the ethylenically unsaturated compound having a glycidyl group include glycidyl acrylate, glycidyl methacrylate, allyl glycidyl ether, glycidyl ethyl acrylate, crotonyl glycidyl ether, crotonic acid glycidyl ether, and isocrotonic acid glycidyl ether. Examples of the ethylenically unsaturated compound having an isocyanate group include (meth)acryloyl isocyanate and (meth)acryloylethyl isocyanate. It is preferable to add 0.05 molar equivalents to 1 molar equivalent of the ethylenically unsaturated compound having a glycidyl group or an isocyanate group, acrylic acid chloride, methacrylic acid chloride, or allyl chloride based on the mercapto group, amino group, hydroxyl group, or carboxyl group in the oligomer or polymer.

From the viewpoint of further enhancing the effect of suppressing the pattern peeling at the time of bending the antenna substrate or the antenna substrate with wiring line and electrode, the photosensitive organic component preferably contains a compound having a urethane group. For example, it is preferable that the oligomer or polymer contain a urethane-modified compound obtained by reacting an oligomer or polymer having a hydroxyl group in the side chain with a compound having an isocyanate group.

Such an oligomer or polymer having a polymerizable unsaturated group in the molecule preferably has a weight average molecular weight (Mw) within the range of 2,000 to 200,000 and a number average molecular weight (Mn) within the range of 1,000 to 50,000. More preferably, the Mw is within the range of 5,000 to 100,000, and the Mn is within the range of 1,000 to 30,000. When the Mw and the Mn are respectively within the above-mentioned ranges, the oligomer or polymer is good in handleability, and uniform curability can be achieved during photocuring.

The photosensitive paste used in the present invention contains a monomer, oligomer, or polymer having a polymerizable unsaturated group in the molecule. Since these components do not have an ability to absorb the energy of active rays, a photopolymerization initiator is required for photocuring. The photopolymerization initiator is selected in accordance with the light source used in photocuring, and a photo radical polymerization initiator, a photo cationic polymerization initiator, or the like can be used.

Examples of the photo radical polymerization initiator include at least one of: a combination of a light reducing dye such as diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexyl-phenyl ketone, 1-phenyl-1,2-propanedione-2-(o-ethoxycarbonyl)oxime, 2-methyl-[4-(methylthio)phenyl]-2-morpholinopropan-1-one, 2-benzyl-2-dimethylamino-1-(4-morpholinophenyl)-butanone-1, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenylsulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl]benzene methanaminium bromide, (4-benzoylbenzyl)trimethylammonium chloride, 2-hydroxy-3-(4-benzoylphenoxy)-N,N,N-trimethyl-1-propene aminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,4,6-trimethylbenzoylphenyl phosphine oxide, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenylglyoxy ester, η5-cyclopentadienyl-η6-cumenyl-iron (1+)-hexafluorophosphate (1−), a diphenyl sulfide derivative, bis(η5-2,4-cyclopentadien-1-yl)-bis(2,6-difluoro-3-(1H-pyrrol-1-yl)-phenyl)titanium, 4,4-bis(dimethylamino) benzophenone, 4,4-bis(diethylamino)benzophenone, thioxanthone, 2-methylthioxanthone, 2-chlorothioxanthone, 4-benzoyl-4-methylphenylketone, dibenzylketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzylmethoxyethyl acetal, anthraquinone, 2-t-butylanthraquinone, 2-aminoanthraquinone, β-chloroanthraquinone, anthrone, benzanthrone, dibenzsuberone, methylene anthrone, 4-azidobenzal acetophenone, 2,6-bis(p-azidobenzylidene)cyclohexane, 2,6-bis(p-azidobenzylidene)-4-methylcyclohexanone, 2-phenyl-1,2-butadione-2-(o-methoxycarbonyl)oxime, 1,3-diphenylpropanetrione-2-(o-ethoxycarbonyl)oxime, N-phenylglycine, tetrabutylammonium(+1)n-butyltriphenyl borate (1−), naphthalenesulfonyl chloride, quinolinesulfonyl chloride, N-phenylthioacridone, 4,4-azobisisobutyronitrile, benzothiazole disulfide, triphenylphosphine, tetrabrominated carbon, tribromophenylsulfone, benzoyl peroxide, eosin, and methylene blue and a reducing agent such as ascorbic acid and triethanolamine; a complex of a cationic dye having absorption in the near ultraviolet region and a borate anion; a combination of a silver halide sensitized with a near infrared sensitizing dye and a reducing agent; and a radical generator such as titanocene, an iron arene complex, an organic peroxide, hexaaryl, biimidazole, N-phenylglycine, and a diaryliodonium salt. Furthermore, if necessary, a sensitizing dye such as 3-substituted coumarin, a cyanine dye, a merocyanine dye, a thiazole dye, and a pyrylium dye can be used.

Examples of the photo cationic polymerization initiator include an iodonium salt, a sulfonium salt, a phosphate salt, and an antimonate salt.

In the present invention, one of these photopolymerization initiators or two or more of them can be used. The photopolymerization initiator is added in an amount in the range of 0.05% by mass to 10% by mass, more preferably 0.1% by mass to 10% by mass based on the photosensitive paste. If the amount of the photopolymerization initiator is too small, the photosensitive paste is insufficiently cured with light. If the amount of the photopolymerization initiator is too large, the photosensitive paste may be poor in compatibility.

Use of a sensitizer together with the photopolymerization initiator improves the sensitivity and expands the range of wavelengths effective for the reaction.

Specific examples of the sensitizer include 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, 4,4-bis(dimethylamino) chalcone, 4,4-bis(diethylamino)chalcone, p-dimethylamino cinnamylidene indanone, p-dimethylaminobenzylidene indanone, 2-(p-dimethylaminophenylvinylene)isonaphthothiazole, 1,3-bis(4-dimethylaminophenylvinylene) isonaphthothiazole, 1,3-bis(4-dimethylaminobenzal)acetone, 1,3-carbonylbis(4-diethylaminobenzal)acetone, 3,3-carbonylbis(7-diethylaminocoumarin), triethanolamine, methyldiethanolamine, triisopropanolamine, N-phenyl-N-ethylethanolamine, N-phenylethanolamine, N-tolyl diethanolamine, methyl 4-dimethylaminobenzoate, ethyl 4-dimethylaminobenzoate, isoamyl dimethylaminobenzoate, isoamyl diethylaminobenzoate, ethyl (2-dimethylamino) benzoate, (n-butoxy)ethyl 4-dimethylaminobenzoate, 2-ethylhexyl 4-dimethylaminobenzoate, 3-phenyl-5-benzoylthiotetrazole, and 1-phenyl-5-ethoxycarbonylthiotetrazole.

In the photosensitive paste used in the present invention, one or more of these sensitizers can be used. In the case where a sensitizer is added to the photosensitive paste of the present invention, the amount thereof is usually 0.05% by mass to 10% by mass, more preferably 0.1% by mass to 10% by mass based on the photosensitive organic component. If the amount of the sensitizer is too small, the effect of enhancing photocuring cannot be exerted, whereas if the amount of the sensitizer is too large, the photosensitive paste may be poor in compatibility.

The photosensitive paste used in the present invention preferably contains an organic solvent. Use of an organic solvent enables adjustment of the viscosity of the photosensitive paste and improvement in the surface smoothness of the coating film. For example, when the coating film is formed by screen printing, a preferable viscosity of the photosensitive paste is 10 Pa·s to 100 Pa·s (a value measured with a Brookfield viscometer at 3 rpm). The viscosity is more preferably 10 Pa·s to 50 Pa·s. When the viscosity of the photosensitive paste is in the range of 10 Pa·s to 100 Pa·s, the photosensitive paste well covers even an insulating substrate having a level difference. If the viscosity of the photosensitive paste is less than 10 Pa·s, coating failure may occur due to the sedimentation of the conductive powder, or dripping may occur at the time of coating, resulting in a problem of uneven coating surface. Alternatively, if the viscosity of the photosensitive paste exceeds 100 Pa·s, the photosensitive paste poorly covers an insulating substrate having a level difference. Meanwhile, when the coating film is formed by inkjet printing, the viscosity of the photosensitive paste is preferably 100 mPa·s (a value measured with a Brookfield viscometer) or less, more preferably 1 mPa·s to 50 mPa·s. When the viscosity of the photosensitive paste is 100 mPa·s or less, droplets are formed well, and a uniform coating film can be obtained. Setting the viscosity of the photosensitive paste to 1 mPa·s or more improves the thickness uniformity of the coating film. If the viscosity of the photosensitive paste exceeds 100 mPa·s, the paste is not discharged and cannot be applied.

The organic solvent is not particularly limited, and examples thereof include methyl ethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropylene glycol monoethyl ether, tripropylene glycol monomethyl ether, and propylene glycol monomethyl ether acetate. Two or more of these may, be used as a mixture.

The photosensitive paste used in the present invention may contain additives such as a non-photosensitive polymer having no unsaturated double bond in the molecule, a plasticizer, a leveling agent, a surfactant, a silane coupling agent, an antifoaming agent, and a pigment, as long as the desired properties are not impaired. Specific examples of the non-photosensitive polymer include an epoxy resin, a novolac resin, a phenol resin, a polyimide precursor, and a polyimide.

Specific examples of the plasticizer include dibutyl phthalate, dioctyl phthalate, polyethylene glycol, and glycerin. Specific examples of the leveling agent include a special vinyl polymer and a special acrylic polymer.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

The photosensitive paste used in the present invention is produced with use of a disperser, a kneader, or the like. Specific examples thereof include a triple roller, a ball mill, and a planetary ball mill, but are not limited thereto.

(Pattern Forming Method)

In the following, details of a method for forming various patterns using a photosensitive paste will be described in detail.

<Step of Forming Coating Film Using Photosensitive Paste Containing Conductive Material and Photosensitive Organic Component on Insulating Substrate>

Processes according to steps (1), (1-A), (1-B), and (1-C) will be described.

The photosensitive paste is applied to the entire surface or a part of the substrate by a publicly known coating method such as spin coating using a spinner, spray coating, roll coating, screen printing, blade coating, die coating, calendar coating, meniscus coating, bar coating, gravure printing, flexographic printing, offset printing, immersion and withdrawal, an inkjet method, and a dispenser method. Further, since the thickness of the coating film varies depending on the coating technique, solid content concentration and viscosity of the composition, and the like, these conditions are adjusted so that the coating film obtained by drying the paste may have a predetermined thickness value.

Then, the solvent is removed from the coating film applied to the substrate. In this way, a coating film is formed. Examples of a method for removing the solvent include drying by heating with use of an oven, a hot plate, infrared rays, or the like, and vacuum drying. The drying by heating is preferably carried out at a temperature in the range of 50° C. to 180° C. for 1 minute to several hours.

<Step of Processing Coating Film into Pattern Corresponding to Antenna, Pattern Corresponding to Wiring Line, and Pattern Corresponding to Electrode by Photolithography>

Processes according to steps (2), (2-A), (2-B), (2-C), (2-P-B), and (2-P-C) will be described.

The coating film from which the solvent has been removed is patterned by photolithography. As a light source used for exposure, it is preferable to use i-line (365 nm), h-line (405 nm), or g-line (436 nm) of a mercury lamp.

After the exposure, an unexposed portion is removed with a developer to give a desired pattern. Examples of the preferable developer for alkali development include aqueous solutions of compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. In some cases, a product obtained by adding one or more of polar solvents such as N-methyl-2-pyrrolidone, N,N-dimethylformamide, N,N-dimethylacetamide, dimethylsulfoxide, and γ-butyrolactone, alcohols such as methanol, ethanol, and isopropanol, esters such as ethyl lactate and propylene glycol monomethyl ether acetate, and ketones such as cyclopentanone, cyclohexanone, isobutyl ketone, and methyl isobutyl ketone to the above-mentioned aqueous solution may be used as a developer. In addition, a product obtained by adding a surfactant to the above-mentioned alkaline aqueous solution can also be used as a developer. Examples of the usable developer for organic development include polar solvents such as N-methyl-2-pyrrolidone, N-acetyl-2-pyrrolidone, N,N-dimethylacetamide, N,N-dimethylformamide, dimethyl sulfoxide, and hexamethylphosphoric triamide alone, or mixed solutions of the polar solvents in combination with methanol, ethanol, isopropyl alcohol, xylene, water, methyl carbitol, ethyl carbitol, or the like.

The coating film can be developed by spraying the developer to the coating film surface while leaving the substrate standing still or rotating the substrate, immersing the substrate in the developer, or applying ultrasonic waves to the substrate immersed in the developer.

After development, the coating film may be subjected to rinsing with water. In this process too, alcohols such as ethanol and isopropyl alcohol, and esters such as ethyl lactate and propylene glycol monomethyl ether acetate may be added to water for the rinsing.

<Step of Curing Pattern Corresponding to Antenna, Pattern Corresponding to Wiring Line, and Pattern Corresponding to Electrode Pattern>

Processes according to steps (3), (3-A), (3-B), (3-C), (3-P-B), and (3-P-C) will be described.

The coating film is cured for making the coating film exhibit conductivity. Examples of the curing method include thermal curing with use of an oven, an inert oven, a hot plate, infrared rays, or the like, vacuum curing, and curing with a xenon flash lamp. In the case of the thermal curing, the curing temperature is preferably in the range of 100° C. to 300° C., more preferably 100° C. to 200° C., still more preferably 120° C. to 180° C. When the heating temperature is 120° C. or higher, the amount of volumetric shrinkage of the photosensitive organic component of the resin can be increased, and the resistivity is lowered. Further, since the photosensitive paste used in the present invention can have high conductivity when cured at a relatively low temperature of 180° C. or less, the photosensitive paste can be used on a substrate having low heat resistance or in combination with a material having low heat resistance.

(RFID Element)

An RFID element can be produced by producing an antenna on an insulating substrate by the method for producing an antenna substrate of the present invention, and mounting an IC chip on the antenna. Alternatively, an RFID element can be produced by producing an antenna substrate with wiring line and electrode by the method for producing an antenna substrate with wiring line and electrode of the present invention, and forming a TFT having a semiconductor layer on the electrode or between the electrodes, or a capacitor having an insulating layer on the electrode. The wording "forming a semiconductor layer on an electrode" encompasses forming a semiconductor layer on an insulating layer formed on an electrode. Note that the TFT, capacitor, wiring line, and the like are combined to form a rectifier circuit, a logic circuit, a memory circuit, and the like.

(Method for Producing RFID Element)

That is, the method for producing a wiring line and an RFID element of the present invention includes the following steps:

(1) forming a coating film using a photosensitive paste containing a conductive material and a photosensitive organic component on an insulating substrate; (2) processing the coating film into a pattern corresponding to an antenna by photolithography; (3) curing the pattern corresponding to an antenna into an antenna to give an antenna substrate; and (4) mounting an IC chip on the antenna substrate.

(Step of Mounting IC Chip on Antenna Substrate)

A process according to step (4) will be described. An anisotropic conductive paste (ACP) (for example, TAP0604C manufactured by KYOCERA Chemical Corporation) is applied to a site of the antenna on which the IC chip is to be mounted, and an IC chip (for example, Monza 3 manufactured by Impinj) is placed on the ACP. The IC chip is made to closely adhere to the antenna by the application of a pressure of 1.0 N at a temperature of 160° C. for 10 seconds with a thermocompression bonding device (for example, TTS300 manufactured by Muhlbauer) to be fixedly connected to the antenna, and thus the IC chip can be mounted on the antenna substrate.

(Second Embodiment of Method for Producing RFID Element)

The second embodiment of the method for producing a wiring line and an RFID element of the present invention includes the following steps:

(1) forming a coating film using a photosensitive paste containing a conductive material and a photosensitive organic component on an insulating substrate; (2-A) processing the coating film into a pattern corresponding to an antenna by photolithography; (2-B) processing the coating film into a pattern corresponding to a wiring line by photolithography; (2-C) processing the coating film into a pattern corresponding to an electrode by photolithography; (3-A) curing the pattern corresponding to an antenna into an antenna; (3-B) curing the pattern corresponding to a wiring line into a wiring line; (3-C) curing the pattern corresponding to an electrode into one or more electrodes to give an antenna substrate with wiring line and electrode; and (4-S) forming a semiconductor layer on one or more of the electrodes or between the electrodes of the antenna substrate with wiring line and electrode.

The semiconductor layer of the TFT is not particularly limited, and an inorganic semiconductor such as an oxide semiconductor or an organic semiconductor such as pentacene or carbon nanotubes (CNTs) can be used. Of these, CNTs are preferable from the viewpoint of the capability of being formed at low temperatures of 200° C. or less, and TFT characteristics such as charge mobility and the ratio of ON current to OFF current (ON/OFF ratio). It is also preferable that at least one of steps of forming a rectifier circuit and a logic circuit include a step of applying a solution containing CNTs. The rectifying element is an element that converts an alternating current generated from radio waves received by an antenna into a direct current. Therefore, the rectifier circuit is required to be driven at a higher speed than in the case of the logic circuit, and the higher the charge mobility is, the higher the conversion efficiency from the alternating current to the direct current (hereinafter referred to as AC-DC conversion efficiency). Therefore, it is particularly preferable to use CNTs in the semiconductor layer of the rectifier circuit.

Figure 14A:
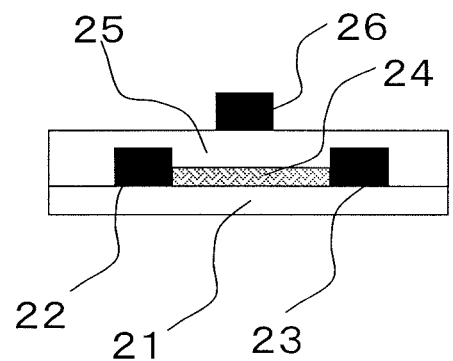
FIG. 14A is a drawing for illustrating a structure of a TFT of the present invention.
Figure 14B:
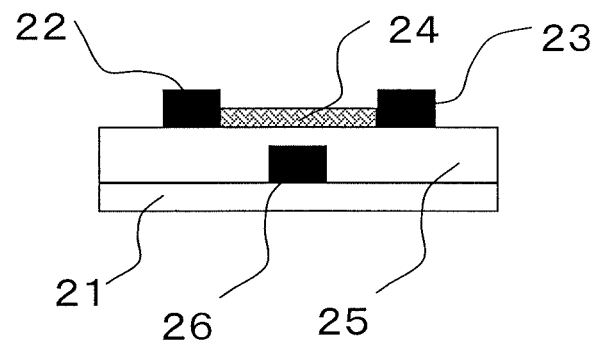
FIG. 14B is a drawing for illustrating a structure of a TFT of the present invention.

The wiring line of the antenna substrate with wiring line and electrode is used as a lower wiring line of the rectifier circuit, the logic circuit, and the like, and the electrode of the antenna substrate with wiring line and electrode is used as a lower electrode of the capacitor, a lower electrode of the TFT, and the like. In the case of a top gate TFT, the source and drain electrodes serve as lower electrodes, and as shown in FIG. 14A, a semiconductor layer 24 is disposed between a source electrode 22 and a drain electrode 23 on an insulating substrate 21, and a gate insulating layer 25 and a gate electrode 26 are formed over the semiconductor layer. Meanwhile, in the case of a bottom gate TFT, the gate electrode serves as a lower electrode, and as shown in FIG. 14B, the gate insulating layer 25 is formed on the gate electrode 26 on the insulating substrate 21, and the source electrode 22, the drain electrode 23, and the semiconductor layer 20 are disposed on the gate insulating layer.

(Step of Forming Semiconductor Layer on Electrode or Between Electrodes of Antenna Substrate with Wiring Line and Electrode)

As for the process according to step (4-S), a process for producing a TFT and a capacitor, including the process according to step (4-S), will be described. In the following, first, an example of a production process of a top gate TFT and a capacitor will be described.

First, a solution containing CNTs is applied to a space between a source electrode and a drain electrode by inkjet printing or the like to form a semiconductor layer. From the viewpoint of dispersibility of the CNTs in the solution, it is preferable to attach a conjugated polymer to at least a part of the surface of the CNTs. Use of a solution containing CNTs uniformly dispersed therein gives a CNT film containing CNTs uniformly dispersed therein. In this manner, good semiconductor properties can be achieved. The conjugated polymer is not particularly limited, and examples thereof include a polythiophene polymer, a polypyrrole polymer, a polyaniline polymer, a polyacetylene polymer, a poly-p-phenylene polymer, and a poly-p-phenylene vinylene polymer. From the viewpoint of ease of attachment to the CNTs, a polythiophene polymer that readily forms a CNT composite is preferably used. In particular, a polythiophene polymer containing, in the repeating unit thereof, both a condensed heteroaryl unit having a nitrogen-containing double bond in the ring thereof and a thiophene unit is more preferable.

Second, an insulating layer is formed on a lower electrode of the capacitor, a semiconductor layer, and the source and drain electrodes of the TFT. The material used in the insulating layer is not particularly limited, and specific examples thereof include organic high-molecular materials such as polyvinyl alcohol, polyvinyl chloride, polyethylene terephthalate, polyvinylidene fluoride, polysiloxane and derivatives thereof, and polyvinyl phenol and derivatives thereof, mixtures of an inorganic material powder and an organic high-molecular material, and mixtures of an organic low-molecular material and an organic high-molecular material. Among these materials, an organic high-molecular material is preferably used, because this material can be used in the production by a coating method such as inkjet printing. From the viewpoint of the uniformity of the insulating layer, it is particularly preferable to use an organic high-molecular material selected from the group consisting of polyfluoroethylene, polynorbornene, polysiloxane, polyimide, polystyrene, polycarbonate, derivatives of these compounds, a polyacrylic acid derivative, a polymethacrylic acid derivative, and copolymers containing any of these compounds. Note that the insulating film of the capacitor and the insulating film of the TFT may be the same or different. Further, the method for forming the insulating layer is not particularly limited, and examples of the method include slit die coating, screen printing, inkjet printing, flexographic printing, and gravure offset printing.

Third, an upper electrode of the capacitor, a gate electrode of the TFT, and an upper wiring line are formed this way, a top gate TFT and a capacitor can be formed.

An example of a production process of a bottom gate TFT and a capacitor will also be described.

First, an insulating layer is formed on a lower electrode of a capacitor and on a gate electrode of a TFT.

Second, an upper electrode of the capacitor, source and drain electrodes of the TFT, and an upper wiring line are formed.

Third, a solution containing CNTs is applied to a space between the source electrode and the drain electrode by inkjet printing or the like to form a semiconductor layer. In this way, a bottom gate TFT and a capacitor can be formed.

As described above, according to the present invention, use of photolithography enables highly accurate and fine electrode processing. Therefore, it is possible to reduce the channel length between the source and drain electrodes of the TFT, and to accurately form electrodes having a channel length as short as 20 μm or less. The AC-DC conversion efficiency of the rectifying element depends on the channel length, and a shorter channel length gives a higher AC-DC conversion efficiency. Therefore, it is possible to obtain an RFID element with high AC-DC conversion efficiency by producing an antenna substrate with wiring line and electrode according to the production method of the present invention.

EXAMPLES

Hereinafter, the present invention will be described with reference to examples and the like, but the present invention is not limited by these examples.

The evaluation methods used in the examples and comparative examples are as follows.

<Method for Evaluating Antenna Formability (Processing Accuracy)>

An antenna substrate or antenna substrate with wiring line and electrode was produced with use of a PET film 140 mm×140 mm×50 μm in thickness. The thickness of the antenna, and the line width (Lw) and the line spacing (Lc) of the antenna shown in FIGS. 15 and 16 were measured and evaluated according to the following criteria.

A (acceptable): Deviation from the design value is within 10% for all measured values of the thickness of the antenna, the line width of the antenna, and the line spacing of the antenna.

B (failure): Deviation from the design value exceeds 10% for at least one measured value of the thickness of the antenna, the line width of the antenna, and the line spacing of the antenna.

<Method for Measuring Thickness>

The thicknesses of the antenna, the wiring line, and the electrode were measured with SURFCOM 480A (trade name, manufactured by TOKYO SEIMITSU CO., LTD.). Three sites were randomly extracted, and the thicknesses of the sites were measured. The average value of the three sites was adopted. The measured length was 1 mm, and the scanning speed was 0.3 mm/s.

<Method for Measuring Line Width, Line Spacing, and Wiring Line Width>

The line width, line spacing, and wiring line width were obtained by randomly observing three sites with an optical microscope, obtaining values at the three sites by analyzing image data, and adopting the average value of the three sites.

<Method for Evaluating Antenna Formability (Processing Yield)>

From a PET film 140 mm×140 mm×50 μm in thickness, 100 antenna substrates or antenna substrates with wiring line and electrode were formed. The substrates were observed with an optical microscope and evaluated according to the following criteria based on the presence or absence of defects such as pattern defect, peeling, disconnection, and rubbing as an index.

A (very good): The number of substrates having a defect is 1 or less in 100 substrates.

B (good): The number of substrates having a defect is 2 or more and less than 5 in 100 substrates.

C (acceptable): The number of substrates having a defect is 5 or more and less than 10 in 100 substrates.

D (failure): The number of substrates having a defect is 10 or more in 100 substrates.

<Method for Evaluating Electrode Formability>

An antenna substrate with wiring line and electrode was produced with use of a PET film 140 mm×140 mm×50 μm in thickness. The obtained substrate was observed with an optical microscope, and the electrode formability was evaluated according to the following criteria based on the accuracy with respect to a design value of the inter-electrode distance of 20 μm as an index.

A (acceptable): The inter-electrode distance is 16 to 24 μm.

B (failure): The inter-electrode distance is less than 16 μm or more than 24 μm.

<Method for Evaluating Bending Resistance of Antenna Substrate or Antenna Substrate with Wiring Line and Electrode>

Figure 17A:
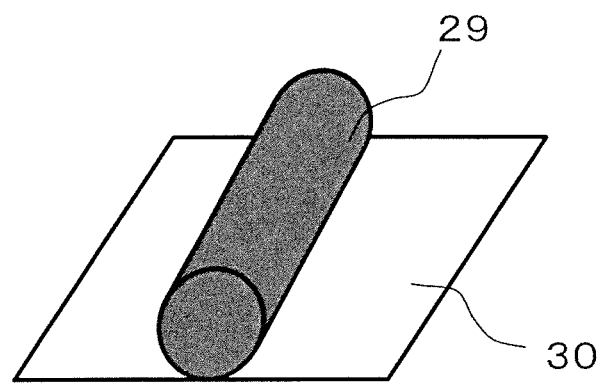
FIG. 17A is a schematic perspective view in the evaluation of the bending resistance of an antenna substrate or an antenna substrate with wiring line and electrode.
Figure 17B:
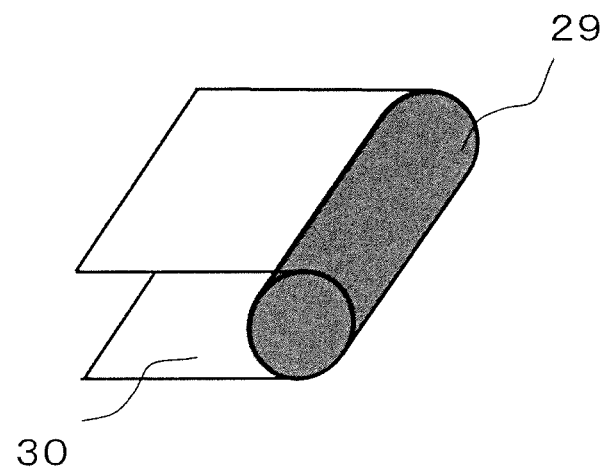
FIG. 17B is a schematic perspective view in the evaluation of the bending resistance of an antenna substrate or an antenna substrate with wiring line and electrode.

The method will be described with reference to FIGS. 17A and 17B. At the center of a surface of an antenna substrate 30 or an antenna substrate 30 with wiring line and electrode having an antenna thereon, a metal cylinder 29 having a diameter of 30 mm was fixed. The substrate was placed in contact with the cylinder in such a manner that the winding angle around the cylinder was 0° (i.e., a state where the sample was flat) (see FIG. 17A), and then the substrate was bent in the range in which the winding angle around the cylinder was 180° (i.e., a state where the substrate was folded back on the cylinder) (see FIG. 17B). The antenna, the connected part between the antenna and the wiring line, and the connected part between the wiring lines before and after the bending operation were observed with an optical microscope, and the bending resistance was evaluated according to the following criteria based on the presence or absence of peeling and presence or absence of disconnection.

A (very good): No peeling or disconnection is observed even after the bending operation is repeated 500 times.

B (good): No peeling or disconnection is observed even after the bending operation is repeated 300 times.

C (acceptable): No peeling or disconnection is observed even after the bending operation is repeated 100 times.

D (failure): Peeling or disconnection is observed after the bending operation is repeated less than 100 times.

<Voltage Difference Between Antenna and Wiring Line>

The voltages ($V_A$ and $V_L$) of the current flowing through the antenna and the wiring line, respectively, were measured with a digital oscilloscope (trade name, InfiniiVision DSO-X 6002A manufactured by KEYSIGHT Technology), and $V_L/V_A$ was taken as the voltage difference.

Synthetic Example 1

Compound P1 (Polymerizable Component: Polymer Having Polymerizable Unsaturated Group)

Copolymerization ratio (by mass): ethyl acrylate (hereinafter referred to as "EA")/2-ethylhexyl methacrylate (hereinafter referred to as "2-EHMA")/styrene (hereinafter referred to as "St")/glycidyl methacrylate (hereinafter referred to as "GMA")/acrylic acid (hereinafter referred to as "AA")=20/40/20/5/15.

Diethylene glycol monoethyl ether acetate (hereinafter referred to as "DMEA") (150 g) was charged into a reaction vessel in a nitrogen atmosphere, and the reaction vessel was heated to 80° C. in an oil bath. A mixture of EA (20 g), 2-EHMA (40 g), St (20 g), AA (15 g), 2,2'-azobisisobutyronitrile (0.8 g), and DMEA (10 g) was added dropwise thereto over 1 hour. After the completion of the dropwise addition, the polymerization reaction was carried out for additional 6 hours. Then, hydroquinone monomethyl ether (1 g) was added to the resultant mixture to terminate the polymerization reaction. Then, a mixture of GMA (5 g), triethylbenzylammonium chloride (1 g), and DMEA (10 g) was added dropwise over 0.5 hours. After the completion of the dropwise addition, the addition reaction was carried out for additional 2 hours. The resultant reaction solution was purified with methanol to remove unreacted impurities, and then the resultant product was dried under vacuum for 24 hours to produce a compound P1.

Synthetic Example 2

Compound P2 (Polymerizable Component: Polymer Having Polymerizable Unsaturated Group)

Copolymerization ratio (by mass): a bifunctional epoxy acrylate monomer (epoxy ester 3002A; manufactured by Kyoeisha Chemical Co., Ltd.)/a bifunctional epoxy acrylate monomer (epoxy ester 70PA; manufactured by Kyoeisha Chemical Co., Ltd.)/GMA/St/AA=20/40/5/20/15.

Diethylene glycol monoethyl ether acetate (hereinafter referred to as "DMEA") (150 g) was charged into a reaction vessel in a nitrogen atmosphere, and the reaction vessel was heated to 80° C. in an oil bath. To the mixture, a mixture of epoxy ester 3002A (20 g), epoxy ester 70PA (40 g), St (20 g), AA (15 g), 2,2'-azobisisobutyronitrile (0.8 g), and DMEA (10 g) was added dropwise over 1 hour. After the completion of the dropwise addition, the polymerization reaction was carried out for additional 6 hours. Then, hydroquinone monomethyl ether (1 g) was added to the resultant mixture to terminate the polymerization reaction. Then, a mixture of GMA (5 g), triethylbenzylammonium chloride (1 g), and DMEA (10 g) was added dropwise over 0.5 hours. After the completion of the dropwise addition, the addition reaction was carried out for additional 2 hours. The resultant reaction solution was purified with methanol to remove unreacted impurities, and then the resultant product was dried under vacuum for 24 hours to produce a compound P2.

Synthetic Example 3

Compound P3 (Polymerizable Component: Polymer Having Polymerizable Unsaturated Group)

Urethane-Modified Compound of Compound P2

Diethylene glycol monoethyl ether acetate (hereinafter referred to as "DMEA") (100 g) was charged into a reaction vessel in a nitrogen atmosphere, and the reaction vessel was heated to 80° C. in an oil bath. To the mixture, a mixture of the photosensitive component P2 (10 g), n-hexyl isocyanate (3.5 g), and DMEA (10 g) was added dropwise over 1 hour. After the completion of the dropwise addition, the reaction was carried out for additional 3 hours. The resultant reaction solution was purified with methanol to remove unreacted impurities, and then the resultant product was dried under vacuum for 24 hours to produce a compound P3 having a urethane bond.

Preparation Example 1

Photosensitive Paste A

Into a 100-ml clean bottle were charged the compound P1 (16 g), the compound P3 (4 g), a photopolymerization initiator OXE-01 (manufactured by BASF Japan Ltd.) (4 g), an acid generator SI-110 (manufactured by Sanshin Chemical Industry Co., Ltd.) (0.6 g), and γ-butyrolactone (manufactured by MITSUBISHI GAS CHEMICAL COMPANY, INC.) (10 g). These components were mixed with a planetary centrifugal vacuum mixer "Awatori Rentaro" (registered trademark) (ARE-310; manufactured by THINKY CORPORATION) to produce a photosensitive resin solution (46.6 g) (solid content: 78.5% by mass). The photosensitive resin solution (8.0 g) was mixed with Ag particles having an average particle diameter of 2 μm (42.0 g), and the resultant mixture was kneaded with a triple roller "EXAKT M-50" (trade name, manufactured by EXAKT) to produce a photosensitive paste A (50 g).

Preparation Example 2

Photosensitive Paste B

A photosensitive paste B was obtained in the same manner as in Preparation Example 1 except that Ag particles having an average particle diameter of 0.2 μm were used.

Preparation Example 3

Photosensitive Paste C

A photosensitive paste C was obtained in the same manner as in Preparation Example 2 except that the compound P1 (20 g) was used and the compound P3 was not used.

Preparation Example 4

Photosensitive Paste D

A photosensitive paste D was obtained in the same manner as in Preparation Example 1 except that Ag particles having an average particle diameter of 0.05 μm were used.

Table 1 shows the compositions of the photosensitive pastes obtained in Preparation Examples 1 to 4.

Preparation Example 5

Semiconductor Solution A

CNTs (manufactured by CNI, single-walled CNTs, purity: 95%) (1.0 mg) were added to a solution of poly (3-hexylthiophene) (P3HT) (manufactured by Aldrich) (2.0 mg) in chloroform (10 ml), and the solution was ultrasonically stirred with an ultrasonic homogenizer (VCX-500 manufactured by TOKYO RIKAKIKAI CO, LTD.) at an output of 20% for 4 hours while being ice-cooled to produce a CNT composite dispersion A (the CNT composite concentration based on the solvent was 0.96 g/l).

Then, a semiconductor solution for forming a semiconductor layer was produced. The CNT composite dispersion A was filtered through a membrane filter (pore diameter: 10 μm, diameter: 25 mm, Omnipore membrane manufactured by Millipore) to remove the CNT composites having a length of 10 μm or more. To the filtrate, o-DCB (manufactured by Wako Pure Chemical Industries, Ltd.) (5 ml) was added, and then a low-boiling-point solvent chloroform was distilled off with a rotary evaporator to replace the solvent with o-DCB. In this way, a CNT composite dispersion B was obtained. To the CNT composite dispersion B (1 ml), o-DCB (3 mL) was added to produce a semiconductor solution A (the CNT composite concentration based on the solvent was 0.03 g/l).

Preparation Example 6

Semiconductor Solution B

A semiconductor solution B (the CNT composite concentration based on the solvent was 0.03 g/l) was produced in the same manner as in Preparation Example 5 except that the following compound [2] was used in place of P3HT.

TABLE 1

| | Photosensitive paste | Polymerizable component | Photopolymerization initiator | Conductive material (Average particle diameter) | Acid generator | Solvent |
|---|---|---|---|---|---|---|
| Preparation Example 1 | A | P1, P3 | OXE-01 | Ag (2 μm) | SI-110 | γ-Butyrolactone |
| Preparation Example 2 | B | P1, P3 | OXE-01 | Ag (0.2 μm) | SI-110 | γ-Butyrolactone |
| Preparation Example 3 | C | P1 | OXE-01 | Ag (0.2 μm) | SI-110 | γ-Butyrolactone |
| Preparation Example 4 | D | P1, P3 | OXE-01 | Ag (0.05 μm) | SI-110 | γ-Butyrolactone |

[Chemical formula 1]
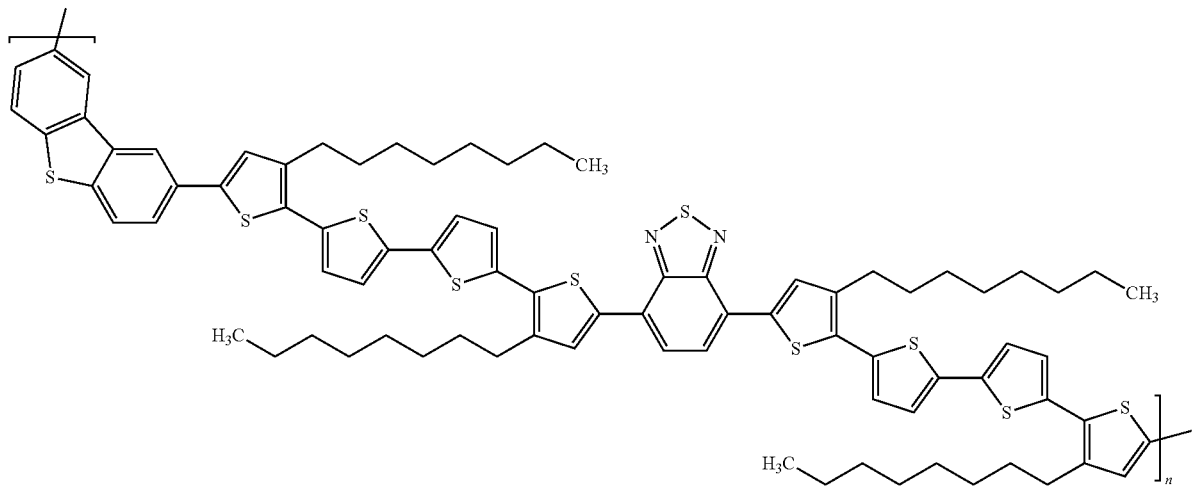
The compound [2] was synthesized according to the following formula.
[Chemical formula 2]
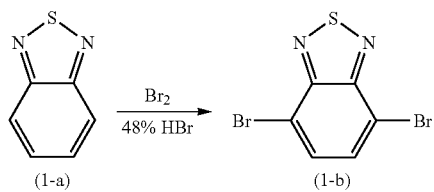
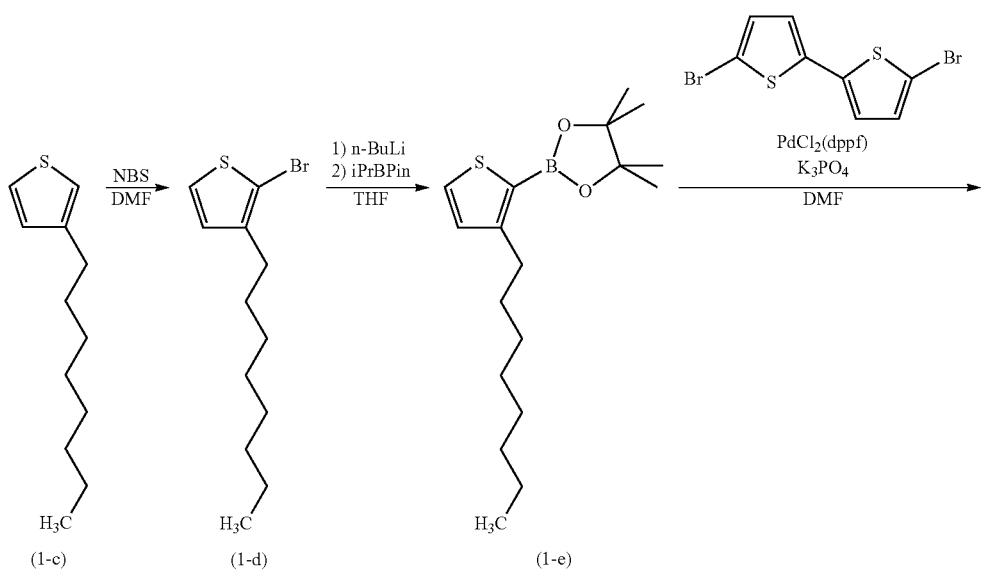

-continued
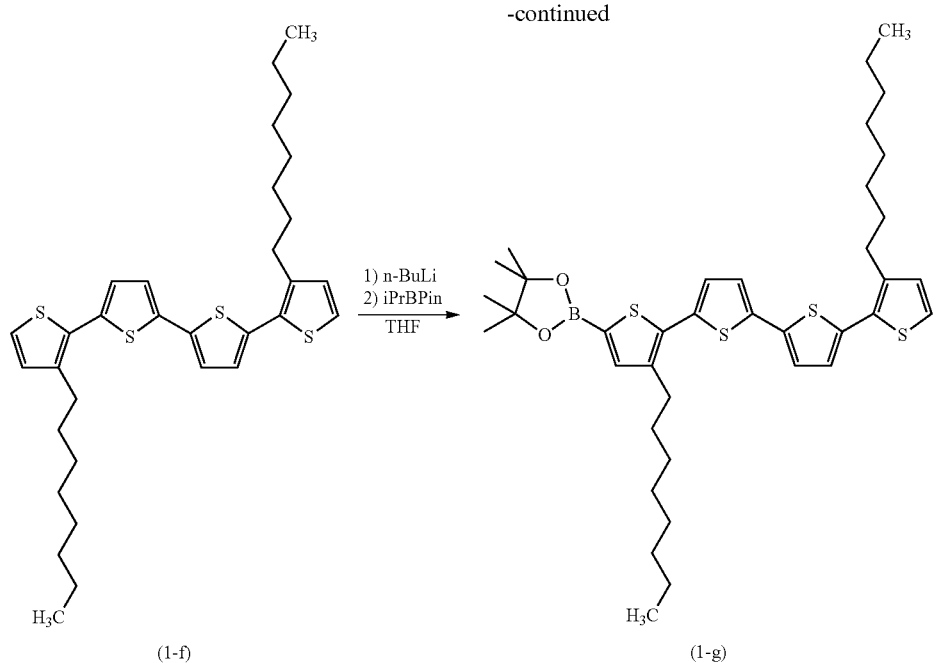
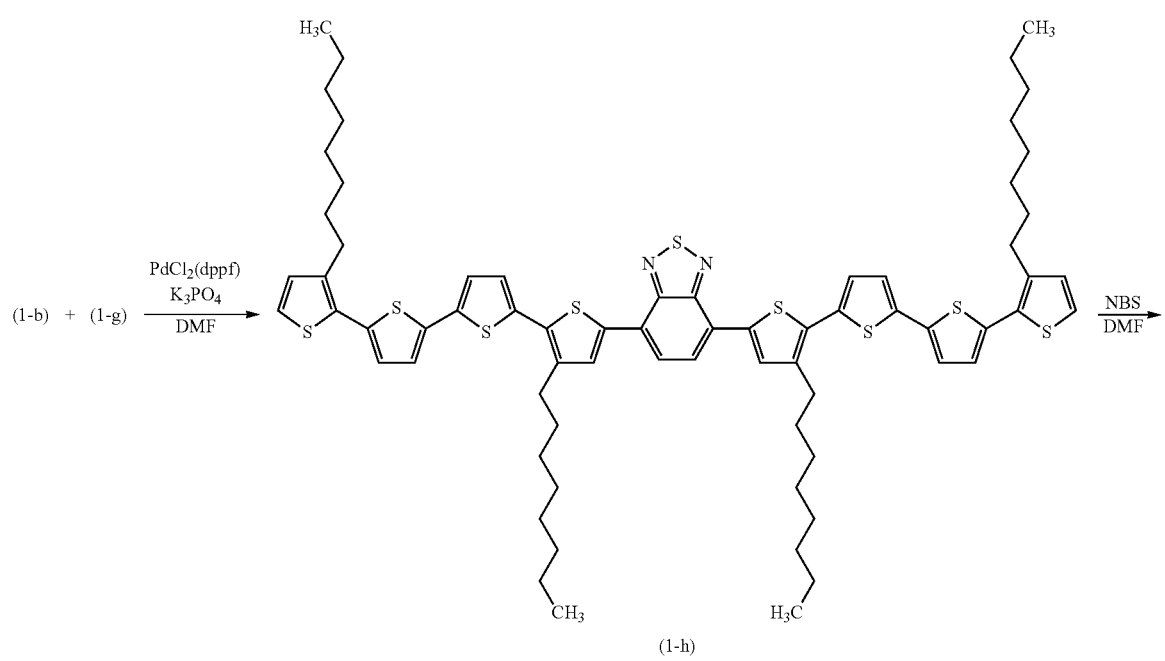

-continued

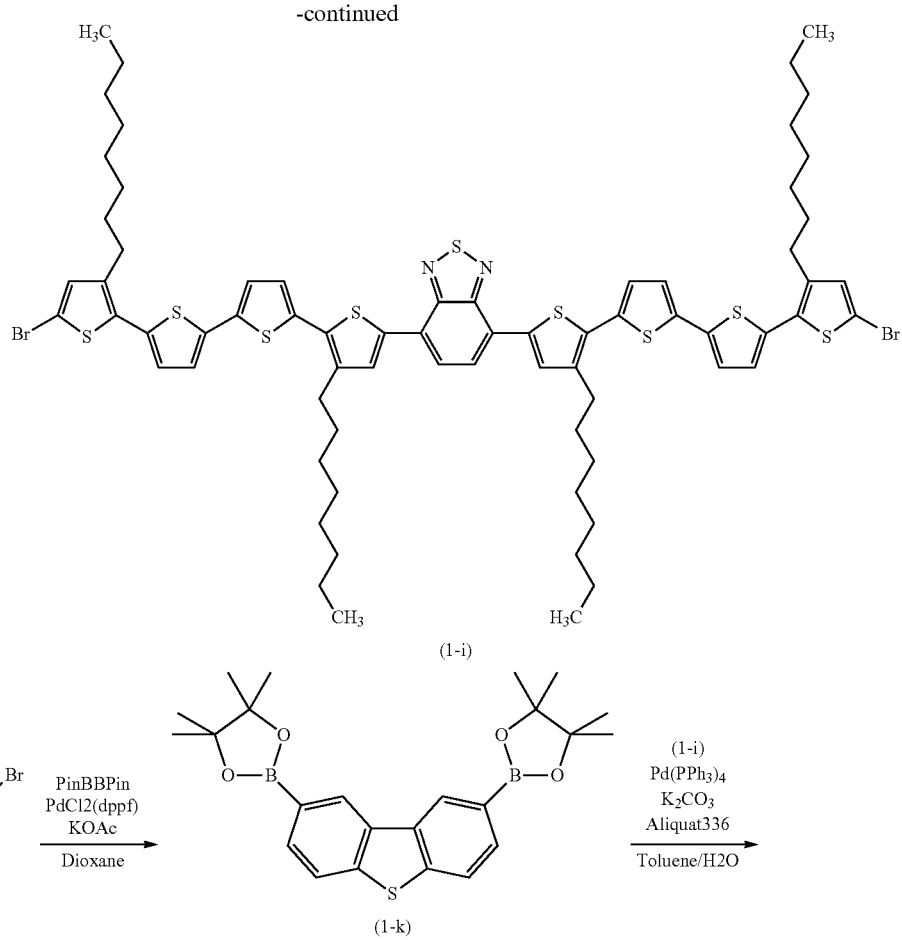

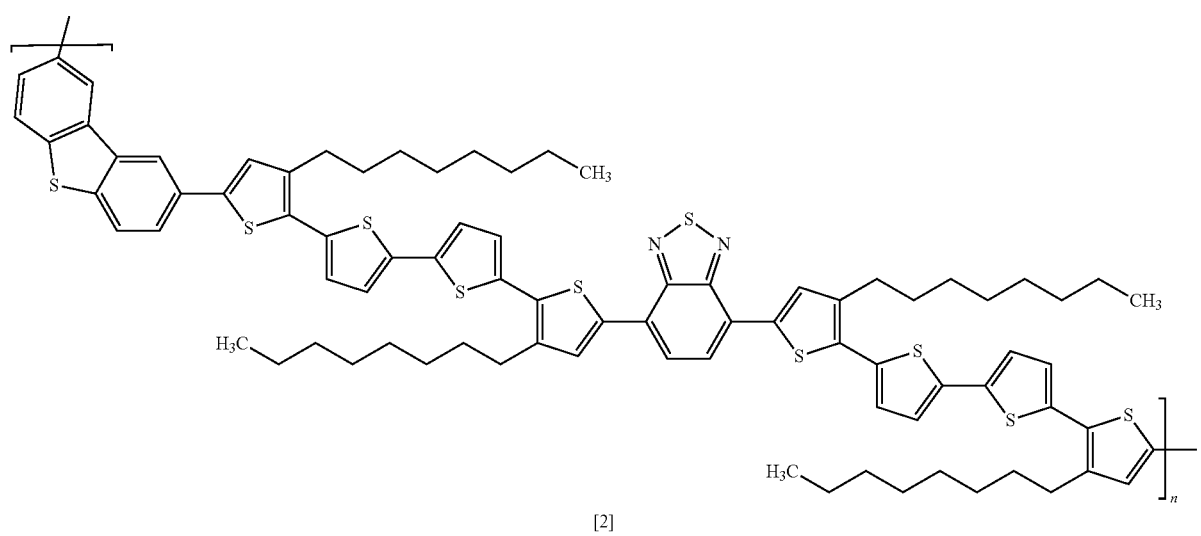

A compound (1-a) (manufactured by Tokyo Chemical Industry Co., Ltd.) (4.3 g) and bromine (manufactured by Wako Pure Chemical Industries, Ltd.) (10 g) were added to 48% hydrobromic acid (150 ml), and the resultant mixture was stirred at 120° C. for 3 hours. The reaction solution was cooled to room temperature, and the precipitated solid was filtered through a glass filter and then washed with water (1000 ml) and acetone (100 ml). The resultant solid was dried under vacuum at 60° C. to produce a compound (1-b) (6.72 g).

A compound (1-c) (10.2 g) was dissolved in dimethylformamide (100 ml), N-bromosuccinimide (manufactured by Wako Pure Chemical Industries, Ltd.) (9.24 g) was added to the solution, and then the resultant mixture was stirred at room temperature for 3 hours under a nitrogen atmosphere. Water (200 ml), n-hexane (200 ml), and dichloromethane (200 ml) were added to the resultant solution, and an organic layer was separated. The organic layer was washed with water (200 ml), and then dried over magnesium sulfate. The resultant solution was purified by column chromatography (filler: silica gel, eluting solution: hexane) to produce a compound (1-d) (14.4 g).

The compound (1-d) (14.2 g) was dissolved in tetrahydrofuran (200 ml), and the resultant solution was cooled to −80° C. n-Butyllithium (a 1.6-M solution in hexane) (manufactured by Wako Pure Chemical Industries, Ltd.) (35 ml) was added to the solution, and the resultant mixture was heated to −50° C. and then cooled to −80° C. again. 2-Isopropoxy-4,4,5,5-tetramethyl-1,3,2-dioxaborolane (manufactured by Wako Pure Chemical Industries, Ltd.) (13.6 ml) was added to the mixture, and the resultant mixture was heated to room temperature and then stirred under a nitrogen atmosphere for 4 hours. A 1-N aqueous ammonium chloride solution (200 ml) and ethyl acetate (200 ml) were added to the resultant solution, and then an organic layer was separated. The organic layer was washed with water (200 ml), and then dried over magnesium sulfate. The resultant solution was purified by column chromatography (filler: silica gel, eluting solution: hexane/dichloromethane) to produce a compound (1-e) (14.83 g).

The compound (1-e) (14.83 g) and 5,5'-dibromo-2,2'-bithiophene (manufactured by Tokyo Chemical Industry Co., Ltd.) (6.78 g) were added to dimethylformamide (200 ml), then potassium phosphate (manufactured by Wako Pure Chemical Industries, Ltd.) (26.6 g) and [bis (diphenylphosphino) ferrocene]dichloropalladium (manufactured by Aldrich) (1.7 g) were added to the mixture under a nitrogen atmosphere, and the resultant mixture was stirred at 100° C. for 4 hours. Water (500 ml) and ethyl acetate (300 ml) were added to the resultant solution, and an organic layer was separated. The organic layer was washed with water (500 ml), and then dried over magnesium sulfate. The resultant solution was purified by column chromatography (filler: silica gel, eluting solution: hexane) to produce a compound (1-f) (4.53 g).

The compound (1-f) (4.53 g) was dissolved in tetrahydrofuran (40 ml), and the resultant solution was cooled to −80° C. n-Butyllithium (a 1.6-M solution in hexane) (6.1 ml) was added to the solution, and the resultant mixture was heated to −5° C. and then cooled to −80° C. again. 2-Isopropoxy-4,4,5,5-tetramethyl-1,3,2-dioxaborolane (2.3 ml) was added to the mixture, and the resultant mixture was heated to room temperature and then stirred under a nitrogen atmosphere for 2 hours. A 1-N aqueous ammonium chloride solution (150 ml) and ethyl acetate (200 ml) were added to the resultant solution, and then an organic layer was separated. The organic layer was washed with water (200 ml), and then dried over magnesium sulfate. The resultant solution was purified by column chromatography (filler: silica gel, eluting solution: dichloromethane/hexane) to produce a compound (1-g) (2.31 g).

The compound (1-b) (0.498 g) and the compound (1-g) (2.31 g) were added to dimethylformamide (17 ml), then potassium phosphate (2.17 g) and [bis(diphenylphosphino) ferrocene]dichloropalladium (manufactured by Aldrich) (0.14 g) were added to the mixture under a nitrogen atmosphere, and the resultant mixture was stirred at 90° C. for 7 hours. Water (200 ml) and chloroform (100 ml) were added to the resultant solution, and an organic layer was separated. The organic layer was washed with water (200 ml), and then dried over magnesium sulfate. The resultant solution was purified by column chromatography (filler: silica gel, eluting solution: dichloromethane/hexane) to produce a compound (1-h) (1.29 g). The results of the analysis of the compound (1-h) by $^1$H-NMR are as follows.

$^1$H-NMR (CD$_2$Cl$_2$, (d=ppm))): 8.00 (s, 2H), 7.84 (s, 2H), 7.20-7.15 (m, 8H), 7.04 (d, 2H), 6.95 (d, 2H), 2.88 (t, 4H), 2.79 (t, 4H), 1.77-1.29 (m, 48H), 0.88 (m, 12H).

The compound (1-h) (0.734 g) was dissolved in chloroform (15 ml), then N-bromosuccinimide (0.23 g)/dimethylformamide (10 ml) were added to the solution, and the resultant mixture was stirred at room temperature for 9 hours under a nitrogen atmosphere. Water (100 ml) and chloroform (100 ml) were added to the resultant solution, and an organic layer was separated. The organic layer was washed with water (200 ml), and then dried over magnesium sulfate. The resultant solution was purified by column chromatography (filler: silica gel, eluting solution: dichloromethane/ hexane) to produce a compound (1-i) (0.58 g).

A compound (1-j) (0.5 g), bis(pinacolato)diboron (manufactured by BASF) (0.85 g), and potassium acetate (manufactured by Wako Pure Chemical Industries, Ltd.) (0.86 g) were added to 1,4-dioxane (7 ml), then [bis(diphenylphosphino)ferrocene]dichloropalladium (0.21 g) was added to the mixture under a nitrogen atmosphere, and the resultant mixture was stirred at 80° C. for 7 hours. Water (100 ml) and ethyl acetate (100 ml) were added to the resultant solution, and an organic layer was separated. The organic layer was washed with water (100 ml), and then dried over magnesium sulfate. The resultant solution was purified by column chromatography (filler: silica gel, eluting solution: dichloromethane) to produce a compound (1-k) (57 mg).

The compound (1-i) (93 mg) and the compound (1-k) (19.3 mg) were dissolved in toluene (6 ml). Water (2 ml), potassium carbonate (0.18 g), tetrakis(triphenylphosphine) palladium(0) (manufactured by Tokyo Chemical Industry Co., Ltd.) (7.7 mg), and Aliquat (R) 336 (manufactured by Aldrich) (1 drop) were added to the resultant solution, and the resultant mixture was stirred at 100° C. for 25 hours under a nitrogen atmosphere. Then, phenylboronic acid (40 mg) was added to the mixture, and the resultant mixture was stirred at 100° C. for 7 hours. Methanol (50 ml) was added to the resultant solution to produce a solid, and the solid was collected by filtration and then washed with methanol, water, methanol, and acetone in this order. The resultant solid was dissolved in chloroform, and the solution was allowed to pass through a silica gel short column (eluting solution: chloroform) and then concentrated to dryness to produce the compound [2] (30 mg). The compound [2] had a weight average molecular weight of 4367, a number average molecular weight of 3475, and a degree of polymerization n of 3.1.

Preparation Example 7

Insulating Layer Solution A

Methyltrimethoxysilane (61.29 g, 0.45 mol), β-(3,4-epoxycyclohexyl)ethyltrimethoxysilane (12.31 g, 0.05 mol), and phenyltrimethoxysilane (99.15 g, 0.5 mol) were dissolved in propylene glycol monobutyl ether (boiling point: 170° C.) (203.36 g), and then water (54.90 g) and phosphoric acid (0.864 g) were added to the resultant solution with stirring. The resultant solution was heated at a bath temperature of 105° C. for 2 hours to increase the internal temperature to 90° C., so that a component mainly containing the by-produced methanol was distilled out. Then, the solution was heated at a bath temperature of 130° C. for 2.0 hours to increase the internal temperature to 118° C., so that a component mainly containing water and propylene glycol monobutyl ether was distilled out. Then, the solution was cooled to room temperature to produce an insulating layer solution A having a solid content concentration of 26.0% by mass.

Preparation Example 8

Insulating Layer Solution B

An aliquot (10 g) of the insulating layer solution A was weighted, and bis(ethylacetylacetate)mono(2,4-pentanedionato) aluminum (trade name: "Alumichelate D", manufactured by Kawaken Fine Chemicals Co., Ltd., hereinafter referred to as "Alumichelate D") (13 g) and propylene glycol monoethyl ether acetate (hereinafter referred to as "PGMEA") (42 g) were mixed with the insulating layer solution A. The resultant mixture was stirred at room temperature for 2 hours to produce an insulating layer solution B (solid content concentration: 24% by mass). The content of the polysiloxane in the solution was 20 parts by mass based on 100 parts by mass of Alumichelate D.

Example 1

Figure 15:
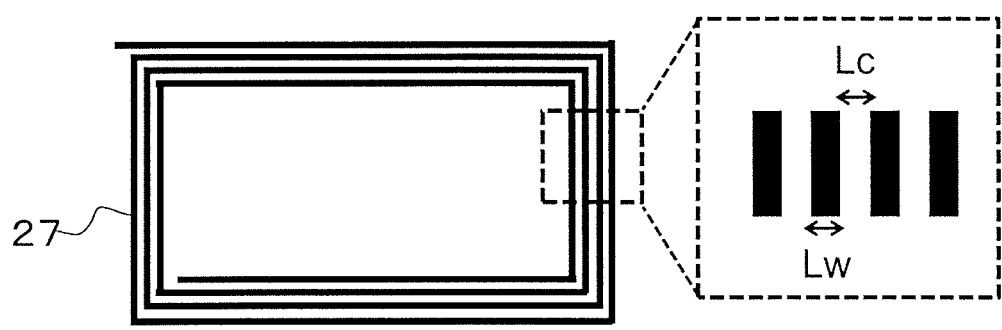
FIG. 15 is a drawing for illustrating a shape of the antenna substrate according to an embodiment of the present invention.

The photosensitive paste A was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form an antenna substrate having an antenna 27 having the shape as shown in FIG. 15. The production conditions are shown in Table 2. The obtained antenna substrate was evaluated for the antenna formability and bending resistance. The evaluation results are shown in Table 3.

Examples 2 to 5

An antenna substrate was produced in the same manner as in Example 1 under the production conditions shown in Table 2. The obtained antenna substrate was evaluated for the antenna formability and bending resistance. The evaluation results are shown in Table 3.

Example 6

Figure 16:
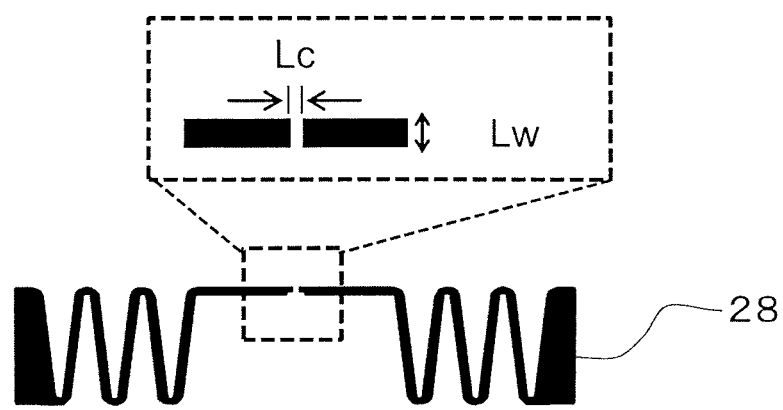
FIG. 16 is a drawing for illustrating a shape of the antenna substrate according to an embodiment of the present invention.

The photosensitive paste A was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form an antenna substrate having an antenna 28 having the shape as shown in FIG. 16. The production conditions are shown in Table 2. The obtained antenna substrate was evaluated for the antenna formability and bending resistance. The evaluation results are shown in Table 3.

Examples 7 and 8

An antenna substrate was produced in the same manner as in Example 6 under the production conditions shown in Table 2. The obtained antenna substrate was evaluated for the antenna formability and bending resistance. The evaluation results are shown in Table 3.

Example 9

Figure 18:
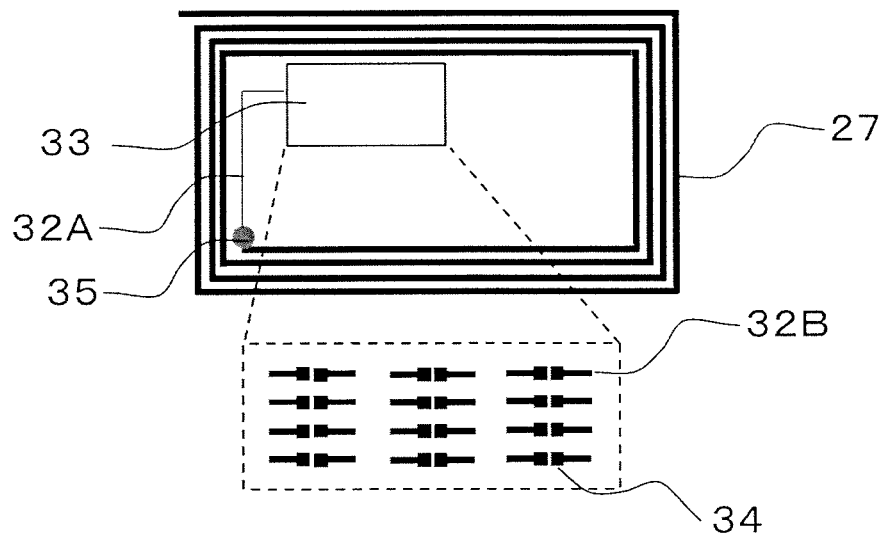
FIG. 18 is a drawing for illustrating a shape of the antenna substrate with wiring line and electrode according to an embodiment of the present invention.

The photosensitive paste B was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm) through a photomask having a mask pattern corresponding to an antenna and a mask pattern corresponding to a wiring line that are not joined together, and developed by immersion in a 0.5% Na$_2$CO$_3$ solution for 30 seconds. Then, the product was rinsed with ultrapure water, and cured in a drying oven at 140° C. for 30 minutes to form an antenna substrate with wiring line and electrode having an antenna 27, a wiring line 32A, and a wiring line/an electrode 33 each having the shape as shown in FIG. 18. The production conditions are shown in Table 2. Incidentally, electrodes 34 to which each of wiring lines 32B is connected face the wiring line/electrode 33 at a predetermined interval, and the design value of the size of the electrodes was 100×100 μm, and the design value of the distance between the electrodes was 20 μm. The wiring line 32A extending from the wiring line/electrode 33 and the antenna 27 do not form a continuous phase but are formed with a gap of 1 mm therebetween, and the wiring line 32A and the antenna 27 were connected to each other with an indium conductive paste film 35. The obtained antenna substrate with wiring line and electrode was evaluated for the antenna formability, electrode formability, bending resistance, and voltage difference between the antenna 27 and the wiring line 32A. The evaluation results are shown in Table 3.

Example 10

Figure 19:
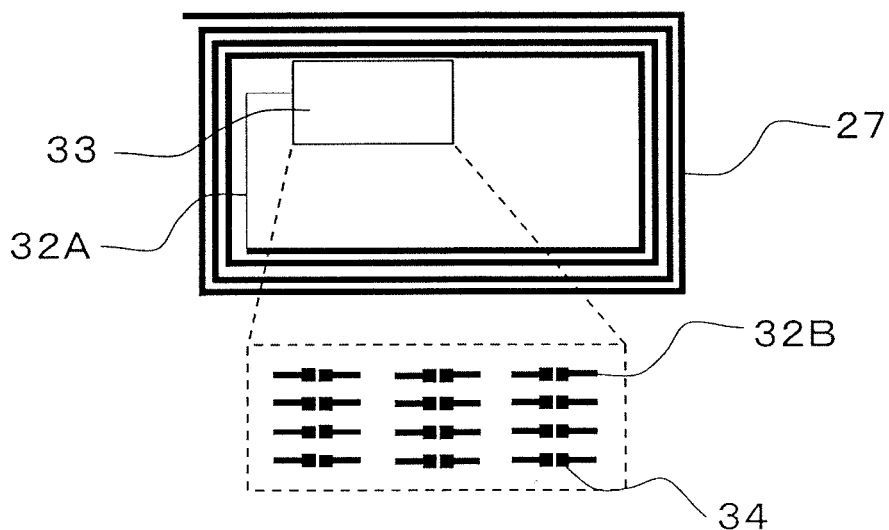
FIG. 19 is a drawing for illustrating a shape of the antenna substrate with wiring line and electrode according to an embodiment of the present invention.

The photosensitive paste B was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm) through a photomask having a mask pattern corresponding to an antenna and a mask pattern corresponding to a wiring line that are joined together, and developed by immersion in a 0.5% Na$_2$CO$_3$ solution for 30 seconds. Then, the product was rinsed with ultrapure water, and cured in a drying oven at 140° C. for 30 minutes to form an antenna substrate with wiring line and electrode having an antenna 27, a wiring line 32A, and a wiring line/an electrode 33 each having the shape as shown in FIG. 19. The production conditions are shown in Table 2. Although the wiring line/electrode 33 was designed in the same manner as in Example 9, the wiring line 32A extending from the wiring line/electrode 33 and the antenna 27 formed a continuous layer. The obtained antenna substrate with wiring line and electrode was evaluated for the antenna formability, electrode formability, bending resistance, and voltage difference between the antenna 27 and the wiring line 32A. The evaluation results are shown in Table 3.

Example 11

Figure 20:
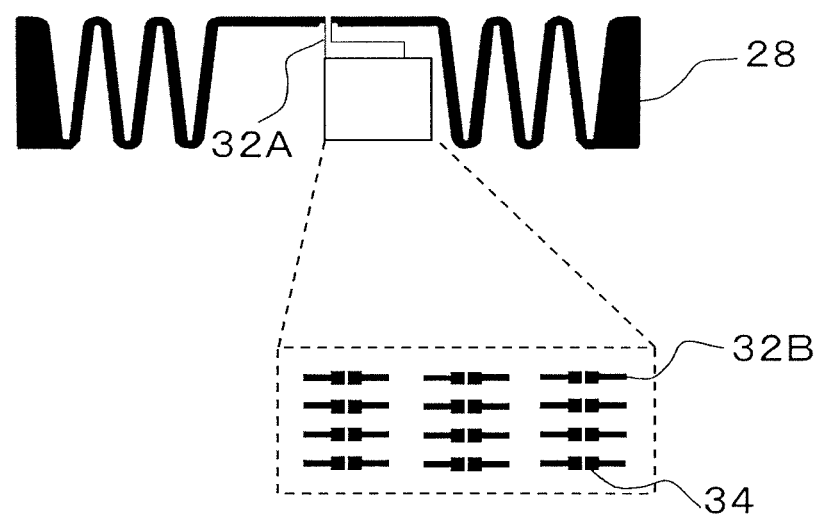
FIG. 20 is a drawing for illustrating a shape of the antenna substrate with wiring line and electrode according to an embodiment of the present invention.

An antenna substrate with wiring line and electrode shown in FIG. 20 was produced in the same manner as in Example 10 under the production conditions shown in Table 2. The obtained antenna substrate with wiring line and electrode was evaluated for the antenna formability, bending resistance, and voltage difference between the antenna 28 and the wiring line 32A. The evaluation results are shown in Table 3.

Example 12

Figure 21A:
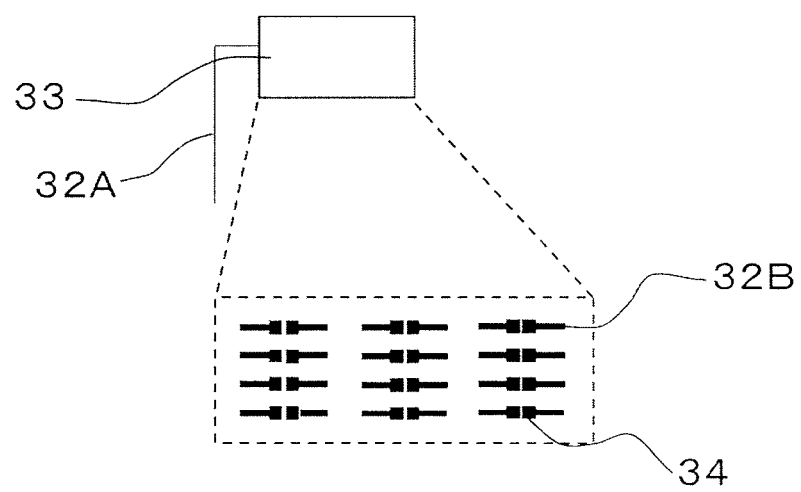
FIG. 21A is a drawing for illustrating a shape of the antenna substrate with wiring line and electrode according to an embodiment of the present invention.
Figure 21B:
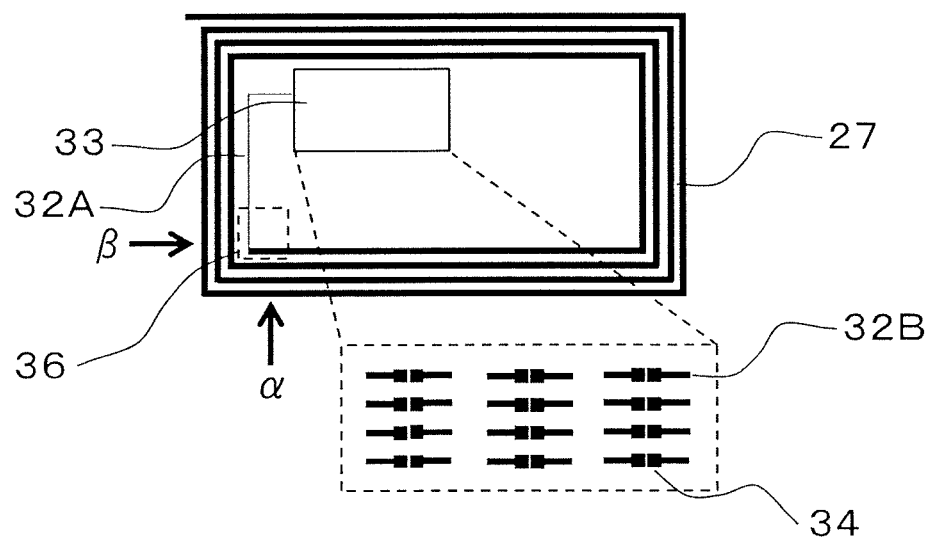
FIG. 21B is a drawing for illustrating a shape of the antenna substrate with wiring line and electrode according to an embodiment of the present invention.
Figure 21C:
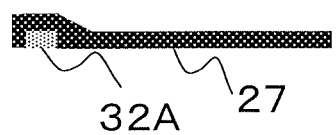
FIG. 21C is a drawing for illustrating a cross-sectional shape of a connected part between the antenna and the wiring line of the antenna substrate with wiring line and electrode according to an embodiment of the present invention.
Figure 21D:
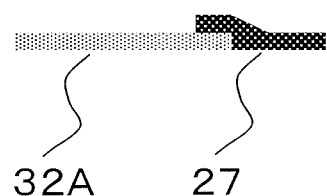
FIG. 21D is a drawing for illustrating a cross-sectional shape of a connected part between the antenna and the wiring line of the antenna substrate with wiring line and electrode according to an embodiment of the present invention.

The photosensitive paste A was applied to a PET film having a thickness of 50 µm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A and a wiring line/an electrode 33 shown in FIG. 21A. In this manner, a substrate with wiring line and electrode was produced. Then, the photosensitive paste A was applied to the substrate with wiring line and electrode by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form an antenna 27. In this manner, an antenna substrate with wiring line and electrode shown in FIG. 21B was produced. The production conditions are shown in Table 2. The cross-sectional structures of a connected part 36 between the antenna 27 and the wiring line 32A as viewed from the directions of arrows α and β in FIG. 21B are shown in FIGS. 21C and 21D, respectively. As shown in FIGS. 21C and 21D, the antenna 27 and the wiring line 32A overlap, and in FIGS. 21C and 21D, the overlapping widths of the antenna 27 and the wiring line 32A are 50 µm and 100 µm, respectively. The obtained antenna substrate with wiring line and electrode was evaluated for the antenna formability, electrode formability, bending resistance, and voltage difference between the antenna 27 and the wiring line 32A. The evaluation results are shown in Table 2.

Example 13

An antenna substrate with wiring line and electrode was produced in the same manner as in Example 12 except that the photosensitive paste B was used for forming the wiring line 32A and the wiring line/electrode 33. The obtained antenna substrate with wiring line and electrode was evaluated for the antenna formability, electrode formability, bending resistance, and voltage difference between the antenna 27 and the wiring line 32A. The evaluation results are shown in Table 3.

Example 14

Figure 22A:
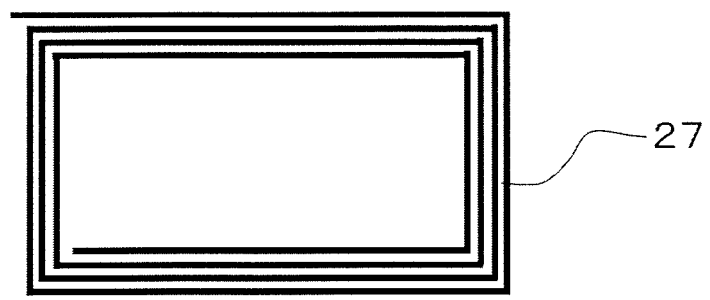
FIG. 22A is a drawing for illustrating a shape of the antenna substrate with wiring line and electrode according to an embodiment of the present invention.
Figure 22B:
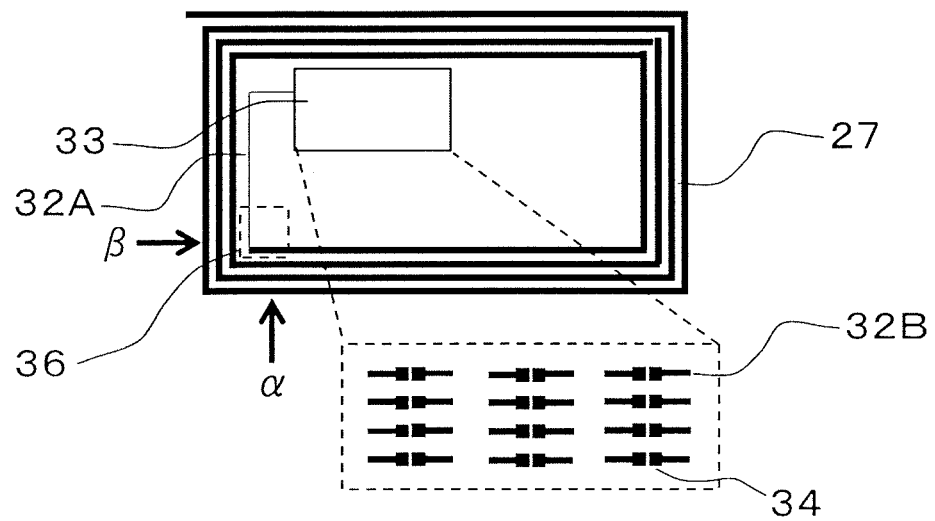
FIG. 22B is a drawing for illustrating a shape of the antenna substrate with wiring line and electrode according to an embodiment of the present invention.
Figure 22C:
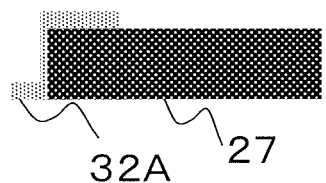
FIG. 22C is a drawing for illustrating a cross-sectional shape of the connected part between the antenna and the wiring line of the antenna substrate with wiring line and electrode according to an embodiment of the present invention.
Figure 22D:
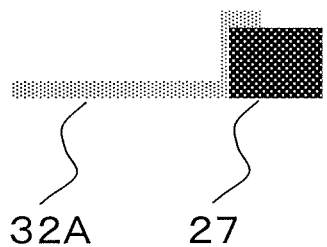
FIG. 22D is a drawing for illustrating a cross-sectional shape of the connected part between the antenna and the wiring line of the antenna substrate with wiring line and electrode according to an embodiment of the present invention.

The photosensitive paste A was applied to a PET film having a thickness of 50 µm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form an antenna 27. In this manner, an antenna substrate shown in FIG. 22A was produced. Then, the photosensitive paste B was applied to the antenna substrate by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A and a wiring line/an electrode 33. In this manner, an antenna substrate with wiring line and electrode shown in FIG. 22B was produced. The production conditions are shown in Table 2. The cross-sectional structures of a connected part 36 between the antenna 27 and the wiring line 32A as viewed from the directions of arrows α and β in FIG. 22B are shown in FIGS. 22C and 22D, respectively. As shown in FIGS. 22C and 22D, the antenna 27 and the wiring line 32A overlap, and in FIGS. 22C and 22D, the overlapping widths of the antenna 27 and the wiring line 32A are 100 µm and 100 µm, respectively. The obtained antenna substrate with wiring line and electrode was evaluated for the antenna formability, electrode formability, bending resistance, and voltage difference between the antenna 27 and the wiring line 32A. The evaluation results are shown in Table 3.

Examples 15 to 17

An antenna substrate with wiring line and electrode was produced in the same manner as in Example 10 under the production conditions shown in Table 2. The obtained antenna substrate with wiring line and electrode was evaluated for the antenna formability, electrode formability, bending resistance, and voltage difference between the antenna 27 and the wiring line 32A. The evaluation results are shown in Table 3.

Examples 18 to 20

An antenna substrate with wiring line and electrode was produced in the same manner as in Example 12 except that the photosensitive paste D was used for forming the wiring line 32A and the wiring line/electrode 33 and, the photosensitive paste D was applied with an inkjet apparatus (manufactured by Cluster Technology Co., Ltd.) under the production conditions shown in Table 2. In the cross-sectional structures as viewed from the directions of arrows α and β, the overlapping widths of the antenna 27 and the wiring line 32A are 10 µm and 100 µm, respectively. The obtained antenna substrate with wiring line and electrode was evaluated for the antenna formability, electrode formability, bending resistance, and voltage difference between the antenna 27 and the wiring line 32A. The evaluation results are shown in Table 3.

Example 21

Figure 23A:
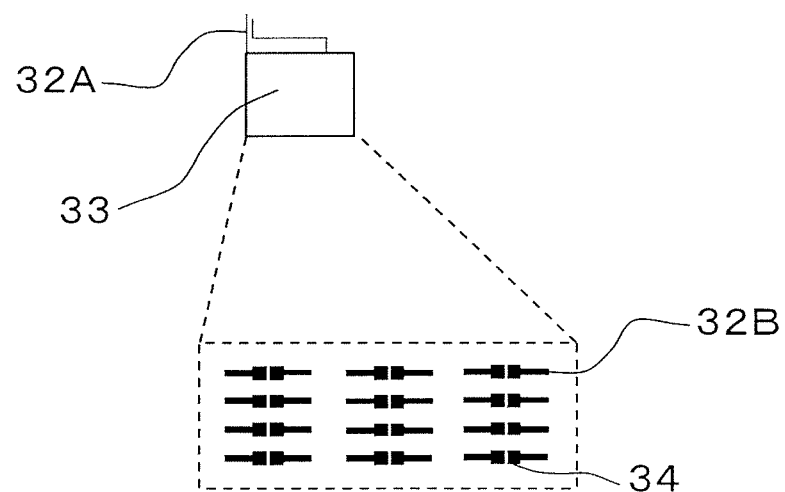
FIG. 23A is a drawing for illustrating a shape of the antenna substrate with wiring line and electrode according to an embodiment of the present invention.
Figure 23B:
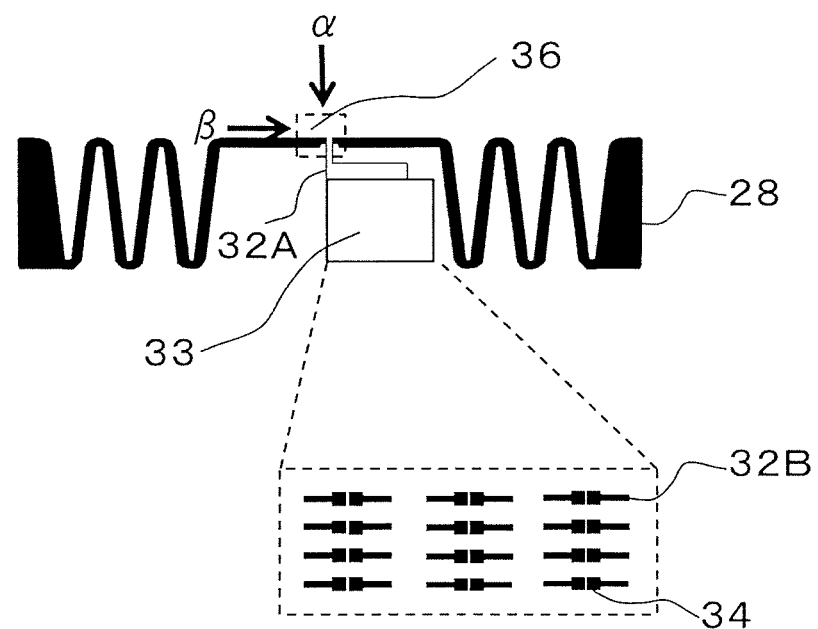
FIG. 23B is a drawing for illustrating a shape of the antenna substrate with wiring line and electrode according to an embodiment of the present invention.
Figure 23C:
FIG. 23C is a drawing for illustrating a cross-sectional shape of the connected part between the antenna and the wiring line of the antenna substrate with wiring line and electrode according to an embodiment of the present invention.
Figure 23D:
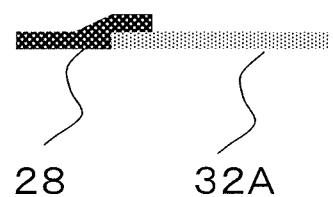
FIG. 23D is a drawing for illustrating a cross-sectional shape of the connected part between the antenna and the wiring line of the antenna substrate with wiring line and electrode according to an embodiment of the present invention.

The photosensitive paste D was applied to a PET film having a thickness of 50 μm with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form a wiring line 32A and a wiring line/an electrode 33 shown in FIG. 23A. In this manner, a substrate with wiring line and electrode was produced. Then, the photosensitive paste A was applied to the substrate with wiring line and electrode by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form an antenna 28. In this manner, an antenna substrate with wiring line and electrode shown in FIG. 23B was produced. The production conditions are shown in Table 2. The cross-sectional structures of a connected part 36 between the antenna 28 and the wiring line 32A as viewed from the directions of arrows α and β in FIG. 23B are shown in FIGS. 23C and 23D, respectively. As shown in FIGS. 23C and 23D, the antenna 28 and the wiring line 32A overlap, and in FIGS. 23C and 23D, the overlapping widths of the antenna 28 and the wiring line 32A are 10 μm and 100 μm, respectively. The obtained antenna substrate with wiring line and electrode was evaluated for the antenna formability, electrode formability, bending resistance, and voltage difference between the antenna 28 and the wiring line 32A. The evaluation results are shown in Table 3.

Example 22

An antenna substrate with wiring line and electrode was produced in the same manner as in Example 14 except that the photosensitive paste D was used for forming the wiring line 32A and the wiring line/electrode 33 and the photosensitive paste D was applied with an inkjet apparatus (manufactured by Cluster Technology Co., Ltd.) under the production conditions shown in Table 2. In the cross-sectional structures as viewed from the directions of arrows α and β, the overlapping widths of the antenna 27 and the wiring line 32A are 100 μm and 100 μm, respectively. The obtained antenna substrate with wiring line and electrode was evaluated for the antenna formability, electrode formability, bending resistance, and voltage difference between the antenna 27 and the wiring line 32A. The evaluation results are shown in Table 3.

Example 23

Figure 24A:
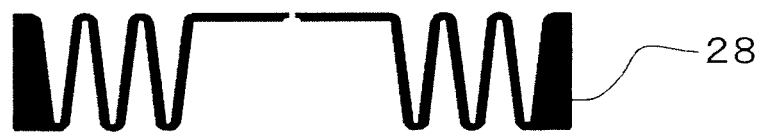
FIG. 24A is a drawing for illustrating a shape of the antenna substrate with wiring line and electrode according to an embodiment of the present invention.
Figure 24B:
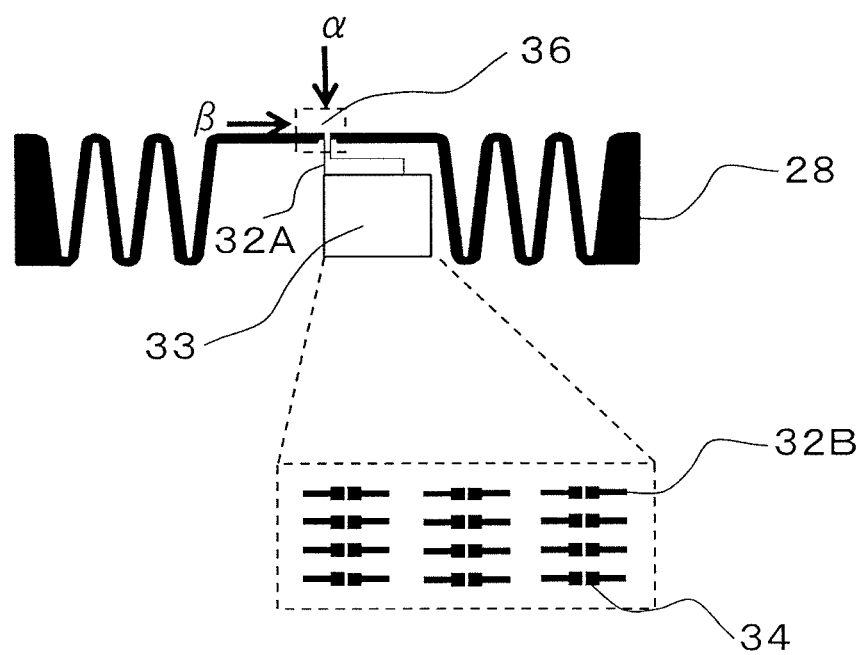
FIG. 24B is a drawing for illustrating a shape of the antenna substrate with wiring line and electrode according to an embodiment of the present invention.
Figure 24C:
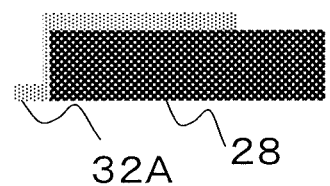
FIG. 24C is a drawing for illustrating a cross-sectional shape of the connected part between the antenna and the wiring line of the antenna substrate with wiring line and electrode according to an embodiment of the present invention.
Figure 24D:
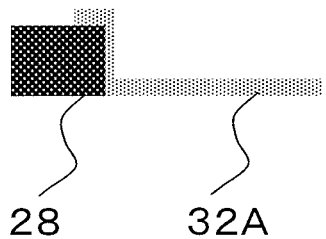
FIG. 24D is a drawing for illustrating a cross-sectional shape of the connected part between the antenna and the wiring line of the antenna substrate with wiring line and electrode according to an embodiment of the present invention.

The photosensitive paste A was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form an antenna 28. In this manner, an antenna substrate shown in FIG. 24A was produced. Then, the photosensitive paste D was applied to the antenna substrate with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form a wiring line 32A and a wiring line/an electrode 33. In this manner, an antenna substrate with wiring line and electrode shown in FIG. 24B was produced. The production conditions are shown in Table 2. The cross-sectional structures of a connected part 36 between the antenna 28 and the wiring line 32A as viewed from the directions of arrows α and β in FIG. 24B are shown in FIGS. 24C and 24D, respectively. As shown in FIGS. 24C and 24D, the antenna 28 and the wiring line 32A overlap, and in FIGS. 24C and 24D, the overlapping widths of the antenna 28 and the wiring line 32A are 100 μm and 100 μm, respectively. The obtained antenna substrate with wiring line and electrode was evaluated for the antenna formability, electrode formability, bending resistance, and voltage difference between the antenna 28 and the wiring line 32A. The evaluation results are shown in Table 3.

Example 24

Figure 25A:
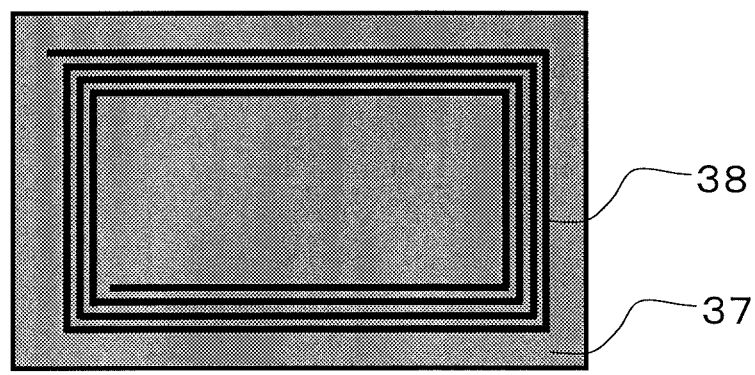
FIG. 25A is a drawing for illustrating a shape of the antenna substrate with wiring line and electrode according to an embodiment of the present invention.
Figure 25B:
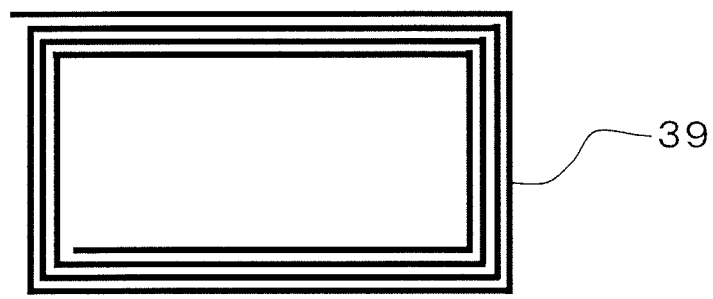
FIG. 25B is a drawing for illustrating a shape of the antenna substrate with wiring line and electrode according to an embodiment of the present invention.
Figure 25C:
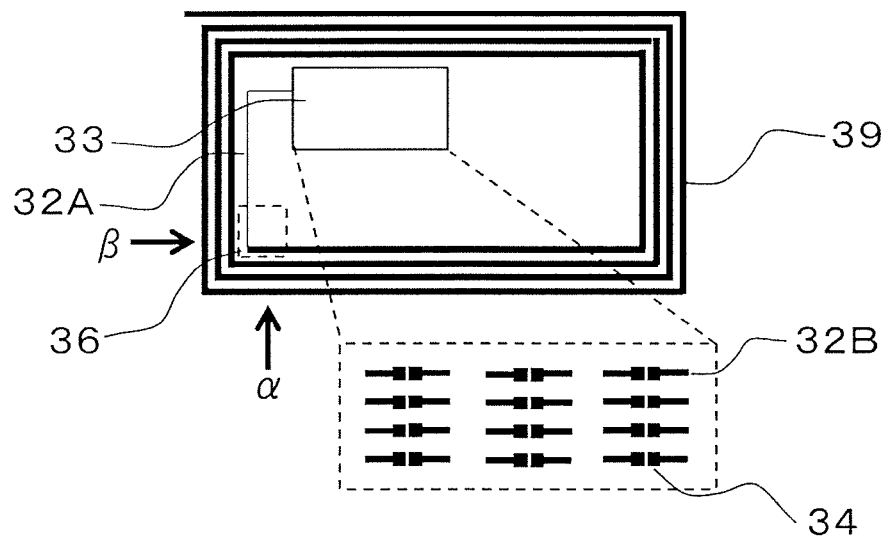
FIG. 25C is a drawing for illustrating a shape of the antenna substrate with wiring line and electrode according to an embodiment of the present invention.
Figure 25D:
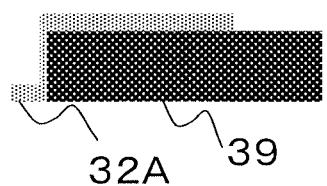
FIG. 25D is a drawing for illustrating a cross-sectional shape of the connected part between the antenna and the wiring line of the antenna substrate with wiring line and electrode according to an embodiment of the present invention.
Figure 25E:
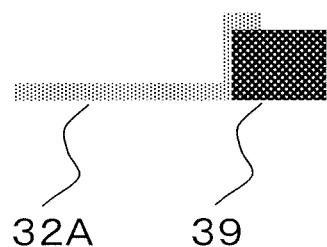
FIG. 25E is a drawing for illustrating a cross-sectional shape of the connected part between the antenna and the wiring line of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 25A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm$^2$ for 15 seconds to be cured, and thus the resist layer 38 was formed. The resultant laminate was immersed in a 35% aqueous ferric chloride solution at a temperature of 40° C. for 5 minutes to etch the aluminum foil. In this manner, an antenna 39 in accordance with a predetermined pattern was formed. The design values of the line width and the line spacing were 600 μm and 400 μm, respectively. Then, the laminate was immersed in a 1% aqueous sodium hydroxide solution at a temperature of 20° C. for 10 seconds to peel off the resist ink layer. In this manner, the antenna substrate shown in FIG. 25B was produced. The measured values of the antenna thickness, the line width, and the line spacing were 10 μm, 635 μm, and 366 μm, respectively. Then, the photosensitive paste D was applied to the antenna substrate with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A and a wiring line/an electrode 33. In this manner, an antenna substrate with wiring line and electrode shown in FIG. 25C was produced. The production conditions are shown in Table 2. The cross-sectional structures of a connected part 36 between the antenna 39 and the wiring line 32A as viewed from the directions of arrows α and β in FIG. 25C are shown in FIGS. 25D and 25E, respectively. As shown in FIGS. 25D and 25E, the antenna 39 and the wiring line 32A overlap, and in FIGS. 25D and 25E, the overlapping widths of the antenna 39 and the wiring line 32A are 100 μm and 100 μm, respectively. The obtained antenna substrate with wiring line and electrode was evaluated for the antenna formability, electrode formability, bending resistance, and voltage difference between the antenna 39 and the wiring line 32A. The evaluation results are shown in Table 3.

Example 25

Figure 26A:
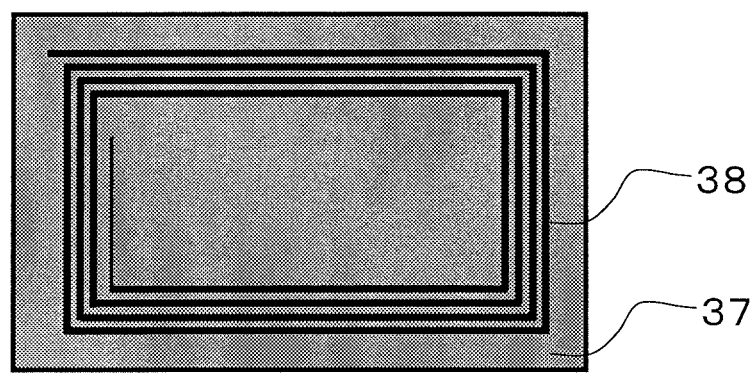
FIG. 26A is a drawing for illustrating a shape of the antenna substrate with wiring line and electrode according to an embodiment of the present invention.
Figure 26B:
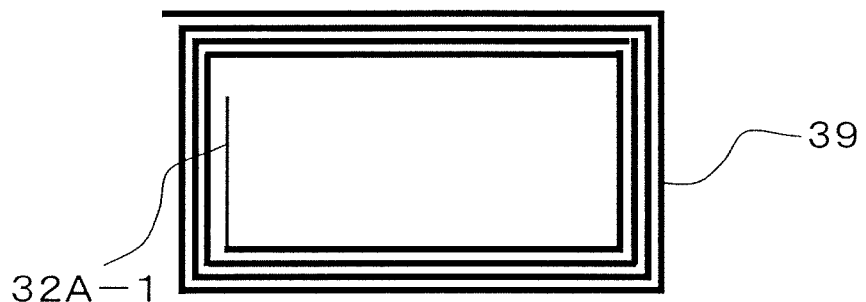
FIG. 26B is a drawing for illustrating a shape of the antenna substrate with wiring line and electrode according to an embodiment of the present invention.
Figure 26C:
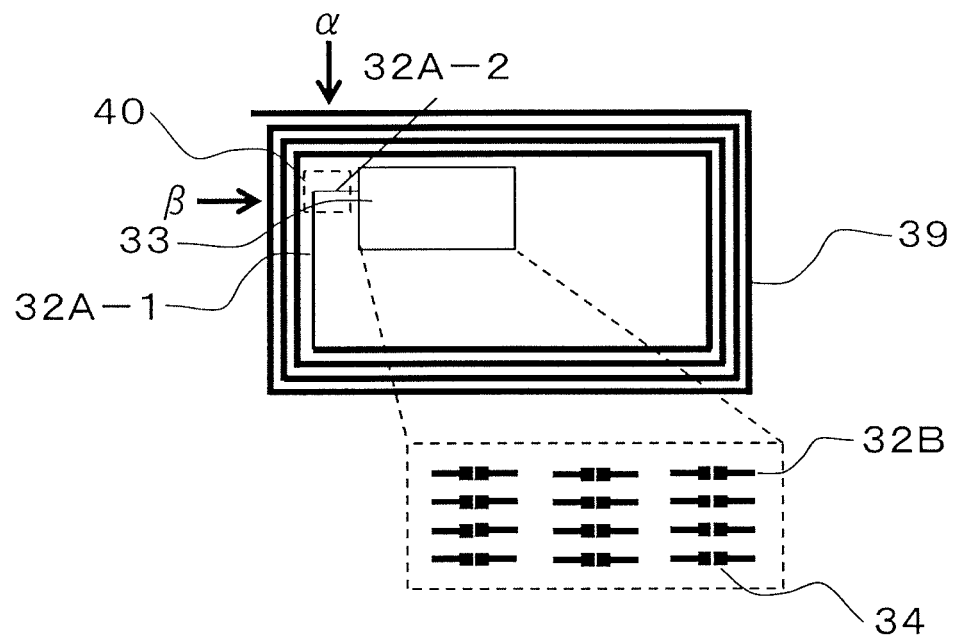
FIG. 26C is a drawing for illustrating a shape of the antenna substrate with wiring line and electrode according to an embodiment of the present invention.
Figure 26D:
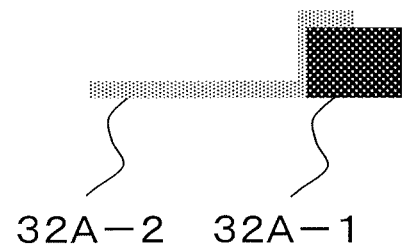
FIG. 26D is a drawing for illustrating a cross-sectional shape of the connected part between the antenna and the wiring line of the antenna substrate with wiring line and electrode according to an embodiment of the present invention.
Figure 26E:
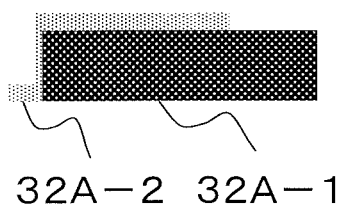
FIG. 26E is a drawing for illustrating a cross-sectional shape of the connected part between the antenna and the wiring line of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 26A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm² for 15 seconds to be cured, and thus the resist layer 38 was formed. The resultant laminate was immersed in a 35% aqueous ferric chloride solution at a temperature of 40° C. for 5 minutes to etch the aluminum foil. In this manner, an antenna 39 in accordance with a predetermined pattern and a part of the wiring line 32A (32A-1) were formed. The design values of the line width, the line spacing, and the width of the wiring line 32A-1 were 600 μm, 400 μm, and 200 μm, respectively. Then, the laminate was immersed in a 1% aqueous sodium hydroxide solution at a temperature of 20° C. for 10 seconds to peel off the resist ink layer. In this manner, an antenna substrate with wiring line shown in FIG. 26B was produced. The measured values of the antenna thickness, the line width, the line spacing, and the thickness and width of the wiring line 32A-1 were 10 μm, 634 μm, 364 μm, 10 μm, and 212 μm, respectively. Then, the photosensitive paste D was applied to the antenna substrate with wiring line with use of an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm² (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a part of the wiring line 32A (32A-2) and a wiring line/an electrode 33. In this manner, an antenna substrate with wiring line and electrode shown in FIG. 26C was produced. The production conditions are shown in Table 2. The cross-sectional structures of a connected part 40 between the wiring line 32A-1 and the wiring line 32A-2 as viewed from the directions of arrows α and β in FIG. 26C are shown in FIGS. 26D and 26E, respectively. As shown in FIGS. 26D and 26E, the wiring line 32A-1 and the wiring line 32A-2 overlap, and in FIGS. 26D and 26E, the overlapping widths of the wiring line 32A-1 and the wiring line 32A-2 are 100 μm and 100 μm, respectively. The obtained antenna substrate with wiring line and electrode was evaluated for the antenna formability, electrode formability, bending resistance, and voltage difference between the antenna 39 and the wiring line 32A-2. The evaluation results are shown in Table 3.

Example 26

Figure 27A:
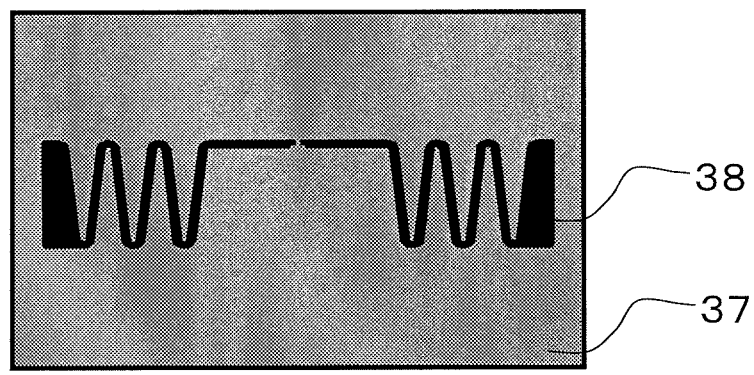
FIG. 27A is a drawing for illustrating a shape of the antenna substrate with wiring line and electrode according to an embodiment of the present invention.
Figure 27B:
FIG. 27B is a drawing for illustrating a shape of the antenna substrate with wiring line and electrode according to an embodiment of the present invention.
Figure 27C:
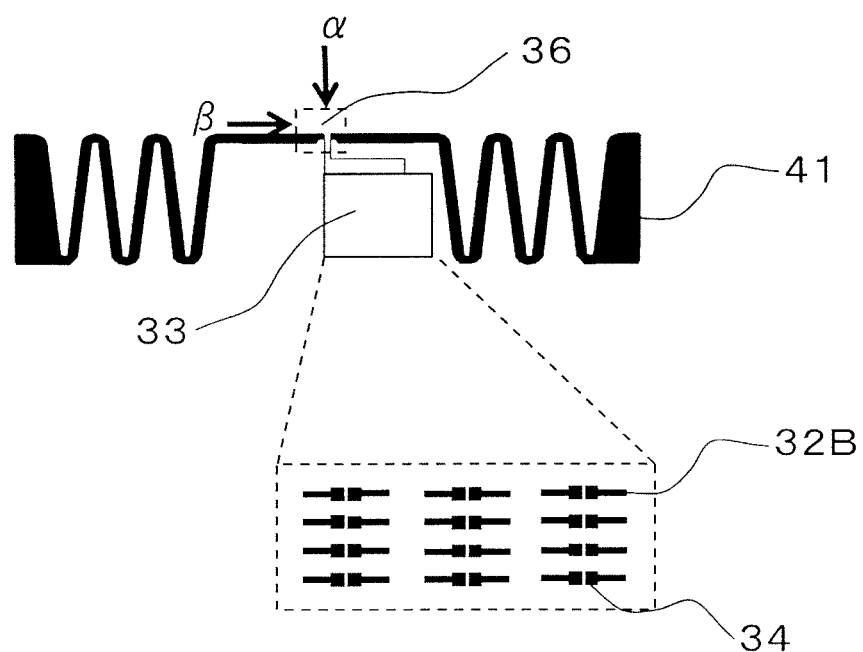
FIG. 27C is a drawing for illustrating a shape of the antenna substrate with wiring line and electrode according to an embodiment of the present invention.
Figure 27D:
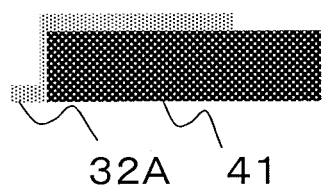
FIG. 27D is a drawing for illustrating a cross-sectional shape of the connected part between the antenna and the wiring line of the antenna substrate with wiring line and electrode according to an embodiment of the present invention.
Figure 27E:
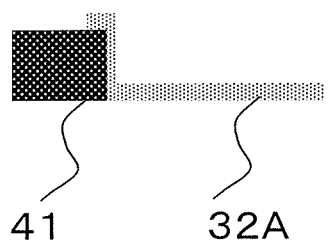
FIG. 27E is a drawing for illustrating a cross-sectional shape of the connected part between the antenna and the wiring line of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 27A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm² for 15 seconds to be cured, and thus the resist layer 38 was formed. The design values of the line width and the line spacing were 1000 μm and 100 μm, respectively. The resultant laminate was immersed in a 35% aqueous ferric chloride solution at a temperature of 40° C. for 5 minutes to etch the aluminum foil. In this manner, an antenna 41 in accordance with a predetermined pattern was formed. Then, the laminate was immersed in a 1% aqueous sodium hydroxide solution at a temperature of 20° C. for 10 seconds to peel off the resist ink layer. In this manner, the antenna substrate shown in FIG. 27B was produced. The measured values of the antenna thickness, the line width, and the line spacing were 10 μm, 1054 μm, and 91 μm, respectively. Then, the photosensitive paste D was applied to the antenna substrate with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm² (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A and a wiring line/an electrode 33. In this manner, an antenna substrate with wiring line and electrode shown in FIG. 27C was produced. The production conditions are shown in Table 2. The cross-sectional structures of a connected part 36 between the antenna 41 and the wiring line 32A as viewed from the directions of arrows α and β in FIG. 27C are shown in FIGS. 27D and 27E, respectively. As shown in FIGS. 27D and 27E, the antenna 41 and the wiring line 32A overlap, and in FIGS. 27D and 27E, the overlapping widths of the antenna 41 and the wiring line 32A are 100 μm and 100 μm, respectively. The obtained antenna substrate with wiring line and electrode was evaluated for the antenna formability, electrode formability, bending resistance, and voltage difference between the antenna 41 and the wiring line 32A. The evaluation results are shown in Table 3.

Example 27

Figure 28A:
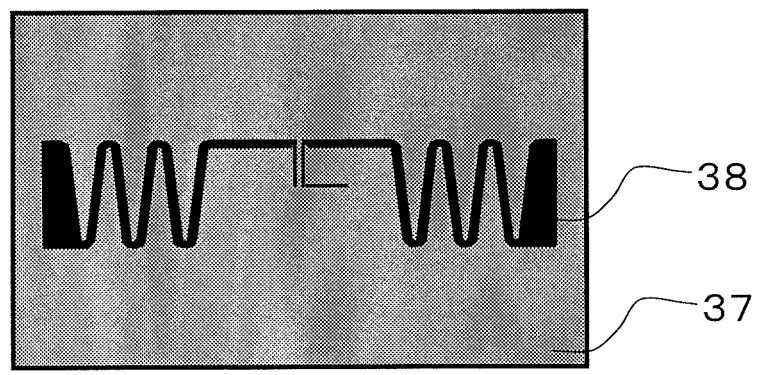
FIG. 28A is a drawing for illustrating a shape of the antenna substrate with wiring line and electrode according to an embodiment of the present invention.
Figure 28B:
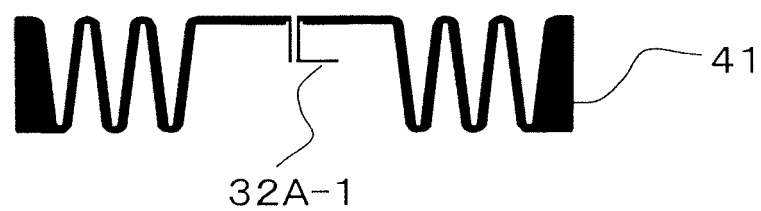
FIG. 28B is a drawing for illustrating a shape of the antenna substrate with wiring line and electrode according to an embodiment of the present invention.
Figure 28C:
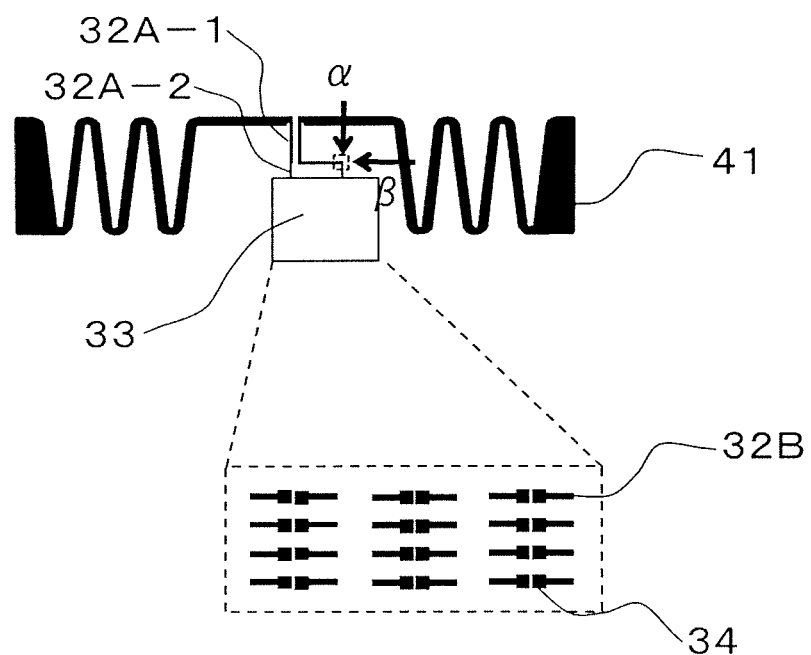
FIG. 28C is a drawing for illustrating a shape of the antenna substrate with wiring line and electrode according to an embodiment of the present invention.
Figure 28D:
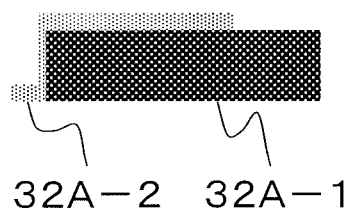
FIG. 28D is a drawing for illustrating a cross-sectional shape of the connected part between the antenna and the wiring line of the antenna substrate with wiring line and electrode according to an embodiment of the present invention.
Figure 28E:
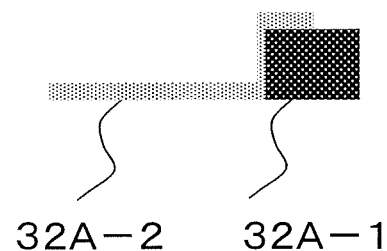
FIG. 28E is a drawing for illustrating a cross-sectional shape of the connected part between the antenna and the wiring line of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 28A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm² for 15 seconds to be cured, and thus the resist layer 38 was formed. The resultant laminate was immersed in a 35% aqueous ferric chloride solution at a temperature of 40° C. for 5 minutes to etch the aluminum foil. In this manner, an antenna 41 in accordance with a predetermined pattern and a part of the wiring line 32A (32A-1) were formed. The design values of the line width, the line spacing, and the width of the wiring line 32A-1 were 1000 µm, 100 µm, and 200 µm, respectively. Then, the laminate was immersed in a 1% aqueous sodium hydroxide solution at a temperature of 20° C. for 10 seconds to peel off the resist ink layer. In this manner, an antenna substrate with wiring line shown in FIG. 28B was produced. The measured values of the antenna thickness, the line width, the line spacing, and the thickness and width of the wiring line 32A-1 were 10 µm, 1056 µm, 93 µm, 10 µm, and 211 µm, respectively. Then, the photosensitive paste D was applied to the antenna substrate with wiring line with use of an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm² (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a part of the wiring line 32A (32A-2) and a wiring line/an electrode 33. In this manner, an antenna substrate with wiring line and electrode shown in FIG. 28C was produced. The production conditions are shown in Table 2. The cross-sectional structures of a connected part 40 between the wiring line 32A-1 and the wiring line 32A-2 as viewed from the directions of arrows α and β in FIG. 28C are shown in FIGS. 28D and 28E, respectively. As shown in FIGS. 28D and 28E, the wiring line 32A-1 and the wiring line 32A-2 overlap, and in FIGS. 28D and 28E, the overlapping widths of the wiring line 32A-1 and the wiring line 32A-2 are 100 µm and 100 µm, respectively. The obtained antenna substrate with wiring line and electrode was evaluated for the antenna formability, electrode formability, bending resistance, and voltage difference between the antenna 41 and the wiring line 32A-2. The evaluation results are shown in Table 3.

Comparative Example 1

The photosensitive paste A was applied to a PET film having a thickness of 50 µm by screen printing, and then prebaked in a drying oven at 100° C. for 10 minutes. Then, the photosensitive paste A was cured at 140° C. for 30 minutes in a drying oven to produce the antenna substrate shown in FIG. 22A. The production conditions are shown in Table 2. The obtained antenna substrate was evaluated for the antenna formability and bending resistance. The evaluation results are shown in Table 3.

Comparative Examples 2 and 3

An antenna substrate was produced in the same manner as in Comparative Example 1 under the production conditions shown in Table 2. The obtained antenna substrate was evaluated for the antenna formability and bending resistance. The evaluation results are shown in Table 3.

Comparative Example 4

The photosensitive paste A was applied to a PET film having a thickness of 50 µm by screen printing, and then prebaked in a drying oven at 100° C. for 10 minutes. Then, the photosensitive paste A was cured at 140° C. for 30 minutes in a drying oven to produce the antenna substrate shown in FIG. 24A. The production conditions are shown in Table 2. The obtained antenna substrate was evaluated for the antenna formability and bending resistance. The evaluation results are shown in Table 2. Although the design value of the line spacing was set to 100 µm, in the obtained antenna substrate, the line spacing was 0 µm, and the two patterns were joined together.

Comparative Example 5

The photosensitive paste B was applied to a PET film having a thickness of 50 µm by screen printing, and then prebaked in a drying oven at 100° C. for 10 minutes. Then, the photosensitive paste B was cured at 140° C. for 30 minutes in a drying oven to produce the antenna substrate with wiring line and electrode shown in FIG. 22B. The production conditions are shown in Table 2. The obtained antenna substrate with wiring line and electrode was evaluated for the antenna formability, bending resistance, and voltage difference between the antenna 27 and the wiring line 32A. The evaluation results are shown in Table 3. Although the design value of the wiring line width was set to 50 µm, the width of the obtained wiring line was 104 µm, and was greatly deviated from the design value. In addition, although the design value of the distance between the electrodes was set to 20 µm, the distance between the obtained electrodes was 0 µm, and the two electrodes were joined together.

TABLE 2

| | Production conditions | | | | | | |
|---|---|---|---|---|---|---|---|
| | Photosensitive Paste | Insulating substrate | Antenna thickness µm | Line width µm | Line spacing µm | Wiring line width µm | Wiring line/ electrode thickness µm | Method for applying electrode/ wiring line portion |
| Example 1 | A | PET | 8 | 600 | 400 | | | |
| Example 2 | A | PET | 4 | 600 | 400 | | | |
| Example 3 | B | PET | 2 | 600 | 400 | | | |
| Example 4 | B | PET | 2 | 100 | 100 | | | |
| Example 5 | A | PET | 15 | 600 | 400 | | | |
| Example 6 | A | PET | 4 | 1000 | 100 | | | |
| Example 7 | B | PET | 2 | 1000 | 100 | | | |
| Example 8 | B | PET | 1 | 1000 | 100 | | | |

TABLE 2-continued

| | Production conditions | | | | | | | |
|---|---|---|---|---|---|---|---|---|
| | Photosensitive Paste | Insulating substrate | Antenna thickness μm | Line width μm | Line spacing μm | Wiring line width μm | Wiring line/ electrode thickness μm | Method for applying electrode/ wiring line portion |
| Example 9 | B | PET | 2 | 600 | 400 | 50 | 2.0 | Screen printing |
| Example 10 | B | PET | 2 | 600 | 400 | 50 | 2.0 | Screen printing |
| Example 11 | B | PET | 2 | 1000 | 100 | 50 | 2.0 | Screen printing |
| Example 12 | A | PET | 4 | 600 | 400 | 50 | 4.0 | Screen printing |
| Example 13 | A, B | PET | 4 | 600 | 400 | 50 | 1.0 | Screen printing |
| Example 14 | A, B | PET | 4 | 600 | 400 | 50 | 1.0 | Screen printing |
| Example 15 | C | PET | 2 | 600 | 400 | 50 | 2.0 | Screen printing |
| Example 16 | C | PPS | 2 | 600 | 400 | 50 | 2.0 | Screen printing |
| Example 17 | C | PI | 2 | 600 | 400 | 50 | 2.0 | Screen printing |
| Example 18 | A, D | PET | 8 | 600 | 400 | 10 | 0.1 | Inkjet printing |
| Example 19 | A, D | PET | 8 | 600 | 400 | 10 | 0.2 | Inkjet printing |
| Example 20 | A, D | PET | 8 | 600 | 400 | 10 | 0.6 | Inkjet printing |
| Example 21 | A, D | PET | 4 | 1000 | 100 | 10 | 0.2 | Inkjet printing |
| Example 22 | A, D | PET | 8 | 600 | 400 | 10 | 0.2 | Inkjet printing |
| Example 23 | A, D | PET | 4 | 1000 | 100 | 10 | 0.2 | Inkjet printing |
| Example 24 | D | PET | | | | 10 | 0.2 | Inkjet printing |
| Example 25 | D | PET | | | | 10 | 0.2 | Inkjet printing |
| Example 26 | D | PET | | | | 10 | 0.2 | Inkjet printing |
| Example 27 | D | PET | | | | 10 | 0.2 | Inkjet printing |
| Comparative Example 1 | A | PET | 8 | 600 | 400 | | | |
| Comparative Example 2 | A | PET | 8 | 100 | 100 | | | |
| Comparative Example 3 | B | PET | 2 | 600 | 400 | | | |
| Comparative Example 4 | A | PET | 4 | 1000 | 100 | | | |
| Comparative Example 5 | B | PET | 2 | 600 | 400 | 50 | 2.0 | Screen printing |

TABLE 3

| | Evaluation results | | | | | | | | | Bending resistance | | |
|---|---|---|---|---|---|---|---|---|---|---|---|---|
| | Antenna thickness μm | Line width μm | Line spacing μm | Antenna formability Processing accuracy | Antenna formability Processing yield | Wiring line width μm | Wiring line/ electrode thickness μm | Electrode formability | Antenna | Connected part between antenna and wiring line | Connected part between wiring line | Voltage difference between antenna and wiring line |
| Example 1 | 7.6 | 614 | 390 | A | B | | | | B | | | |
| Example 2 | 3.8 | 606 | 392 | A | A | | | | B | | | |
| Example 3 | 1.9 | 603 | 396 | A | A | | | | A | | | |
| Example 4 | 1.8 | 102 | 97 | A | A | | | | A | | | |
| Example 5 | 16.4 | 620 | 381 | A | C | | | | C | | | |
| Example 6 | 3.9 | 1014 | 97 | A | A | | | | B | | | |
| Example 7 | 1.9 | 1031 | 94 | A | A | | | | A | | | |
| Example 8 | 1.2 | 1038 | 91 | A | A | | | | A | | | |
| Example 9 | 1.9 | 604 | 394 | A | A | 51 | 1.92 | A | A | B | | 0.30 |
| Example 10 | 1.8 | 605 | 397 | A | A | 52 | 1.81 | A | A | A | | 0.98 |
| Example 11 | 1.9 | 1032 | 95 | A | A | 51 | 1.93 | A | A | A | | 0.97 |
| Example 12 | 3.8 | 609 | 389 | A | A | 50 | 3.86 | A | B | B | | 0.68 |
| Example 13 | 4.2 | 610 | 387 | A | A | 50 | 0.94 | A | B | A | | 0.74 |
| Example 14 | 4.1 | 615 | 391 | A | A | 52 | 0.98 | A | B | B | | 0.69 |
| Example 15 | 1.9 | 608 | 393 | A | B | 51 | 1.92 | A | A | B | | 0.92 |
| Example 16 | 1.8 | 604 | 394 | A | B | 52 | 1.84 | A | A | A | | 0.99 |
| Example 17 | 2.0 | 606 | 392 | A | B | 51 | 1.98 | A | A | B | | 0.93 |
| Example 18 | 7.8 | 616 | 396 | A | B | 10 | 0.09 | A | B | A | | 0.82 |
| Example 19 | 7.9 | 614 | 394 | A | B | 11 | 0.18 | A | B | A | | 0.81 |
| Example 20 | 7.8 | 618 | 398 | A | B | 10 | 0.59 | A | B | A | | 0.76 |
| Example 21 | 3.7 | 1013 | 98 | A | A | 11 | 0.19 | A | B | A | | 0.84 |
| Example 22 | 7.8 | 612 | 396 | A | B | 10 | 0.20 | A | B | A | | 0.76 |
| Example 23 | 3.9 | 1011 | 97 | A | A | 10 | 0.19 | A | B | A | | 0.77 |
| Example 24 | | | | | | 10 | 0.18 | A | | B | | 0.62 |
| Example 25 | | | | | | 11 | 0.17 | A | | | B | 0.72 |
| Example 26 | | | | | | 10 | 0.17 | A | | B | | 0.63 |
| Example 27 | | | | | | 10 | 0.19 | A | | | B | 0.73 |
| Comparative Example 1 | 9.4 | 684 | 312 | B | C | | | | C | | | |

TABLE 3-continued

Evaluation results

| | Antenna thickness μm | Line width μm | Line spacing μm | Antenna formability Processing accuracy | Antenna formability Processing yield | Wiring line width μm | Wiring line/ electrode thickness μm | Electrode formability | Bending resistance Antenna | Bending resistance Connected part between antenna and wiring line | Connected part between wiring line | Voltage difference between antenna and wiring line |
|---|---|---|---|---|---|---|---|---|---|---|---|---|
| Comparative Example 2 | 9.1 | Impossible to form | | B | D | | | | C | | | |
| Comparative Example 3 | 8.4 | 693 | 306 | B | C | | | | B | | | |
| Comparative Example 4 | 3.9 | 1106 | 0 | B | D | | | | B | | | |
| Comparative Example 5 | 8.2 | 696 | 304 | B | C | 51 | 1.92 | B | B | D | | 0.95 |

Example 28

Figure 29A:
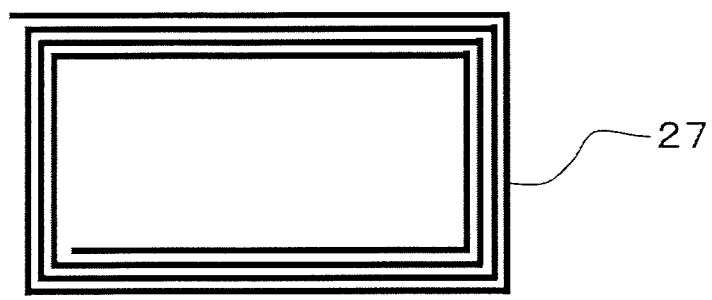
FIG. 29A is a drawing for illustrating a shape of the antenna substrate with wiring line and electrode according to an embodiment of the present invention.

The photosensitive paste A was applied to a PET film having a thickness of 50 μm by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form an antenna 27. In this manner, an antenna substrate shown in FIG. 29A was produced. The antenna thickness, the line width, and the line spacing were 3.9 μm, 610 μm, and 391 μm, respectively.

Figure 29B:
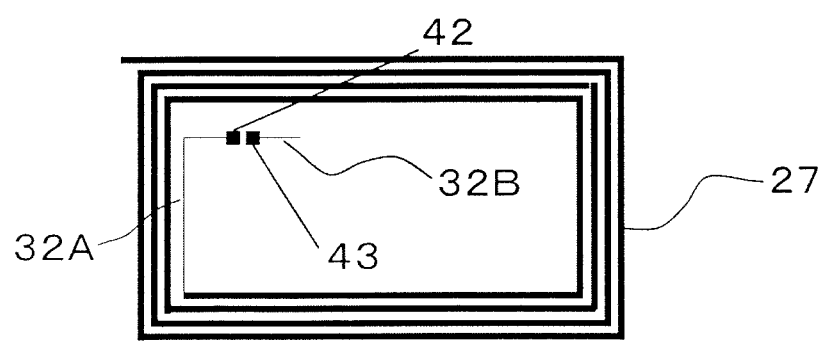
FIG. 29B is a drawing for illustrating a shape of the antenna substrate with wiring line and electrode according to an embodiment of the present invention.

Then, the photosensitive paste D was applied to the antenna substrate with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form a wiring line 32A, a wiring line 32B, a source electrode 42, and a drain electrode 43. In this manner, an antenna substrate with wiring line and electrode shown in FIG. 29B was produced. The widths of the pair of the source electrode 42 and the drain electrode 43 were both 1000 μm, the distance between the electrodes was 10 μm, the widths of the wiring lines 32A and 32B were each 10 μm, and the thickness of the wiring line/electrode was 0.18 μm.

Figure 29C:
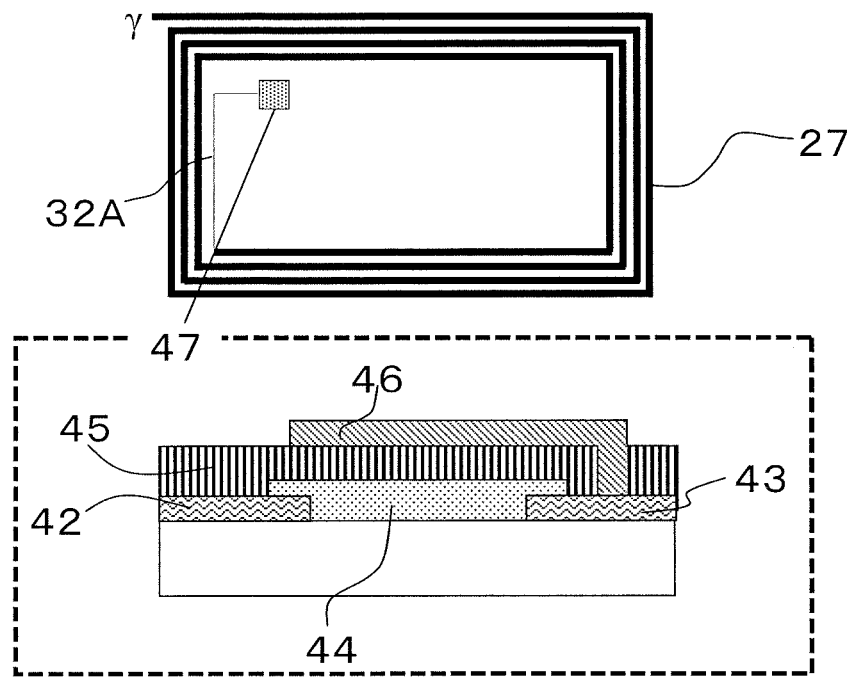
FIG. 29C is a drawing for illustrating a shape of an antenna substrate with rectifying element according to an embodiment of the present invention.

The semiconductor solution A (400 pl) was dropped on the space between the source electrode and the drain electrode with an inkjet apparatus (manufactured by Cluster Technology Co., Ltd.) to form a semiconductor layer 44, and then the semiconductor layer 44 was heated on a hot plate under a nitrogen stream at 150° C. for 30 minutes. Then, the insulating layer solution B was applied by spin coating (800 rpm×20 seconds) to the antenna substrate with wiring line and electrode having the source electrode 42, the drain electrode 43, and the semiconductor layer 44 formed thereon, and the resultant product was heated at 120° C. for 5 minutes. The insulating layer solution B was applied by spin coating (800 rpm×20 seconds) again, and the resultant product was heated under a nitrogen stream at 200° C. for 30 minutes to form an insulating layer 45 having a thickness of 400 nm. A photoresist (trade name: "LC100-10Cp", manufactured by Rohm and Haas Company) was applied thereto by spin coating (1000 rpm×20 seconds), and then dried by heating at 100° C. for 10 minutes. The formed photoresist film was exposed to light with an exposure device "PEM-8M" (trade name, manufactured by Union Optical Co., LTD.) at a total dose of 100 mJ/cm$^2$ (in terms of a wavelength of 365 nm), subjected to shower development for 70 seconds with ELM-D (trade name, manufactured by MITSUBISHI GAS CHEMICAL COMPANY, INC.) (a 2.38% by mass aqueous tetramethylammonium hydroxide solution), and then washed with water for 30 seconds. Then, the resultant product was etched with an etching solution SEA-5 (trade name, manufactured by KANTO CHEMICAL CO., INC.) for 5 minutes, and then washed with water for 30 seconds. The resultant product was immersed in AZ Remover 100 (trade name, manufactured by AZ Electronic Materials) for 5 minutes to peel off the resist, washed with water for 30 seconds, and then dried by heating at 120° C. for 20 minutes. In this manner, a contact hole was formed on the drain electrode 43. The photosensitive paste D was applied to the insulating layer 45 having the contact hole with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to form a gate electrode 46. In this manner, a rectifying element 47 was produced. FIG. 29C shows the obtained antenna substrate 100 with rectifying element.

Figure 29D:
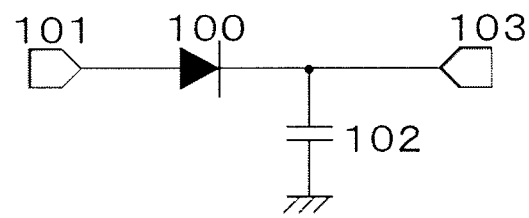
FIG. 29D is a block circuit diagram showing an example of a rectifier circuit including the antenna substrate with rectifying element of the present invention.

Then, the current-voltage properties of the rectifying element 47 were measured. The measurement was carried out by a two-terminal method with the source electrode 42 as an input terminal and the drain electrode 43 and the gate electrode 46 as an output terminal with use of a semiconductor property evaluation system model 4200-SCS (manufactured by Keithley Instruments). The measurement was carried out in the atmosphere (temperature: 20° C., humidity: 35%), and it was confirmed that rectifying action is obtained. Then, a rectifier circuit as shown in FIG. 29D was constructed with use of the antenna substrate with rectifying element. The capacity value of a capacitor 102 was 300 [pF]. One end γ of the antenna 27 was connected to an input terminal 101, and the drain electrode 43 of the rectifying element 47 was connected to the capacitor 102 and an output terminal 103. The electrode of the capacitor 102 located on the opposite side of the drain electrode 43 was electrically connected to a grounding potential. When an alternating-current voltage (voltage amplitude: 10 [V], frequency: 10 MHz) was input to the input terminal 101, a direct-current voltage output to the output terminal 103 had an average value of 2.5 [V] and a variation of 0.8 [V].

Example 29

An antenna substrate 100 with rectifying element was produced in the same manner as in Example 28 except that the semiconductor solution B was used in place of the semiconductor solution A. For the purpose of evaluating the obtained antenna substrate 100 with rectifying element, a rectifier circuit was constructed in the same manner as in Example 28. When an alternating-current voltage (voltage amplitude: 10 [V]) was input to the input terminal 101, a direct-current voltage output to the output terminal 103 had an average value of 4.9 [V] and a variation of 0.3 [V].

Example 30

Figure 30A:
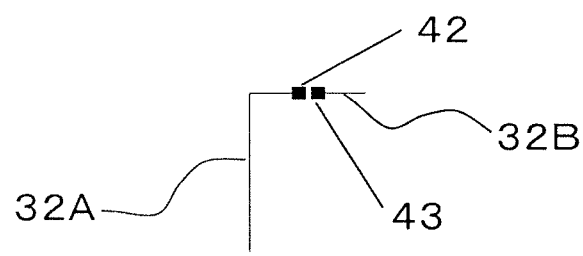
FIG. 30A is a drawing for illustrating a shape of the antenna substrate with wiring line and electrode according to an embodiment of the present invention.

The photosensitive paste D was applied to a PET film having a thickness of 50 μm with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A, a wiring line 32B, a source electrode 42, and a drain electrode 43. In this manner, a substrate with wiring line and electrode shown in FIG. 30A was produced. The widths of the pair of the source electrode 42 and the drain electrode 43 were both 1000 μm, the distance between the electrodes was 10 μm, the widths of the wiring lines 32A and 32B were each 10 μm, and the thickness of the wiring line/electrode was 0.19 μm.

Figure 30B:
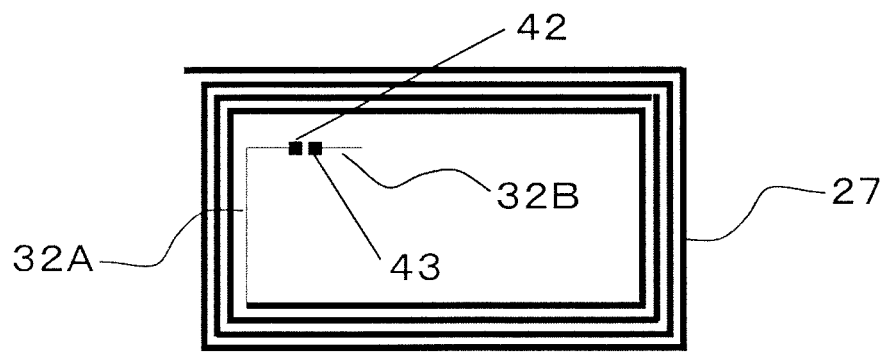
FIG. 30B is a drawing for illustrating a shape of the antenna substrate with wiring line and electrode according to an embodiment of the present invention.

Then, the photosensitive paste A was applied to the substrate with wiring line and electrode by screen printing, and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form an antenna 27. In this manner, an antenna substrate with wiring line and electrode shown in FIG. 30B was produced. The antenna thickness, the line width, and the line spacing were 3.8 μm, 611 μm, and 394 μm, respectively.

Figure 30C:
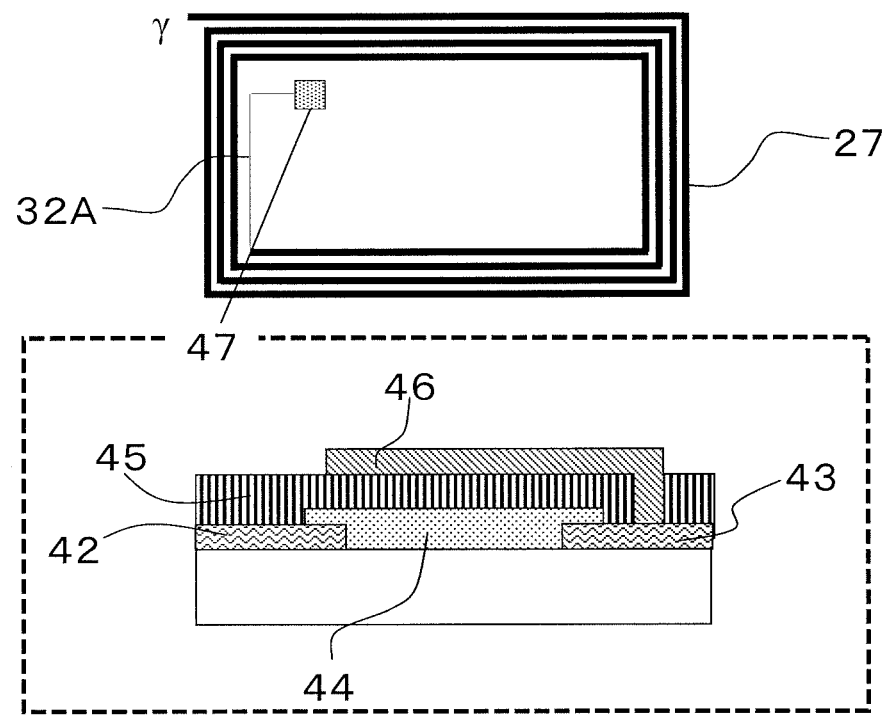
FIG. 30C is a drawing for illustrating a shape of the antenna substrate with rectifying element according to an embodiment of the present invention.

The semiconductor solution B (400 pl) was dropped on the space between the source electrode and the drain electrode with an inkjet apparatus (manufactured by Cluster Technology Co., Ltd.) to form a semiconductor layer 44, and then the semiconductor layer 44 was heated on a hot plate under a nitrogen stream at 150° C. for 30 minutes. Then, the insulating layer solution B was applied by spin coating (800 rpm×20 seconds) to the antenna substrate with wiring line and electrode having the source electrode 42, the drain electrode 43, and the semiconductor layer 44 formed thereon, and the resultant product was heated at 120° C. for 5 minutes. The insulating layer solution B was applied by spin coating (800 rpm×20 seconds) again, and the resultant product was heated under a nitrogen stream at 200° C. for 30 minutes to form an insulating layer 45 having a thickness of 400 nm. A photoresist (trade name: "LC100-10cP", manufactured by Rohm and Haas Company) was applied thereto by spin coating (1000 rpm×20 seconds), and then dried by heating at 100° C. for 10 minutes. The formed photoresist film was exposed to light with an exposure device "PEM-8M" (trade name, manufactured by Union Optical Co., LTD.) at a total dose of 100 mJ/cm$^2$ (in terms of a wavelength of 365 nm), subjected to shower development for 70 seconds with ELM-D (trade name, manufactured by MITSUBISHI GAS CHEMICAL COMPANY, INC.) (a 2.38% by mass aqueous tetramethylammonium hydroxide solution), and then washed with water for 30 seconds. Then, the resultant product was etched with an etching solution SEA-5 (trade name, manufactured by KANTO CHEMICAL CO., INC.) for 5 minutes, and then washed with water for 30 seconds. The resultant product was immersed in AZ Remover 100 (trade name, manufactured by AZ Electronic Materials) for 5 minutes to peel off the resist, washed with water for 30 seconds, and then dried by heating at 120° C. for 20 minutes. In this manner, a contact hole was formed. The photosensitive paste D was applied to the insulating layer 45 having the contact hole with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a gate electrode 46. In this manner, a rectifying element 47 was produced. FIG. 30C shows the obtained antenna substrate 100 with rectifying element.

Figure 30D:
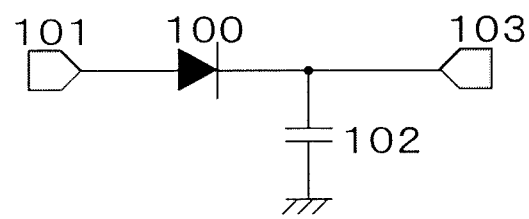
FIG. 30D is a block circuit diagram showing an example of the rectifier circuit including the antenna substrate with rectifying element of the present invention.

Then, a rectifier circuit as shown in FIG. 30D was constructed with use of the antenna substrate 100 with rectifying element. The capacity value of a capacitor 102 was 300 [pF]. One end γ of the antenna 27 was connected to an input terminal 101, and the drain electrode 43 of the rectifying element 47 was connected to the capacitor 102 and an output terminal 103. The electrode of the capacitor 102 located on the opposite side of the drain electrode 43 was electrically connected to a grounding potential. When an alternating-current voltage (voltage amplitude: 10 [V], frequency: 10 MHz) was input to the input terminal 101, a direct-current voltage output to the output terminal 103 had an average value of 4.9 [V] and a variation of 0.2 [V].

Example 31

Figure 31A:
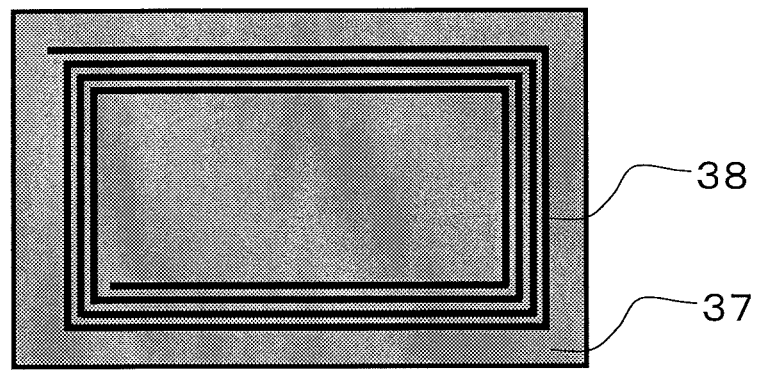
FIG. 31A is a drawing for illustrating a shape of the antenna substrate with wiring line and electrode according to an embodiment of the present invention.
Figure 31B:
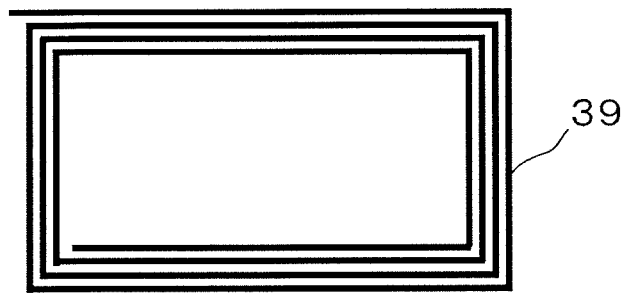
FIG. 31B is a drawing for illustrating a shape of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 31A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm$^2$ for 15 seconds to be cured, and thus the resist layer 38 was formed. The resultant laminate was immersed in a 35% aqueous ferric chloride solution at a temperature of 40° C. for 5 minutes to etch the aluminum foil. In this manner, an antenna 39 in accordance with a predetermined pattern was formed. Then, the laminate was immersed in a 1% aqueous sodium hydroxide solution at a temperature of 20° C. for 10 seconds to peel off the resist ink layer. In this manner, the antenna substrate shown in FIG. 31B was produced. The antenna thickness, the line width, and the line spacing were 10 μm, 638 μm, and 361 μm, respectively.

Figure 31C:
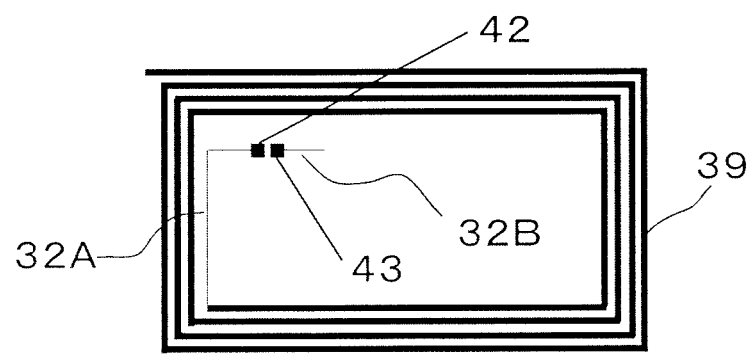
FIG. 31C is a drawing for illustrating a shape of the antenna substrate with wiring line and electrode according to an embodiment of the present invention.

Then, the photosensitive paste D was applied to the antenna substrate with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a wiring line 32A, a wiring line 32B, a source electrode 42, and a drain electrode 43. In this manner, an antenna substrate with wiring line and electrode shown in FIG. 31C was produced. The widths of the pair of the source electrode 42 and the drain electrode 43 were both 1000 μm, the distance between the electrodes was 10 μm, the widths of the wiring lines 32A and 32B were each 10 μm, and the thickness of the wiring line/electrode was 0.18 μm.

Figure 31D:
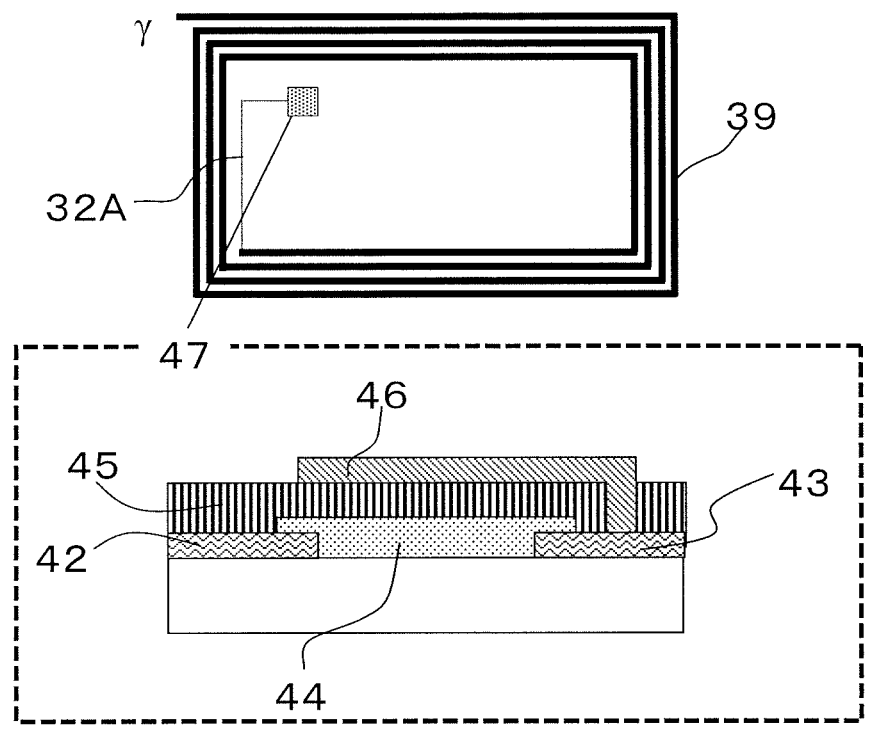
FIG. 31D is a drawing for illustrating a shape of the antenna substrate with rectifying element according to an embodiment of the present invention.

The semiconductor solution B (400 pl) was dropped on the space between the source electrode and the drain electrode with an inkjet apparatus (manufactured by Cluster Technology Co., Ltd.) to form a semiconductor layer 44, and then the semiconductor layer 44 was heated on a hot plate under a nitrogen stream at 150° C. for 30 minutes. Then, the insulating layer solution B was applied by spin coating (800 rpm×20 seconds) to the antenna substrate with wiring line and electrode having the source electrode 42, the drain electrode 43, and the semiconductor layer 44 formed thereon, and the resultant product was heated at 120° C. for 5 minutes. The insulating layer solution B was applied by spin coating (800 rpm×20 seconds) again, and the resultant product was heated under a nitrogen stream at 200° C. for 30 minutes to form an insulating layer 45 having a thickness of 400 nm. A photoresist (trade name: "LC100-10cP", manufactured by Rohm and Haas Company) was applied thereto by spin coating (1000 rpm×20 seconds), and then dried by heating at 100° C. for 10 minutes. The formed photoresist film was exposed to light with an exposure device "PEM-8M" (trade name, manufactured by Union Optical Co., LTD.) at a total dose of 100 mJ/cm$^2$ (in terms of a wavelength of 365 nm), subjected to shower development for 70 seconds with ELM-D (trade name, manufactured by MITSUBISHI GAS CHEMICAL COMPANY, INC.) (a 2.38% by mass aqueous tetramethylammonium hydroxide solution), and then washed with water for 30 seconds. Then, the resultant product was etched with an etching solution SEA-5 (trade name, manufactured by KANTO CHEMICAL CO., INC.) for 5 minutes, and then washed with water for 30 seconds. The resultant product was immersed in AZ Remover 100 (trade name, manufactured by AZ Electronic Materials) for 5 minutes to peel off the resist, washed with water for 30 seconds, and then dried by heating at 120° C. for 20 minutes. In this manner, a contact hole was formed. The photosensitive paste D was applied to the insulating layer 45 having the contact hole with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a gate electrode 46. In this manner, a rectifying element 47 was produced. FIG. 31D shows the obtained antenna substrate 100 with rectifying element.

Figure 31E:
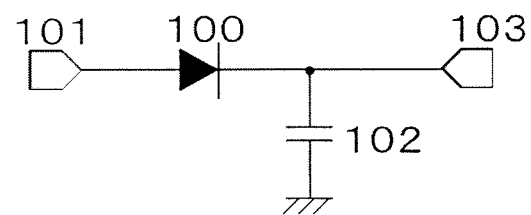
FIG. 31E is a block circuit diagram showing an example of the rectifier circuit including the antenna substrate with rectifying element of the present invention.

Then, a rectifier circuit as shown in FIG. 31E was constructed with use of the antenna substrate 100 with rectifying element. The capacity value of a capacitor 102 was 300 [pF]. One end γ of the antenna 39 was connected to an input terminal 101, and the drain electrode 43 of the rectifying element 47 was connected to a capacitor 102 and an output terminal 103. The electrode of the capacitor 102 located on the opposite side of the drain electrode 43 was electrically connected to a grounding potential. When an alternating-current voltage (voltage amplitude: 10 [V], frequency: 10 MHz) was input to the input terminal 101, a direct-current voltage output to the output terminal 103 had an average value of 4.8 [V] and a variation of 0.5 [V].

Example 32

Figure 32A:
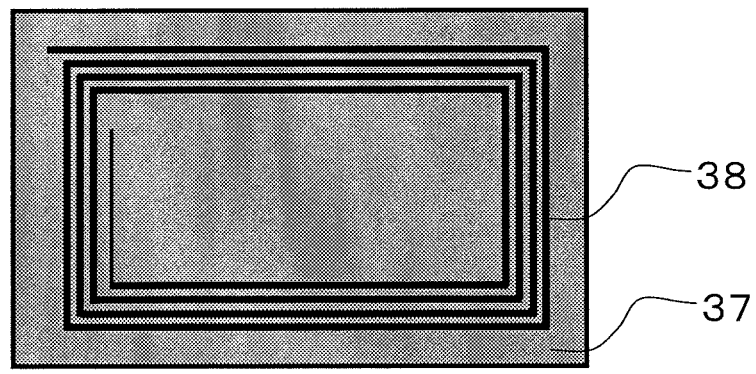
FIG. 32A is a drawing for illustrating a shape of the antenna substrate with wiring line and electrode according to an embodiment of the present invention.
Figure 32B:
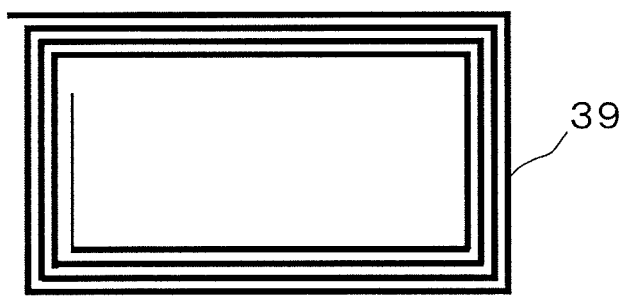
FIG. 32B is a drawing for illustrating a shape of the antenna substrate with wiring line and electrode according to an embodiment of the present invention.

A rolled aluminum foil 37 piece having a thickness of 10 μm was made to adhere to a PET film having a thickness of 50 μm with use of an epoxy adhesive by a dry lamination method to produce a laminate. On the laminate obtained as described above, a pattern shown in FIG. 32A was gravure printed with a resist ink. The cross-sectional structure of the pattern portion is resist layer 38/aluminum foil 37/PET film. After printing, the resist ink was irradiated with an ultraviolet lamp at an irradiation dose of 480 W/cm$^2$ for 15 seconds to be cured, and thus the resist layer 38 was formed. The resultant laminate was immersed in a 35% aqueous ferric chloride solution at a temperature of 40° C. for 5 minutes to etch the aluminum foil. In this manner, an antenna 39 in accordance with a predetermined pattern and a part of the wiring line 32A (32A-1) were formed. The measured values of the antenna thickness, the line width, the line spacing, and the thickness and width of the wiring line 32A-1 were 10 μm, 632 μm, 367 μm, 10 μm, and 214 μm, respectively. Then, the laminate was immersed in a 1% aqueous sodium hydroxide solution at a temperature of 20° C. for 10 seconds to peel off the resist ink layer. In this manner, an antenna substrate with wiring line shown in FIG. 32B was produced.

Figure 32C:
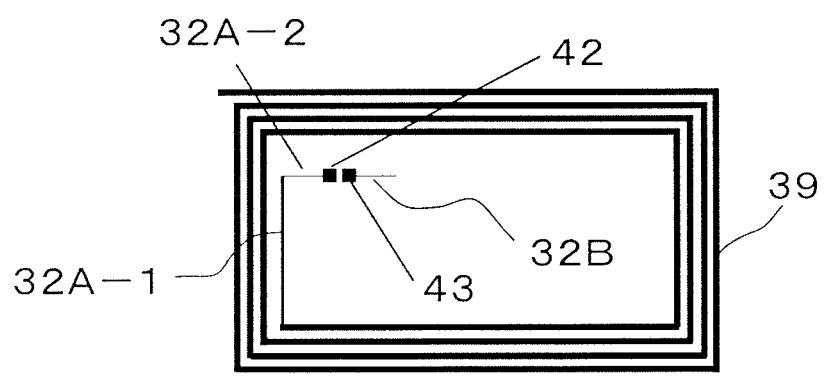
FIG. 32C is a drawing for illustrating a shape of the antenna substrate with wiring line and electrode according to an embodiment of the present invention.

Then, the photosensitive paste D was applied to the antenna substrate with wiring line with use of an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% $Na_2CO_3$ solution for 30 seconds. Then, the product was rinsed with ultrapure water, and cured in a drying oven at 140° C. for 30 minutes to form a part of the wiring line 32A (32A-2), a wiring line 32B, a source electrode 42, and a drain electrode 43. In this manner, an antenna substrate with wiring line and electrode shown in FIG. 32C was produced. The widths of the pair of the source electrode 42 and the drain electrode 43 were both 1000 μm, the distance between the electrodes was 10 μm, the widths of the wiring lines 32A-2 and 32B were each 10 µm, and the thicknesses of the wiring lines 32A-2 and 32B as well as the thickness of the electrode were each 0.19 µm.

Figure 32D:
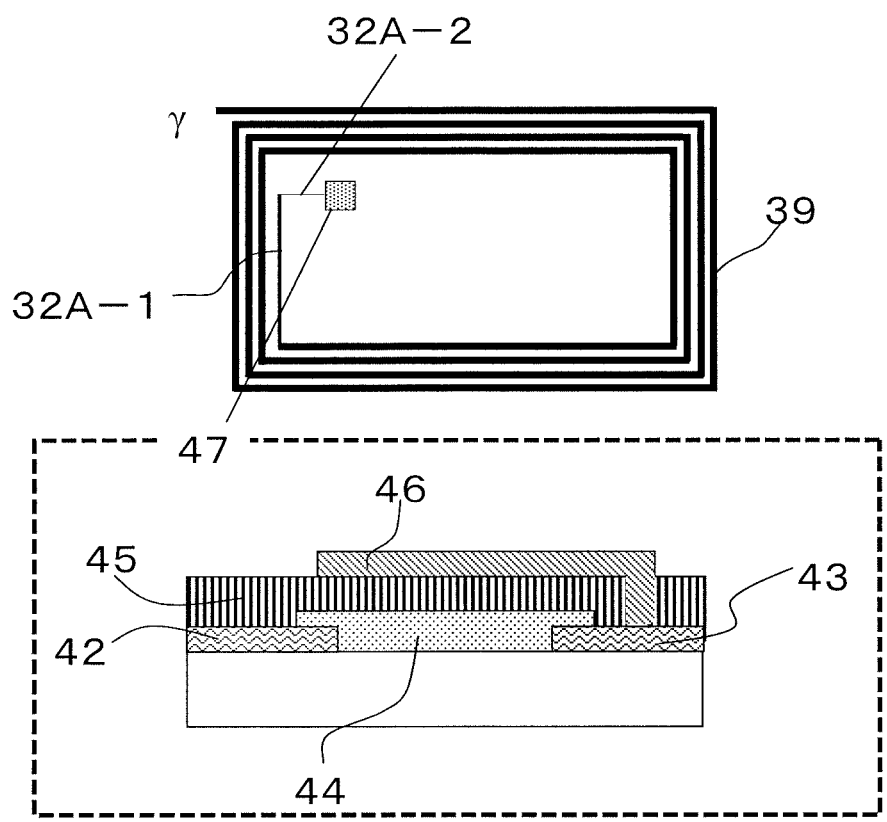
FIG. 32D is a drawing for illustrating a shape of the antenna substrate with rectifying element according to an embodiment of the present invention.

The semiconductor solution B (400 pl) was dropped on the space between the source electrode and the drain electrode with an inkjet apparatus (manufactured by Cluster Technology Co., Ltd.) to form a semiconductor layer 44, and then the semiconductor layer 44 was heated on a hot plate under a nitrogen stream at 150° C. for 30 minutes. Then, the insulating layer solution B was applied by spin coating (800 rpm×20 seconds) to the antenna substrate with wiring line and electrode having the source electrode 42, the drain electrode 43, and the semiconductor layer 44 formed thereon, and the resultant product was heated at 120° C. for 5 minutes. The insulating layer solution B was applied by spin coating (800 rpm×20 seconds) again, and the resultant product was heated under a nitrogen stream at 200° C. for 30 minutes to form an insulating layer 45 having a thickness of 400 nm. A photoresist (trade name: "LC100-10cP", manufactured by Rohm and Haas Company) was applied thereto by spin coating (1000 rpm×20 seconds), and then dried by heating at 100° C. for 10 minutes. The formed photoresist film was exposed to light with an exposure device "PEM-8M" (trade name, manufactured by Union Optical Co., LTD.) at a total dose of 100 mJ/cm$^2$ (in terms of a wavelength of 365 nm), subjected to shower development for 70 seconds with ELM-D (trade name, manufactured by MITSUBISHI GAS CHEMICAL COMPANY, INC.) (a 2.38% by mass aqueous tetramethylammonium hydroxide solution), and then washed with water for 30 seconds. Then, the resultant product was etched with an etching solution SEA-5 (trade name, manufactured by KANTO CHEMICAL CO., INC.) for 5 minutes, and then washed with water for 30 seconds. The resultant product was immersed in AZ Remover 100 (trade name, manufactured by AZ Electronic Materials) for 5 minutes to peel off the resist, washed with water for 30 seconds, and then dried by heating at 120° C. for 20 minutes. In this manner, a contact hole was formed. The photosensitive paste D was applied to the insulating layer 45 having the contact hole with an inkjet apparatus (manufactured by Cluster Technology Co., Ltd.), and then prebaked in a drying oven at 100° C. for 10 minutes. Then, the resultant product was exposed to light with an exposure device "PEM-8M" (trade name, manufactured by Union Optical Co., LTD.) at a total dose of 70 mJ/cm$^2$ (in terms of a wavelength of 365 nm), and developed by immersion in a 0.5% Na$_2$CO$_3$ solution for 30 seconds. Then, the product was rinsed with ultrapure water, and cured in a drying oven at 140° C. for 30 minutes to. form a gate electrode 46. In this manner, a rectifying element 47 was produced. FIG. 32D shows the obtained antenna substrate 100 with rectifying element.

Figure 32E:
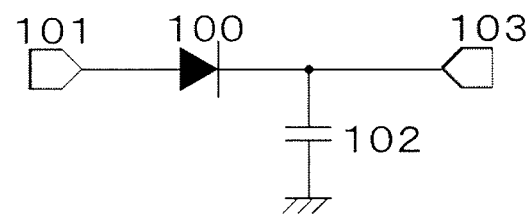
FIG. 32E is a block circuit diagram showing an example of the rectifier circuit including the antenna substrate with rectifying element of the present invention.

Then, a rectifier circuit as shown in FIG. 32E was constructed with use of the antenna substrate 100 with rectifying element. The capacity value of a capacitor 102 was 300 [pF]. One end γ of the antenna 39 was connected to an input terminal 101, and the drain electrode 43 of the rectifying element 47 was connected to a capacitor 102 and an output terminal 103. The electrode of the capacitor 102 located on the opposite side of the drain electrode 43 was electrically connected to a grounding potential. When an alternating-current voltage (voltage amplitude: 10 [V], frequency: 10 MHz) was input to the input terminal 101, a direct-current voltage output to the output terminal 103 had an average value of 4.9 [V] and a variation of 0.3 [V].

DESCRIPTION OF REFERENCE SIGNS

1: Coating film
2: Mask pattern corresponding to antenna
3: Pattern corresponding to antenna
4: Mask pattern corresponding to antenna
5: Mask pattern corresponding to wiring line
6: Mask pattern corresponding to electrode
7: Coating film
8: Pattern corresponding to antenna
9A: Pattern corresponding to wiring line, which is connected to pattern corresponding to antenna
9B: Pattern corresponding to wiring line, which is connected to pattern corresponding to electrode
10: Pattern corresponding to electrode
11: Coating film for forming pattern corresponding to antenna
12: Coating film for forming pattern corresponding to wiring line and pattern corresponding to electrode
13: Antenna
14A: Wiring line connected to antenna
14B: Wiring line connected to electrode
15: Electrode
16: Connected part between wiring line and coating film
17: Coating film for forming pattern corresponding to antenna and pattern corresponding to wiring line
18: Coating film for forming pattern corresponding to electrode
19: Antenna
20: Connected part between antenna and coating film
21: Insulating substrate
22: Source electrode
23: Drain electrode
24: Semiconductor layer
25: Gate insulating film
26: Gate electrode
27: Antenna
28: Antenna
29: Metal cylinder
30: Antenna substrate, or antenna substrate with wiring line and electrode
32A: Wiring line connected to antenna
32A-1: Wiring line formed together with antenna
32A-2: Wiring line formed separately from antenna
32B: Wiring line connected to electrode
33: Wiring line/electrode
34: Electrode
35: Conductive paste film
36: Connected part between antenna and wiring line
37: Aluminum foil
38: Resist layer
39: Antenna
40: Connected part between wiring lines
41: Antenna
42: Source electrode
43: Drain electrode
44: Semiconductor layer
45: Insulating layer
46: Gate electrode
47: Rectifying element
100: Antenna substrate with rectifying element
101: Input terminal
102: Capacitor
103: Output terminal

The invention claimed is:
1. A method for producing an antenna substrate with a wiring line and electrode, comprising the steps of:
    (1) forming a coating film using a photosensitive paste containing a conductive material and a photosensitive organic component on an insulating substrate;

(2-A) processing the coating film into a pattern corresponding to an antenna by photolithography;
(2-B) processing the coating film into a pattern corresponding to a wiring line by photolithography;
(2-C) processing the coating film into a pattern corresponding to an electrode by photolithography;
(3-A) curing the pattern corresponding to an antenna into an antenna;
(3-B) curing the pattern corresponding to a wiring line into a wiring line; and
(3-C) curing the pattern corresponding to an electrode into an electrode,
wherein steps (2-A), (2-B), and (2-C) are performed at the same time in a batch manner such that connections among the antenna, wiring line and electrode are continuous, and
wherein the electrode is operatively connected to a TFT or a capacitor.

2. The method for producing an antenna substrate with wiring line and electrode according to claim 1, wherein the antenna has a thickness of 1 to 10 µm, and the wiring line and the electrode each have a thickness of 0.05 to 1.0 µm.

3. A method for producing an antenna substrate with wiring line and electrode, comprising the steps of:
   (1-P) forming a coating film using a photosensitive paste containing a conductive material and a photosensitive organic component on an insulating substrate having an antenna thereon;
   (2-P-B) processing the coating film into a pattern corresponding to a wiring line by photolithography;
   (2-P-C) processing the coating film into a pattern corresponding to an electrode by photolithography;
   (3-P-B) curing the pattern corresponding to a wiring line into a wiring line; and
   (3-P-C) curing the pattern corresponding to an electrode into an electrode,
   wherein steps (2-P-B) and (2-P-C) are performed at the same time in a batch manner such that a connection between the wiring line and electrode is continuous, and
   wherein the electrode is operatively connected to a TFT or a capacitor.

4. The method for producing an antenna substrate with wiring line and electrode according to claim 3, wherein in step (1-P), the coating film is formed so as to overlap a part of the antenna.

5. The method for producing an antenna substrate with wiring line and electrode according to claim 3, wherein the insulating substrate having the antenna thereon is produced by a method including a step of bonding a conductive material to the insulating substrate.

6. The method for producing an antenna substrate with wiring line and electrode according to claim 1, wherein the photosensitive organic component contains a compound having a urethane group.

7. The method for producing an antenna substrate with wiring line and electrode according to claim 1, wherein the insulating substrate contains at least one resin selected from polyethylene terephthalate, polyethylene naphthalate, polyphenylene sulfide, polyphenylene sulfone, a cycloolefin polymer, a polyamide, and a polyimide.

8. A method for producing an RFID element, comprising the steps of:
   (1) forming a coating film using a photosensitive paste containing a conductive material and a photosensitive organic component on an insulating substrate;
   (2-A) processing the coating film into a pattern corresponding to an antenna by photolithography;
   (2-B) processing the coating film into a pattern corresponding to a wiring line by photolithography;
   (2-C) processing the coating film into a pattern corresponding to an electrode by photolithography;
   (3-A) curing the pattern corresponding to an antenna into an antenna;
   (3-B) curing the pattern corresponding to a wiring line into a wiring line;
   (3-C) curing the pattern corresponding to an electrode into one or more electrodes to give an antenna substrate with wiring line and electrode; and
   (4-S) forming a semiconductor layer on one or more of the electrodes or between the electrodes of the antenna substrate with wiring line and electrode,
   wherein steps (2-A), (2-B), and (2-C) are performed at the same time in a batch manner such that connections among the antenna, wiring line and electrode are continuous, and
   wherein the one or more electrodes are operatively connected to a TFT or a capacitor.

9. A method for producing an RFID element, comprising the steps of:
   (1-P) forming a coating film using a photosensitive paste containing a conductive material and a photosensitive organic component on an insulating substrate having an antenna thereon;
   (2-P-B) processing the coating film into a pattern corresponding to a wiring line by photolithography;
   (2-P-C) processing the coating film into a pattern corresponding to an electrode by photolithography;
   (3-P-B) curing the pattern corresponding to a wiring line into a wiring line;
   (3-P-C) curing the pattern corresponding to an electrode into one or more electrodes to give an antenna substrate with wiring line and electrode; and
   (4-S) forming a semiconductor layer on one or more of the electrodes or between the electrodes of the antenna substrate with wiring line and electrode,
   wherein steps (2-P-B) and (2-P-C) are performed at the same time in a batch manner such that a connection between the wiring line and electrode is continuous, and
   wherein the one or more electrodes are operatively connected to a TFT or a capacitor.

10. The method for producing an RFID element according to claim 8, wherein step (4-S) includes a step of applying a solution containing carbon nanotubes.

11. The method for producing an antenna substrate with wiring line and electrode according to claim 1, wherein
   the insulating substrate comprises one or more resins including a polyimide, polyamide, polyester, epoxy, polyamideimide, polyetherimide, polyetherketone, polysulfone, polyphenylene sulfide (PPS) or cycloolefin resin; and
   the photosensitive paste comprises a conductive powder and the photosensitive organic component which contains a monomer, oligomer or polymer having a polymerizable unsaturated group therein.

12. The method for producing an antenna substrate with wiring line and electrode according to claim 3, wherein
   the insulating substrate comprises one or more resins including a polyimide, polyamide, polyester, epoxy, polyamideimide, polyetherimide, polyetherketone, polysulfone, polyphenylene sulfide (PPS) or cycloolefin resin; and the photosensitive paste comprises a conductive powder and the photosensitive organic component which contains a monomer, oligomer or polymer having a polymerizable unsaturated group therein.

13. The method for producing an antenna substrate with wiring line and electrode according to claim 8, wherein the insulating substrate comprises one or more resins including a polyimide, polyamide, polyester, epoxy, polyamideimide, polyetherimide, polyetherketone, polysulfone, polyphenylene sulfide (PPS) or cycloolefin resin; and the photosensitive paste comprises a conductive powder and the photosensitive organic component which contains a monomer, oligomer or polymer having a polymerizable unsaturated group therein.

14. The method for producing an antenna substrate with wiring line and electrode according to claim 9, wherein the insulating substrate comprises one or more resins including a polyimide, polyamide, polyester, epoxy, polyamideimide, polyetherimide, polyetherketone, polysulfone, polyphenylene sulfide (PPS) or cycloolefin resin; and the photosensitive paste comprises a conductive powder and the photosensitive organic component which contains a monomer, oligomer or polymer having a polymerizable unsaturated group therein.

\* \* \* \* \*